United States Patent
Shoji et al.

(10) Patent No.: US 7,875,988 B2
(45) Date of Patent: Jan. 25, 2011

(54) SUBSTRATE AND MANUFACTURING METHOD OF THE SAME, AND SEMICONDUCTOR DEVICE AND MANUFACTURING METHOD OF THE SAME

(75) Inventors: Masanobu Shoji, Tsuruoka (JP); Toru Fujita, Tsuruoka (JP)

(73) Assignee: Seiko Epson Corporation, Tokyo (JP)

( * ) Notice: Subject to any disclaimer, the term of this patent is extended or adjusted under 35 U.S.C. 154(b) by 378 days.

(21) Appl. No.: 12/168,518

(22) Filed: Jul. 7, 2008

(65) Prior Publication Data

US 2009/0034225 A1    Feb. 5, 2009

(30) Foreign Application Priority Data

Jul. 31, 2007    (JP) .............................. 2007-199565

(51) Int. Cl.
*H01L 23/58* (2006.01)
*H01L 23/544* (2006.01)

(52) U.S. Cl. ........................ 257/798; 257/797; 438/401

(58) Field of Classification Search ................ 257/798, 257/797, 701; 438/401, 462, 700
See application file for complete search history.

(56) References Cited

U.S. PATENT DOCUMENTS

| 5,475,268 | A | * | 12/1995 | Kawagoe et al. ............ 257/797 |
| 7,179,666 | B2 | * | 2/2007 | Kimura et al. ................ 438/15 |
| 2001/0044198 | A1 | | 11/2001 | Kawashima |
| 2008/0138934 | A1 | * | 6/2008 | Kim et al. .................... 438/109 |
| 2008/0284048 | A1 | * | 11/2008 | Kim et al. .................... 257/797 |
| 2009/0230526 | A1 | * | 9/2009 | Chen et al. .................. 257/676 |

FOREIGN PATENT DOCUMENTS

| JP | A 2-240940 | 9/1990 |
| JP | A 2004-281486 | 10/2004 |
| JP | A 2005-322704 | 11/2005 |

* cited by examiner

*Primary Examiner*—S. V Clark
(74) *Attorney, Agent, or Firm*—Oliff & Berridge PLC

(57) ABSTRACT

A substrate for fixing an integrated circuit element includes: a plurality of metal columns that are aligned in a longitudinal direction and a lateral direction in a planar view, each of the plurality of metal columns having a first face and a second face facing opposite direction to the first face; and a connecting part that connects the plurality of metal columns one another at a part of each of the plurality of metal columns between the first face and the second face. In the substrate, a recognition mark is formed on the first face of one of the plurality of metal columns.

11 Claims, 40 Drawing Sheets

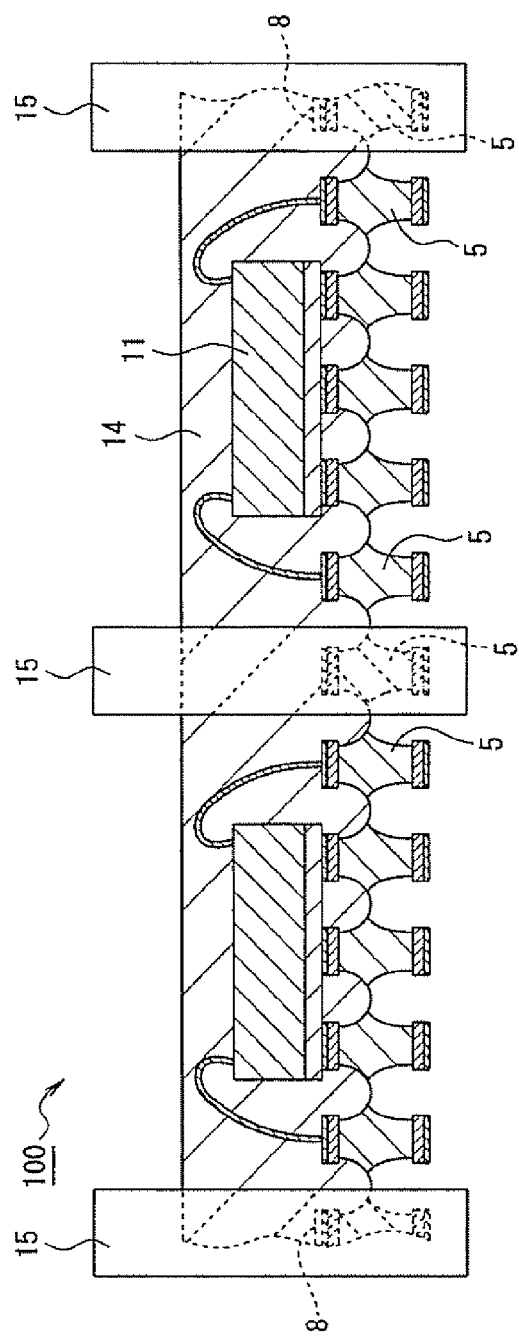
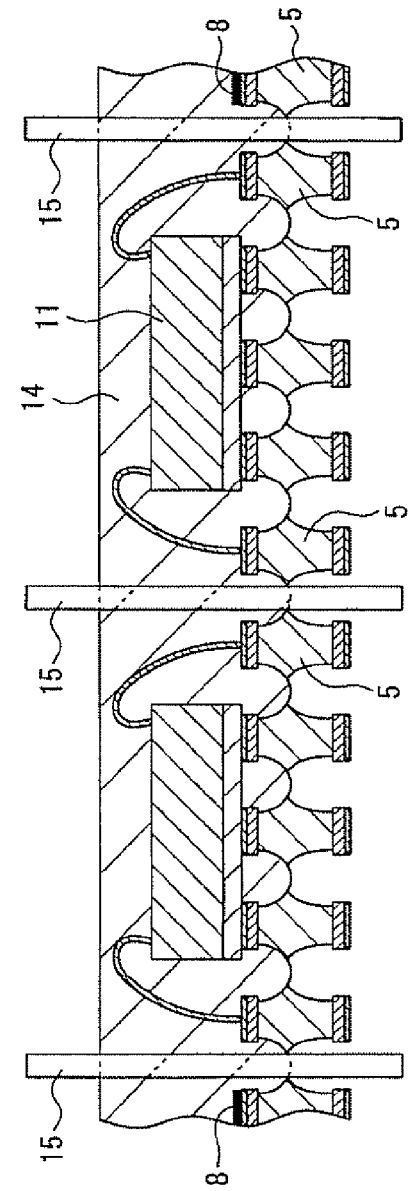
FIG. 4A
FIG. 4B

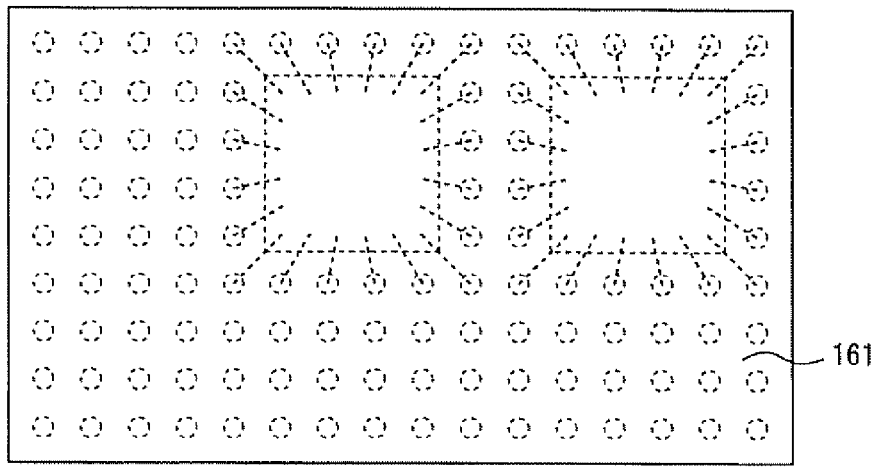
FIG.31A
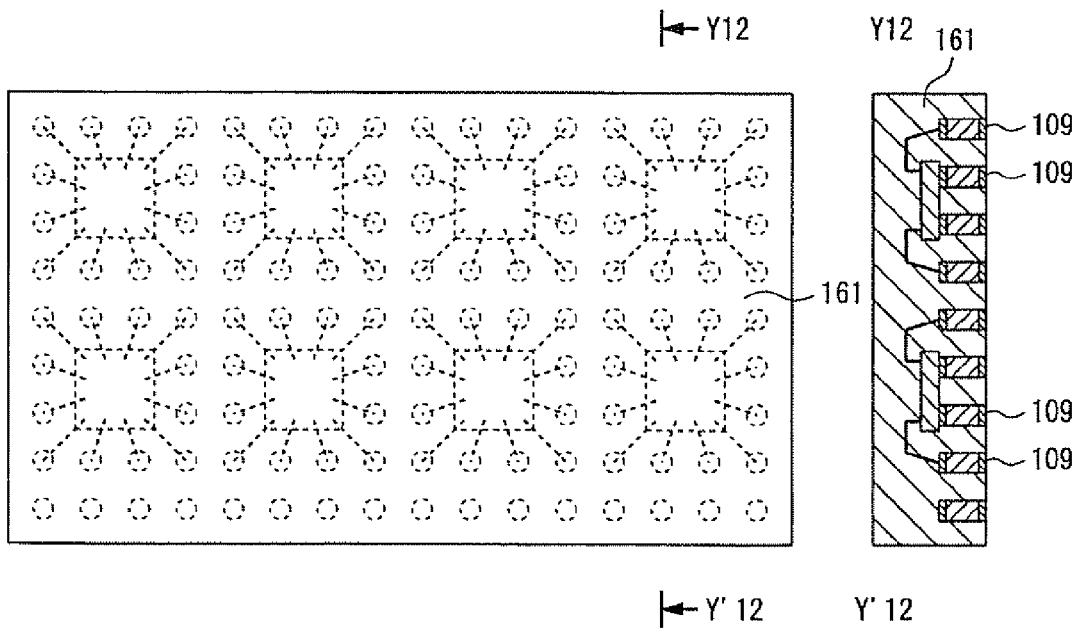 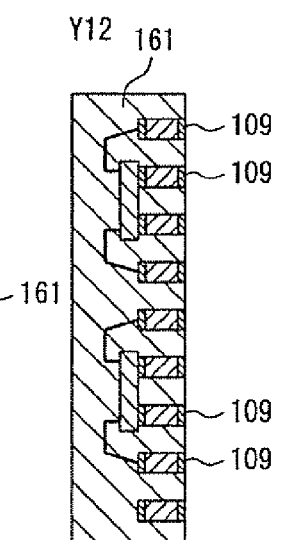
FIG.31B  FIG.31C even number
SUBSTRATE AND MANUFACTURING METHOD OF THE SAME, AND SEMICONDUCTOR DEVICE AND MANUFACTURING METHOD OF THE SAME The entire disclosure of Japanese Patent Application No. 2007-199565, filed Jul. 31, 2007 is expressly incorporated by reference herein.

BACKGROUND

1. Technical Field

The present invention relates to a substrate and a manufacturing method of the same, and a semiconductor device and a manufacturing method of the same.

2. Related Art

Semiconductor packages are classified broadly into a peripheral type package in which external terminals are arranged at the periphery of the package and an area type package in which external terminals are disposed at the under surface of the package. Packages typified by DIP (dual inline package), SOP (small outline package), and QFP (quad flat package) are the peripheral type package, as shown in FIGS. 40A through 40C. As shown in FIG. 40D, the peripheral type package is manufactured such that an integrated circuit (IC) element 210 is mounted on a die pad 201 that is a chip mounting part, an electrode provided on the IC element 210 is connected with a lead 203 of a lead frame by a gold wire, and then the whole except for a part of the peripheral part of the lead 203 is sealed with a resin. A part of the lead 203 inside the resin package is called an internal terminal, and a part outside the resin package is called an external terminal.

Packages typified by BGA (ball grid array) are the area type package, as shown in FIGS. 41A through 42B. The area type package is manufactured such that an IC element 210 is mounted on a substrate 211, the IC element 210 is electrically coupled with the substrate 211 with a gold wire, solder, or a gold bump, and the IC element 210 and the like are sealed with a resin. Packages in which the substrate 211 is connected with the IC element 210 with a gold wire 213 shown in FIGS. 41A and 41B are called a gold wire type BGA as well.

Packages in which the substrate 211 is coupled with the IC element 210 with a bump 223 shown in FIGS. 42A and 42B are called a bump type BGA. Especially in some bump type BGAs, a resin sealing is not conducted, as shown in FIGS. 42A and 42B. As shown in FIGS. 41A through 42B, an external terminal of the area type package is not a lead but an electrode (or, a solder ball) 225 disposed on a back surface of the substrate 211.

In addition, recently, as shown in FIGS. 43A through 43I, a package is manufactured such that a terminal 233 and a die pad 235 that have a columnar shape are formed on a metal plate 231 by electroplating, the IC element 210 is mounted on the die pad 235, the IC element 210 is connected with the terminal 233 with the gold wire 213, a resin sealing is conducted, the metal plate 231 is peeled off from a resin molding part 236, and the resin molding part 236 is cut into individual products.

In detail, a resist is first applied on the metal plate 231 and an exposure and development treatment is performed on the plate so as to form a resist pattern 237 as shown in FIGS. 43A and 43B. Then, copper, for example, is applied by electroplating on a surface of the metal plate 231 exposed from under the resist pattern 237 so as to form the terminal 233 and the die pad 235 that have columnar shape as shown in FIG. 43C, and the resist pattern is removed as shown in FIG. 43D. The IC element 210 is mounted on the die pad 235 formed by electroplating and a wire-bonding is conducted as shown in FIG. 43E. The IC element 210, the gold wire 213, and the like are sealed by a resin as shown in FIG. 43F. The metal plate 231 is next peeled off from the resin molding part 236 as shown in FIG. 43G. Then the resin molding part 236 is cut into individual products so as to complete a package as shown in FIGS. 43H and 43I.

JP-A-2-240940, as a first example, discloses such technique that one surface of a supporting member of a planar lead frame is half-etched, an IC element is mounted on a die pad of the lead frame, wire-bonding and resin sealing are conducted, and another surface, which is not half-etched, of the supporting member is polished so as to remove the supporting member, completing the peripheral type package. JP-A-2004-281486, as a second example, discloses a technique for expanding the versatility of the area type package by radially arranging wires from the center of a substrate toward the outside in a planar view.

Peripheral type packages, area type packages, a package shown in FIGS. 43A through 43I, and a package disclosed in the first example in related art need a die pad or a substrate such as an interposer as an IC element mounting face. In addition, they need a specific lead frame, a specific substrate, or a specific photo-mask (for forming a column) depending on a size of the IC element and the number of external output (that is, the number of leads or balls). Especially, in terms of products in low-volume high-mix production, a lot of lead frames, substrates, or photo-masks are required for respective produce of the products, interfering the decrease of the manufacturing cost.

In the second example, the area type package corresponding to chips in various sizes is achieved by radially arranging wires from the center of the substrate toward the outside. However, in this technique, pad terminals of the IC element need to be arranged so as to surely overlap the wires that radially expand from the center of the substrate, in a planar view. Therefore, amount of freedom on designing a layout of the pad terminals decreases. Namely, the versatility of the package expands, while restrictions imposed on the IC element increase.

SUMMARY

An advantage of some aspects of the present invention is to provide a substrate, for mounting an integrated circuit (IC) element, of which a specification can be made common without increasing restrictions imposed on the IC element and a manufacturing method of the same, and a semiconductor device and a manufacturing method of the same.

A substrate for fixing an integrated circuit element according to a first aspect of the invention includes: a plurality of metal columns that are aligned in a longitudinal direction and a lateral direction in a planar view, each of the plurality of metal columns having a first face and a second face facing opposite direction to the first face; and a connecting part that connects the plurality of metal columns one another at a part of each of the plurality of metal columns between the first face and the second face. In the substrate, a recognition mark is formed on the first face of one of the plurality of metal columns.

Here, the "first face" of the first aspect is, for example, a face to be connected with a pad terminal of the IC element, and the "second face" is, for example, a face to be connected with a motherboard. Further, "a part" of the aspect may be an intermediate part between the first face and the second face and may be a part being from the intermediate part down to the second face and including the second face. In a case where "a part" of the aspect includes the second face, the "connecting part" is formed between the intermediate part and the second face to have the under surface that is coplanar with the second face, for example.

A substrate for fixing an integrated circuit element according to a second aspect of the invention includes: a plurality of metal columns that are aligned in a longitudinal direction and a lateral direction in a planar view, each of the plurality of metal columns having a first face and a second face facing opposite direction to the first face; and a support substrate that supports the second face of the plurality of metal columns. In the substrate, the support substrate and the plurality of metal columns are bonded with an adhesive interposed therebetween, and a recognition mark is formed on the first face of any of the plurality of metal columns. Here, the "support substrate" of the second aspect is, for example, a glass substrate.

In the substrate of the first and second aspects, the plurality of metal columns may be formed to have the same shape and the same dimension as each other.

According to the substrate of the first and second aspects, the plurality of metal columns can be used as die pads for mounting the IC element or as external terminals of the IC element, and the plurality of metal columns can be separately used as the die pads or the external terminals depending on a shape or a size of an IC fixing region that is set adequately. Therefore, a semiconductor device can be assembled without a specific die pad, a specific lead frame, and a specific substrate (an interposer, for example) corresponding to each type of the IC element. A specification of the substrate that is used for mounting an element and used as an external terminal can be shared in many types of IC elements without restricting an layout (arranging position) of pad terminals of the IC elements. Accordingly, the manufacturing cost of the substrate can be reduced.

Further, according to the first and second aspects, the recognition mark is formed on the first face of a part of the metal columns so that the part of the metal columns can be distinguished from other metal columns. Therefore, even in a case where the plurality of metal columns have the same shape and the same dimension as each other, a specific metal column can be correctly recognized based on the recognition mark.

A method for manufacturing a substrate for fixing an integrated circuit element according to a third aspect of the invention includes: partially etching a metal plate that has a first face and a second face facing opposite direction to the first face at least from the first face so as to form a plurality of metal columns such that the plurality of metal columns are aligned in a longitudinal direction and a lateral direction in a planar view and each of the plurality of the metal columns has a first surface and a second surface facing opposite direction to the first surface; and forming a recognition mark on the first surface of one of the plurality of metal columns. In the method, the etching of the metal plate is conducted so as to connect the plurality of metal columns one another at a part of each of the plurality of metal columns between the first face and the second face. Here, the "metal plate" of the third aspect is, for example, a copper plate. The substrate of the first aspect can be manufactured by the method of the third aspect.

A method for manufacturing a substrate for fixing an integrated circuit element according to a fourth aspect of the invention includes: bonding a second face of a metal plate that has a first face and the second face facing opposite direction to the first face to a support substrate; partially etching the metal plate from the first face so as to form a plurality of metal columns such that the plurality of metal columns are aligned in a longitudinal direction and a lateral direction in a planar view and each of the plurality of metal columns has a first surface and a second surface facing opposite direction to the first surface after the bonding of the second face of the metal plate ; and forming a recognition mark on the first surface of one of the plurality of metal columns. The substrate of the second aspect can be manufactured by the method of the fourth aspect.

In the method of the third and fourth aspects, the first surface of one of the plurality of the metal columns may be colored so as to form the recognition mark by any one of ink-jetting and laser marking, in the forming of the recognition mark. Here, a heat-resistance different-color ink or a different-color plating, for example, is employed as a "coloring material".

According to the manufacturing method of the third and fourth aspects, since a plurality of types of original masks corresponding to forming positions of the recognition mark is not required, the manufacturing cost can be reduced.

A semiconductor device according to fifth aspect of the invention includes: a plurality of metal columns that are aligned in a longitudinal direction and a lateral direction in a planar view, each of the plurality of metal columns having a first face and a second face facing opposite direction to the first face, the plurality of metal columns include a first metal column and a second metal column; an integrated circuit element that is fixed to the first face of the first metal column; a first conductive member that connects the first face of the second metal column and a pad terminal of the integrated circuit element; and a resin that seals a part of the plurality of metal columns, the integrated circuit element, and the first conductive member. In the device, the second face of the plurality of metal columns is exposed from the resin, and a recognition mark is formed on the first face of one of the plurality of metal columns.

Here, the "resin" of the fifth aspect is, for example, a mold resin. If the coefficient of thermal expansion of the mold resin is denoted by $\alpha 1$, the one of the solder resist is denoted by $\alpha 2$, and the one of an underfill is denoted by $\alpha 3$, their magnitude relation is expressed as $\alpha 1 < \alpha 3 < \alpha 2$, for example. Smaller coefficient of thermal expansion means smaller flexibility, while larger coefficient of thermal expansion means larger flexibility. That is, the mold resin is less flexible than the solder resist and the underfill. If the elastic modulus of the mold resin is denoted by $\beta 1$, the one of the solder resist is denoted by $\beta 2$, and the one of the underfill is denoted by $\beta 3$, the magnitude relation is expressed as $\beta 1 > \beta 3 > \beta 2$, for example. Smaller elastic modulus means softer, while larger elastic modulus means harder. That is, the mold resin is harder than the solder resist and the underfill.

According to the semiconductor device of the fifth aspect, the plurality of metal columns can be used as die pads for mounting the IC element or as external terminals of the IC element, and the plurality of metal columns can be separately used as the die pads or the external terminals depending on a shape or a size of an IC fixing region that is set adequately. Therefore, a semiconductor device can be assembled without a specific die pad, a specific lead frame, and a specific substrate (an interposer, for example) corresponding to each type of the IC element. A specification of the substrate that is used for mounting an element and used as an external terminal can be shared in many types of IC elements without restricting an layout (arranging position) of pad terminal of the IC elements. Accordingly, the manufacturing cost of the semiconductor device can be reduced.

In addition, according to the fifth aspect, metals are not concentrated on one place unlike related art die pad. The metal columns that serve as die pads or external terminals are arranged to be distributed in a resin package, so that the aggregating positions of moisture can be scattered and the concentration of water vapor pressure can be reduced. Therefore, the resin package can be prevented from exploding in a reliability test accompanying with moisture absorption and heat application, being able to enhance the reliability of the semiconductor device.

Further, according to the fifth aspect, even in a case where the plurality of metal columns have the same shape and the same dimension as each other, a metal column to which the IC element is to be attached (that is, the first metal column) can be correctly recognized based on the recognition mark. Therefore, the IC element can be accurately positioned on the first metal column and can be attached on the first metal column with little displacement.

The semiconductor device of the fifth aspect further includes: a passive component that is fixed to a first face of a third metal column that is included in the plurality of metal columns; and a second conductive member that connects a terminal part of the passive component and a first face of a fourth metal column that is included in the plurality of metal columns and.

In the device, the passive component and the second conductive member may be sealed with the resin.

In such structure, even in a case where the plurality of metal columns have the same shape and the same dimension as each other, a metal column to which the passive component is to be attached (that is, the third metal column) can be correctly recognized based on the recognition mark. Therefore, the passive component can be accurately positioned on the third metal column and can be attached on the third metal column with little displacement.

A method for manufacturing a semiconductor device according to a sixth aspect of the invention includes: preparing a substrate that includes a plurality of metal columns that are aligned in a longitudinal direction and a lateral direction in a planar view, each of the plurality of metal columns having a first face and a second face facing opposite direction to the first face, the plurality of metal columns including a first metal column and a second metal column and includes a connecting part that connects the plurality of metal columns one another at a part of each of the plurality of metal columns between the first face and the second face, and a recognition mark that is formed on the first face of one of the plurality of metal columns; recognizing the first metal column by using the recognition mark; fixing the integrated circuit element on the first face of the first metal column that is recognized; connecting a pad terminal of the integrated circuit element and the first face of the second metal column by a first conductive member after the fixing of the integrated circuit element; e) sealing the integrated circuit element, the first conductive member, and a part at a first face side of the plurality of metal columns by a resin; and etching the connecting part from the second face so as to remove the connecting part after the sealing of the integrated circuit element.

A method for manufacturing a semiconductor device according to seventh aspect of the invention includes: preparing a substrate that includes a plurality of metal columns that are aligned in a longitudinal direction and a lateral direction in a planar view, each of the plurality of metal columns having a first face and a second face facing opposite direction to the first face, the plurality of metal columns including a first metal column and a second metal column and includes a support substrate that supports the second face of the plurality of metal columns, an adhesive that is interposed between the support substrate and the plurality of metal columns, and a recognition mark is formed on the first face of any of the plurality of metal columns; recognizing the first metal column by using the recognition mark; fixing an integrated circuit element on a first face of the first metal column that is recognized; connecting a pad terminal of the integrated circuit element and the first face of the second metal column by a first conductive member after the fixing of the integrated circuit element; supplying a resin on the support substrate so as to seal the integrated circuit element, a part of the plurality of metal columns, and the first conductive member; and peeling the support substrate off from the resin and the second face of the plurality of metal columns sealed by the resin.

According to the manufacturing method of the sixth and seventh aspects, a specification of the substrate on which the IC element is mounted can be made common without increasing restrictions to be imposed on the IC element. Therefore, the manufacturing cost of the semiconductor device can be reduced. Further, even in a case where the plurality of metal columns have the same shape and the same dimension as each other, for example, a metal column to which the IC element is to be attached (that is, the first metal column) can be correctly recognized based on the recognition mark. Therefore, the IC element can be accurately positioned on the first metal column and can be attached on the first metal column with little displacement.

The method of the sixth and seventh aspects further includes recognizing the second metal column by using the recognition mark. In the method, the first face of the second metal column that is recognized by using the recognition mark and the pad terminal of the integrated circuit element may be connected by the first conductive member that is wire-like in the connecting of the pad terminal of the integrated circuit element and the first face of the second metal column. Here, the "first conductive member that is wire-like" of the aspect is, for example, is a gold wire.

In such structure, even in a case where the plurality of metal columns have the same shape, the same dimension, and the same color as each other, for example, a metal column to which the first conductive member that is wire-like is to be attached (that is, the second metal column) can be correctly recognized based on the recognition mark. Therefore, the first conductive member that is wire-like can be accurately attached to the second metal column.

BRIEF DESCRIPTION OF THE DRAWINGS

The invention will be described with reference to the accompanying drawings wherein like numbers reference like elements.

FIGS. 4A and 4B are schematic views showing a dicing step according to the first embodiment.

FIGS. 31A through 31C are schematic views showing a method for manufacturing a semiconductor device 200 according to the ninth embodiment.

DESCRIPTION OF THE EXEMPLARY EMBODIMENTS

Embodiments of the invention will now be described with reference to the accompanying drawings.

First Embodiment

In a first embodiment, a method for manufacturing a substrate will be first described, and a method for manufacturing a semiconductor device by attaching an integrated circuit (IC) element to the substrate will be next described. The first embodiment will describe two types of manufacturing methods that are shown in FIGS. 1A through 1F and 2A through 2G as examples of a method for manufacturing a substrate. FIGS. 1A through 1F show a manufacturing method applying a semi-additive method, and FIGS. 2A through 2G show a manufacturing method applying a subtractive method. After these two types of manufacturing methods are described, processes of attaching an IC element and resin-sealing will be described with reference to FIGS. 3A through 3E, and a dicing process will be described with reference to FIGS. 4A and 4B.

Figure 1A:
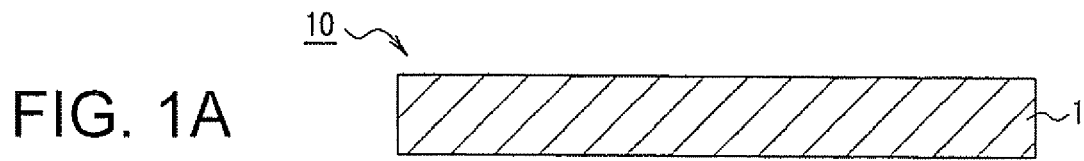
FIGS. 1A through 1F are schematic views showing a method for manufacturing a substrate 10 according to a first embodiment.
Figure 1B:
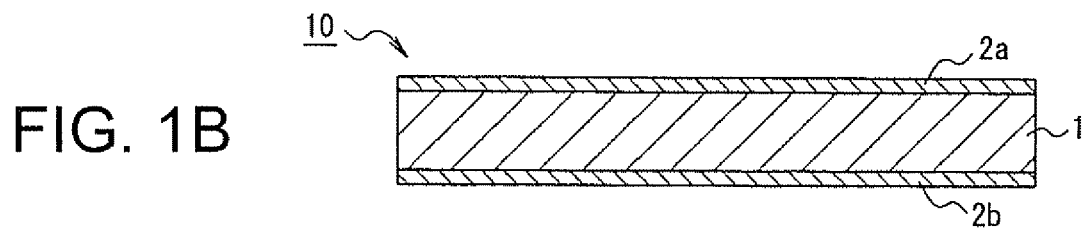

FIGS. 1A through 1F are sectional views showing a method (a semi-additive method) for manufacturing a substrate 10 according to a first embodiment of the invention. First, a copper plate 1 is prepared as shown in FIG. 1A. The copper plate 1 can have any horizontal and vertical dimensions if it is larger than an outer shape of a package, which is to be formed from the copper plate 1, of a semiconductor device. The thickness of the copper plate 1 is from about 0.10 mm to about 0.30 mm, for example. As shown in FIG. 1B, a photo-resist 2a and a photo-resist 2b are respectively applied on an upper surface and a back surface of the copper plate 1. The photo-resists 2a and 2b may be positive type or negative type, for example.

Figure 1C:
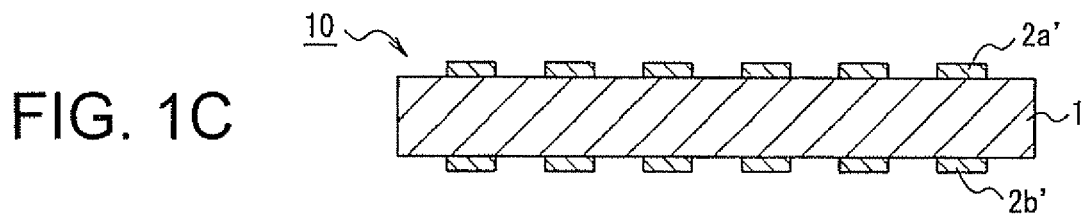

As shown in FIG. 1C, an exposure and development treatment is performed with respect to the photo-resists 2a and 2b so as to form a resist-pattern 2a' and a resist-pattern 2b' exposing a region to be provided with a plurality of cylindrical electrodes (hereinafter, referred to as posts) and covering a region other than the region for the posts. The resist-pattern 2a' and the resist-pattern 2b' are formed respectively on the upper surface and the back surface of the copper plate 1.

Figure 1D:
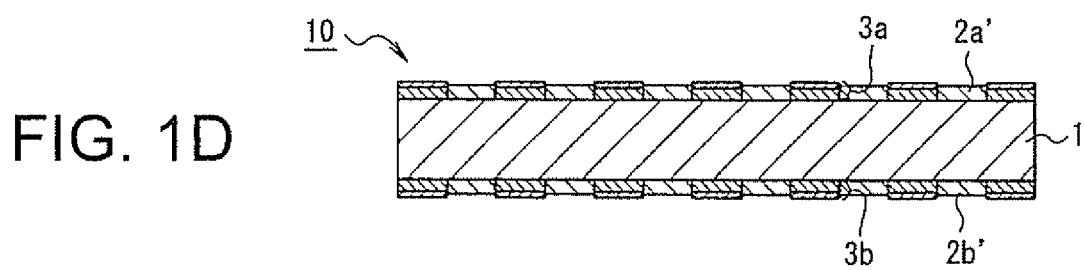

As shown in FIG. 1D, a plating layer 3a and a plating layer 3b are formed in the region exposed from the resist patterns 2a' and 2b' (that is, a region where the posts are to be formed) on the copper plate 1 by electrolytic plating. The plating layer 3a and the plating layer 3b are formed respectively on the upper surface and the back surface of the copper plate 1.

Here, FIG. 1D shows the plating layer 3a and the plating layer 3b that have a two-layered structure, but the plating layers 3a and 3b may have two or more layered structure or single layered structure. For example, the plating layers 3a and 3b may have a three-layered structure composed of a Ni bottom layer, a Pd middle layer, and an Au upper layer, may have a two-layered structure composed of a Ni bottom layer and an Au upper layer, or may have a single layered structure composed of an Ag layer. In a case where the plating layers 3a and 3b have the structure described above, the Ni layer or the Ag layer is preferably formed thick.

Figure 1E:
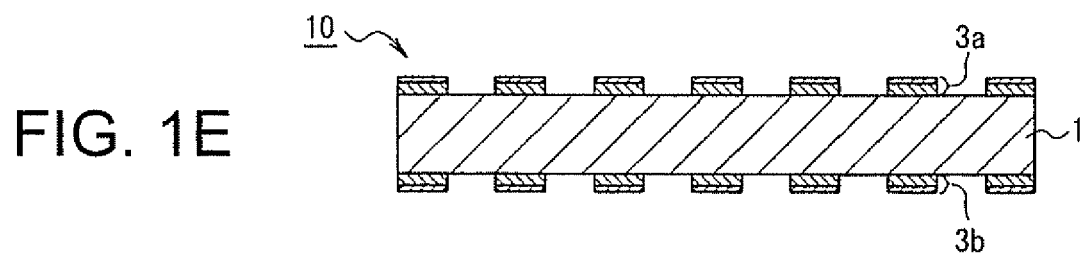
Figure 1F:
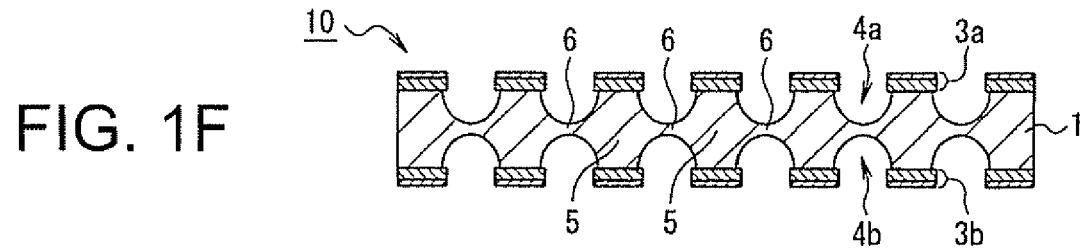

Next, as shown in FIG. 1E, the resist patterns 2a' and 2b' are respectively removed from the upper surface and the back surface of the copper plate 1. Then, as shown in FIG. 1F, the copper plate 1 is etched from the upper surface and the back surface thereof while using the plating layers 3a and 3b as masks so as to form a concave part 4a and a concave part 4b respectively on the upper surface and the back surface. The copper plate 1 is half-etched from the upper surface and the back surface thereof so as to form a plurality of posts 5 and connecting parts 6 that connect the posts 5 in lateral direction when viewed in section. That is, before the copper plate 1 is etched to be completely removed between the plurality of posts 5 (that is, before the copper plate 1 is penetrated), the etching is stopped. Such half-etching completes the substrate 10 of which the posts are connected with each other at a part from the upper surface down to the back surface of the copper plate 1.

The half-etching of the copper plate 1 shown in FIG. 1F is conducted by dipping type or spraying type wet-etching, for example. As the etchant, a ferric chloride solution or an alkaline etchent (hereinafter, referred to as an alkaline solution), for example, is used.

In a case where the plating layers 3a and 3b are composed of Ni, Pd, and Au layers, or Ni and Au layers, the alkaline solution is preferably used as the etchant. Since Ni is hard to be solved in the alkaline solution, the plating layers 3a and 3b can be retained to be protruded toward the outside from the upper and back surfaces of the posts 5, as shown in FIG. 1F. Similarly, in a case where the plating layers 3a and 3b are composed of the Ag layer, for example, the ferric chloride is preferably used as the etchent. Since Ag is hard to be solved in the ferric chloride solution, the plating layers 3a and 3b can be retained to be protruded toward the outside from the upper and back surfaces of the posts 5, as shown in FIG. 1F.

The concave parts 4a and 4b respectively formed on the upper surface and the back surface of the copper plate 1 may be formed to have same depths as each other or to have different depths from each other. For example, in a case where the concave parts 4a and 4b are formed by spraying type wet-etching, etching time for the upper surface is doubled compared to that for the back surface. Accordingly, the concave part 4a can be formed to have 0.1 mm depth on the upper surface and the concave part 4b can be formed to have 0.05 mm depth on the back surface, for example.

In the half-etching shown in FIG. 1F, a face, exposed by the etchant, of the copper plate 1 is sometimes oxidized to be darkened. Therefore, the substrate 10 may be cleaned so as to remove the oxidized layer that is darkened after the half-etching. Such cleaning treatment can remove the oxidized layer from the exposed face of the copper plate 1, being able to allow the copper plate 1 to regain the brilliance. In addition, an antioxidant may be applied to the exposed part of the copper plate 1 after the cleaning treatment. Accordingly, the copper plate 1 can be prevented from being oxidized in the following assembling process.

Alternatively, in FIG. 1E, a photo-resist (not shown) for plating protection may be formed on each of the upper surface and the back surface of the copper plate 1 before the copper plate 1 is etched. Since the copper plate 1 is etched while using the plating layers 3a and 3b that are covered by the photo-resist in the etching process of the copper plate 1, the plating layers 3a and 3b can be protected from the etchant.

The photo-resist for plating protection may be retained also after the concave parts 4a and 4b are formed. Accordingly, the plating layers 3a and 3b can be kept to be protected in the following assembling process. The photo-resist for plating protection may be retained on the plating layer 3a and the plating layer 3b, or may be retained only on the plating layer 3b. In a case where the photo-resist is retained only on the plating layer 3b, the plating layer 3b can be kept to be protected in the following assembling process. Such photo-resist for plating protection may be formed not before the etching of the copper plate 1 but after the etching of the same. In such structure as well, the plating layers 3a and 3b can be kept to be protected in the following assembling process.

The other method for manufacturing a substrate will be described with reference to FIGS. 2A to 2G.

FIGS. 2A through 2G are sectional views showing a method (a subtractive method) for manufacturing a substrate 10 according to the first embodiment of the invention. In FIGS. 2A through 2G, elements having the same structures as ones in FIGS. 1A through 1F have the same reference numerals and their detailed descriptions will be omitted.

Figure 2A:
FIGS. 2A through 2G are schematic views showing a method for manufacturing a substrate 10 according to the first embodiment.
Figure 2B:
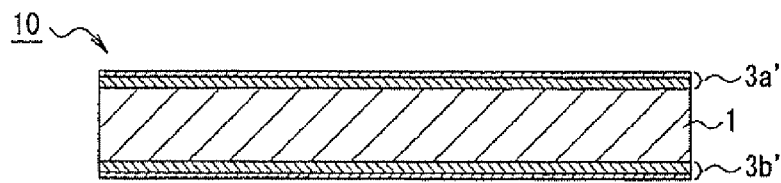

First, a copper plate 1 is prepared as shown in FIG. 2A. As shown in FIG. 2B, the plating layers 3a' and 3b' are respectively formed on the upper surface and the back surface of the copper plate 1 by electrolytic plating, for example. As is the case with FIGS. 1A through 1F, FIG. 2B shows the plating layer 3a' and the plating layer 3b' that have a two-layered structure, but the plating layers 3a' and 3b' may have two or more layered structure or a single layered structure. For example, the plating layers 3a' and 3b' may have a multi-layered structure composed of a Ni bottom layer, a Pd middle layer, and an Au upper layer, may have a multi-layered structure composed of a Ni bottom layer and an Au upper layer, or may have a single layered structure composed of an Ag layer. In a case where the plating layers 3a' and 3b' have the structure described above, the Ni layer or the Ag layer is preferably formed thick.

Figure 2C:
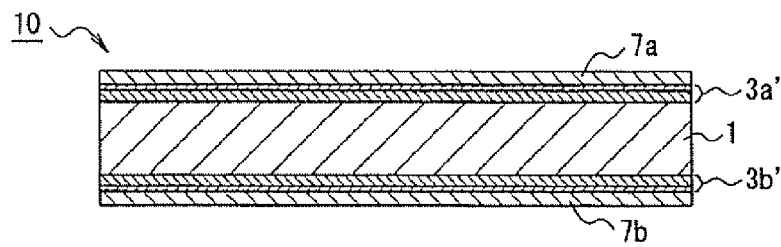
Figure 2D:
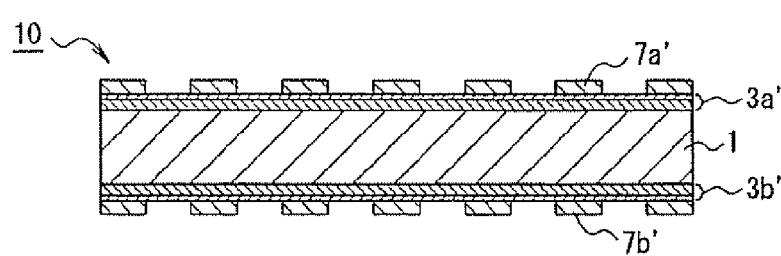
Figure 2E:
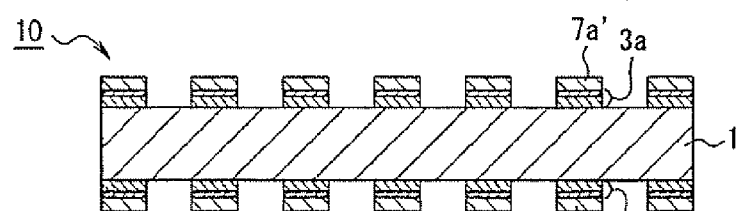

Next, as shown in FIG. 2C, a photo-resist 7a and a photo-resist 7b are respectively applied on the upper surface and the back surface of the copper plate 1. Then, as shown in FIG. 2D, an exposure and development treatment is performed with respect to the photo-resists 7a and 7b so as to form a resist-pattern 7a' and a resist-pattern 7b' covering a region to be provided with posts and exposing a region other than the region for the posts. The plating layers 3a' and 3b' are etched to be removed while using the resist-patterns 7a' and 7b' as masks. Accordingly, as shown in FIG. 2E, the plating layers 3a and 3b that are patterned are formed respectively on the upper surface and the back surface of the copper plate 1.

Figure 2F:
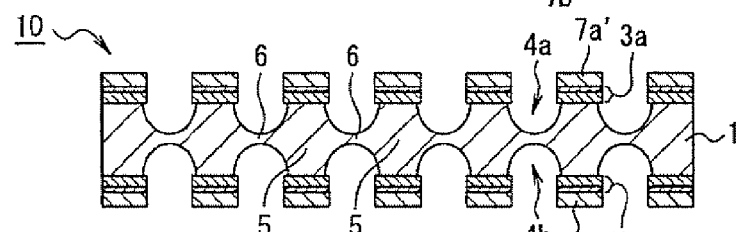

In a case where the plating layers 3a and 3b are composed of Ni, Pd, and Au layers, or Ni and Au layers, aqua regia solution, for example, is preferably used as an etchant for the plating layers. In a case the plating layers 3a and 3b are composed of the Ag layer, a nitric acid solution, for example, is used as the etchant. Thus, after the plating layers are etched, the copper plate 1 is etched from the upper surface and the back surface thereof while using the resist-patterns 7a' and 7b' and the plating layers 3a and 3b that are covered by the resist-patterns 7a' and 7b' as masks, as shown in FIG. 2F. Accordingly, the concave part 4a and the concave part 4b are formed respectively on the upper surface and the back surface of the copper plate 1.

In the manufacturing method shown in FIGS. 2A through 2G as well, the copper plate 1 is half-etched from the upper surface and the back surface thereof so as to form the plurality of posts 5 and the connecting parts 6 that connect the posts 5 in lateral direction when viewed in section, as is the case with the manufacturing method shown in FIGS. 1A through 1F. That is, before the copper plate 1 is etched to be completely removed between the plurality of posts 5 (that is, before the copper plate 1 is penetrated), the etching is stopped. Such half-etching completes the substrate 10 of which the posts 5 are connected with each other at a part from the upper surface down to the back surface of the copper plate 1. The half-etching of the copper plate 1 shown in FIG. 2F is conducted by dipping type or spraying type wet-etching, for example. As the etchant, a ferric chloride solution or an alkaline solution is employed, for example.

In a case where the plating layers 3a and 3b are composed of Ni, Pd, and Au layers, or Ni and Au layers, the alkaline solution is preferably used as the etchant. In a case where the plating layers 3a and 3b are composed of the Ag layer, for example, the ferric chloride solution is preferably used as the etchent. By such selection of the etchant, the plating layers 3a and 3b can be retained to be protruded toward the outside from the upper and back surfaces of the posts 5, as shown in FIG. 2F.

The concave parts 4a and 4b respectively formed on the upper surface and the back surface of the copper plate 1 may be formed to have same depths as each other or to have different depths from each other. For example, in a case where the concave parts 4a and 4b are formed by spraying type wet-etching, the concave part 4a having the depth of 0.1 mm can be formed on the upper surface and the concave part 4b having the depth of 0.05 mm can be formed on the back surface of the copper plate 1 by adjusting the time required for wet-etching, as is the case with the manufacturing method shown in FIGS. 1A through 1F. In addition, after the concave parts 4a and 4b are formed, the substrate 10 may be cleaned so as to remove an oxidized layer that is darkened in the same manner as the manufacturing method shown in FIGS. 1A through 1F. Accordingly, the copper plate 1 can regain the brilliance. Further, an antioxidant may be applied to the exposed part of the copper plate 1 after the cleaning treatment. Accordingly, the copper plate 1 can be prevented from being oxidized in the following process.

Figure 2G:
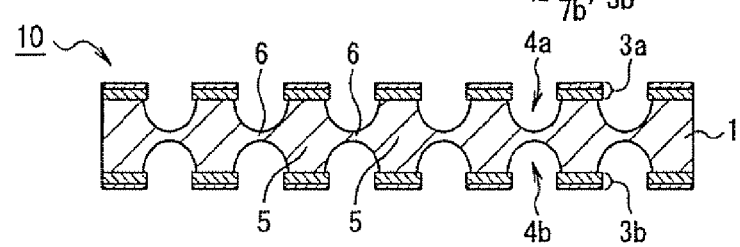

Then, as shown in FIG. 2G, the resist-patterns are removed from the substrate 10.

Here, the resist removing step of FIG. 2G is not obligatory in the embodiment. In the embodiment, the resist patterns may be left on the both faces of the substrate 10. Alternatively, only the resist pattern on the upper surface of the substrate 10 may be removed and the one on the back surface may be left, in FIG. 2G. Accordingly, the resist patterns can be used as protection films for the plating layers 3a and 3b, or a protection film for the plating layer 3b in the following assembling process.

Figure 5:
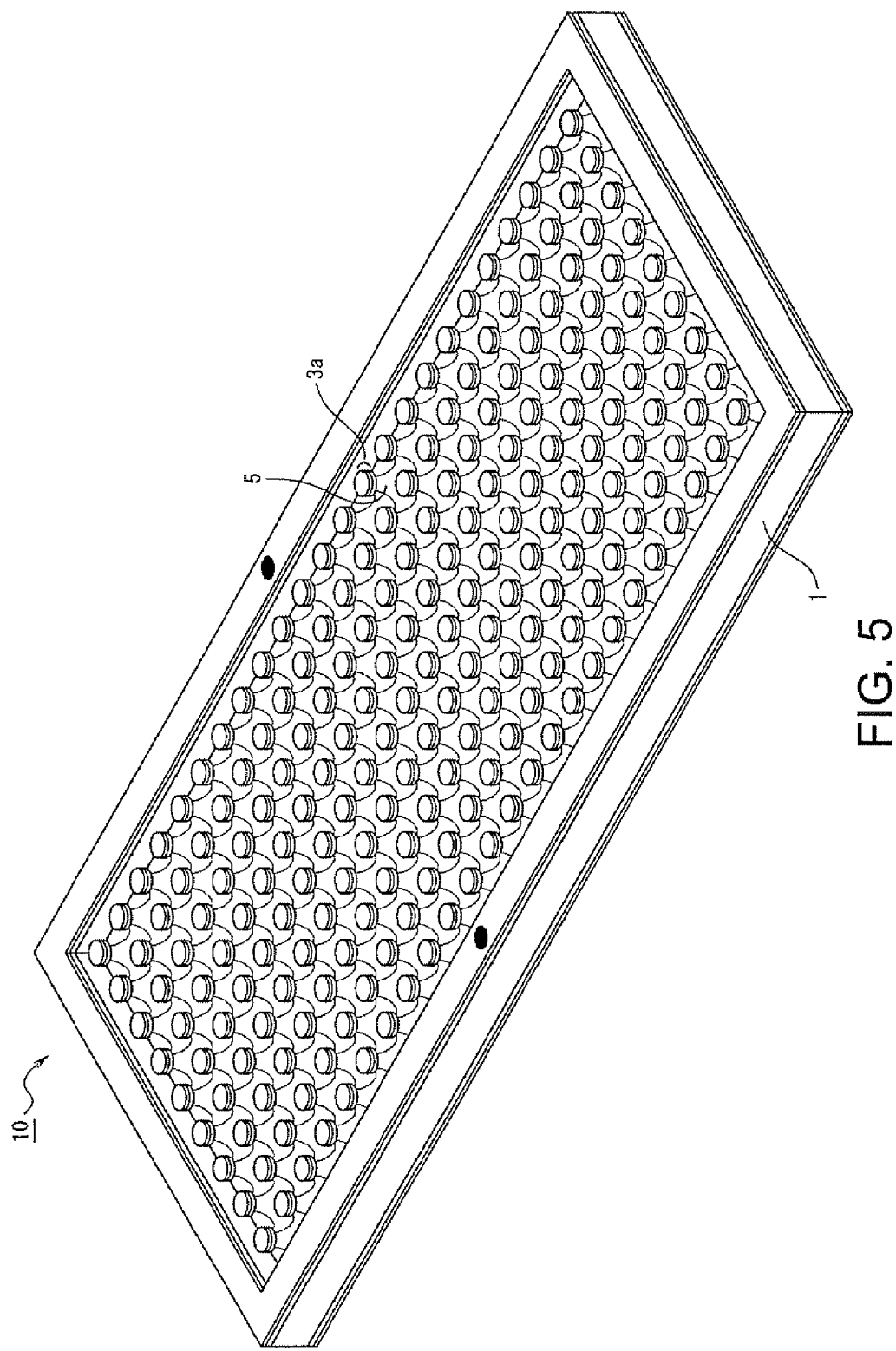
FIG. 5 is a schematic view illustrating a shape of the substrate 10.

In the manufacturing method shown in FIGS. 2A through 2G, steps shown in FIGS. 2C to 2E may be conducted not by a chemical process such as wet-etching, but by a physical process. For example, the plating layers 3a and 3b can be partially removed by a sandblasting treatment or a treatment employing a cutting instrument. In the sandblasting treatment, the plating layers 3a and 3b are scraped by partially spraying glass particles, for example. The plating layers 3a and 3b can be processed as shown in FIG. 2E by adjusting the amount of sprayed glass particles, the spraying pressure, and the like. FIG. 5 is a schematic view illustrating a shape of the substrate 10. The structure of the substrate 10 formed by the manufacturing method shown in FIGS. 1A through 1F is same as the one of the substrate 10 formed by the manufacturing method shown in FIGS. 2A through 2G, and the shape thereof is sterically shown in FIG. 5, for example. That is, the substrate 10 is provided with the plurality of posts 5 that are arranged in the longitudinal and lateral directions and the posts 5 are connected with each other at a part from the upper surface down to the back surface of the substrate 10 (for example, at an intermediate part in the thickness direction). The lateral face of each of the posts 5 is curved such that the diameter of the each of the posts 5 gradually increases from the upper surface or the back surface toward the intermediate part (that is, a bowl shape).

Next, a method for manufacturing a semiconductor device will be described. In the method, an IC element that is in a bare state is attached to the substrate 10.

Figure 3A:
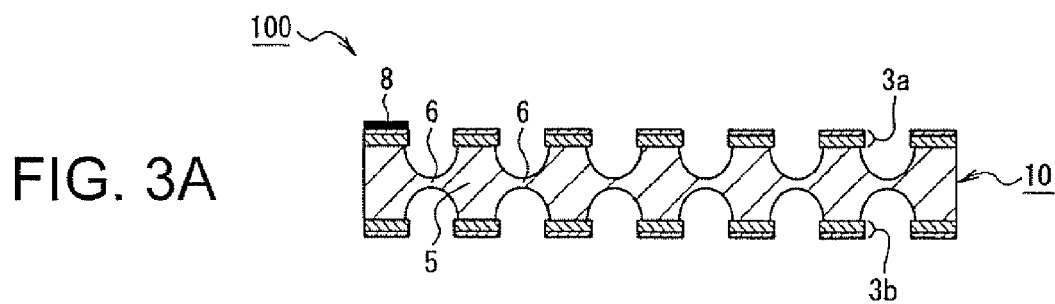
FIGS. 3A through 3E are schematic views showing a method for manufacturing a semiconductor device 100 according to the first embodiment.

FIGS. 3A through 3E are sectional views showing a method for manufacturing a semiconductor device 100 (from recognition mark forming step to a resin sealing step) according to the first embodiment of the invention. As shown in FIG. 3A, a recognition mark 8 is first formed on the upper surface of the substrate 10. The plurality of posts 5 included in the substrate 10 have the same shape, the same dimension, and the same color, for example, as each other. All of the distances between the posts 5 being adjacent in the longitudinal direction in a planar view (distances between centers of the posts 5) are same and all of the distances between the posts 5 being adjacent in the lateral direction in a planar view (distances between centers of the posts 5) are same. Therefore, there is a possibility that an IC fixing region in the substrate 10 can not be recognized so that an IC element can not be accurately positioned on the IC fixing region when the IC element is attached (fixed) to the substrate. Here, the distances between the posts 5 being adjacent in the longitudinal direction and the distances between the posts 5 being adjacent in the lateral direction may be same.

Therefore, the embodiment colors a surface (top surface) of the post 5 that is at the desired position by ink-jetting or laser marking, for example, so as to form a recognition mark 8. In a case where the recognition mark 8 is formed by ink-jetting, a heat-resistance different-color ink or a different-color plating, for example, can be employed as the coloring material.

In a case employing the different-color plating, the plating treatment using a mask can be conducted other than ink-jetting. Here, this method using a mask requires a plurality of types of masks depending on desired positions where the recognition marks 8 are formed, so that the manufacturing cost may increase. Therefore, the forming step of the recognition mark 8 is more preferably conducted by ink-jetting or laser marking treatment than the plating treatment using a mask. Furthermore, the recognition mark 8 can be formed with a dispenser. And the recognition mark 8 can be formed with the printing method.

Figure 6:
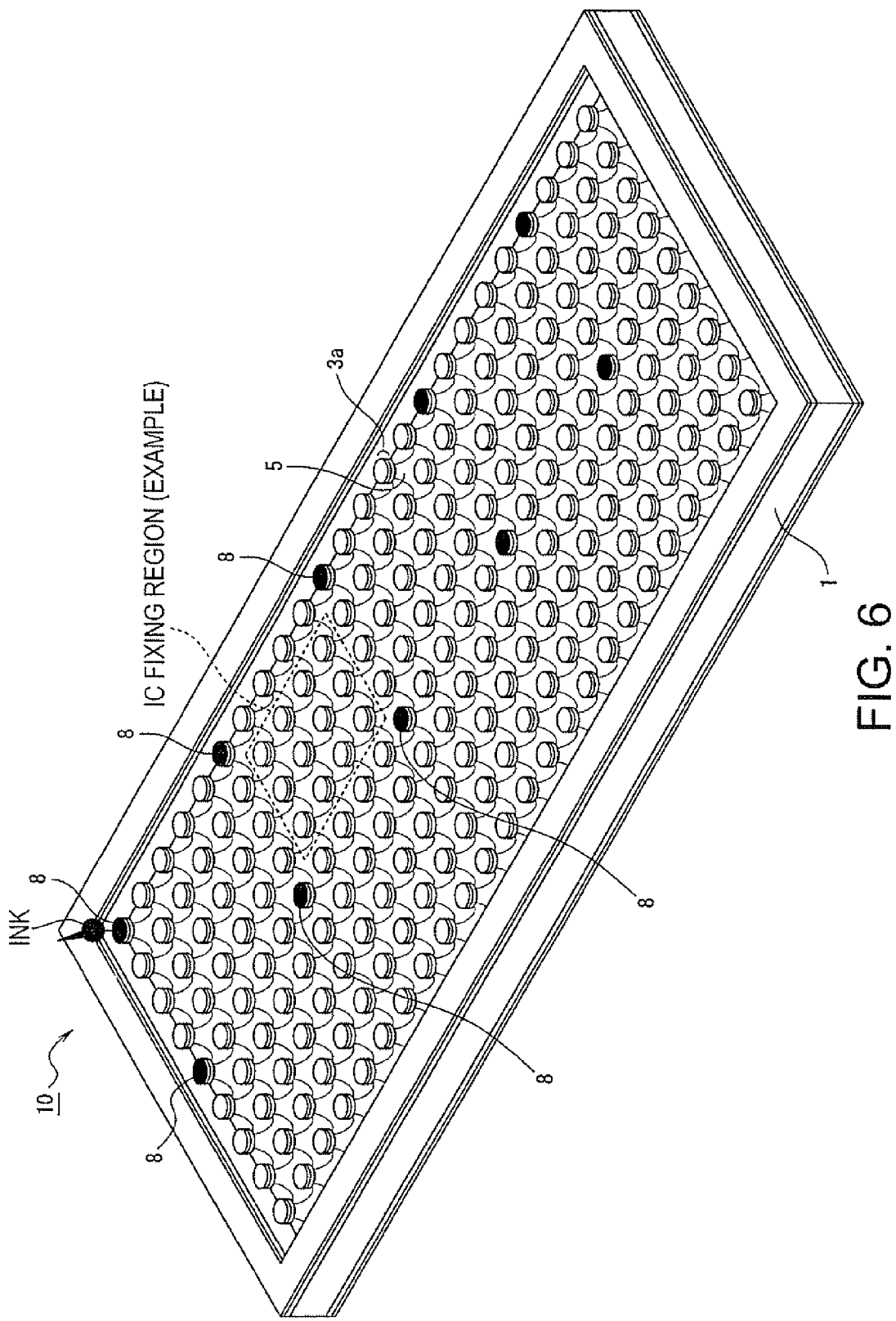
FIG. 6 is a schematic view illustrating a forming position of a recognition mark 8 on the substrate 10.

FIG. 6 is a schematic view illustrating an arrangement position of the recognition mark 8. Arrangement positions of the recognition marks 8 may be inside or outside of a region where the IC element is to be fixed (that is, the IC fixing region), or may be both inside and outside of the region. FIG. 6 shows a case where the recognition marks 8 are arranged outside of the IC fixing region. The recognition marks 8 are formed on an extension of diagonal lines of the IC fixing region (for example, rectangular in a planar view) at a predetermined distance from the region. The arrangement interval (pitch) of the recognition marks 8 is constant, for example. The recognition marks 8 can have any color as long as the marks can be recognized by a camera and the like when the IC element is attached to the substrate 10. FIG. 6 illustrates the recognition marks 8 of which the color is black.

In FIG. 6, two recognition marks 8 correspond to one IC fixing region, for example. However, in a case of a product having loose positioning accuracy of the IC element on the substrate 10 (that is, high accuracy is not required), one recognition mark 8 may correspond to one IC fixing region. Many of products in which the IC element is connected with the posts 5 by wire bonding, for example, have loose positioning accuracy (that is, the high accuracy is not required for positioning). In such products, the number of recognition marks 8 corresponding to one IC fixing region can be set to be small. One recognition mark 8 may be formed on an intersecting point of diagonal lines of the IC fixing region or an intersecting point of diagonal lines of dicing lines.

Many of products in which the IC element is connected with the posts 5 by face down, for example, have tight positioning accuracy (that is, the high accuracy is required for positioning). In such products, the number of recognition mark 8 corresponding to one IC fixing region can be set to be large. For example, three recognition marks 8 may correspond to one IC fixing region. Thus, the embodiment forms the recognition marks 8 in the desired number on the substrate 10 depending on the type of the semiconductor device (model), the mounting method thereof, the required positioning accuracy, and the like.

Figure 3B:
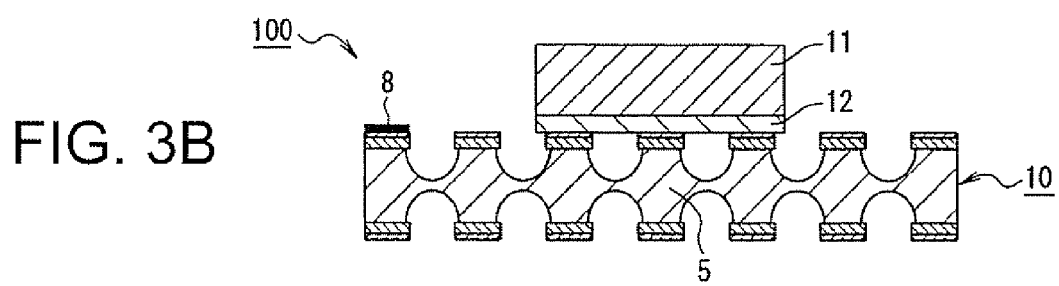

Next, as shown in FIG. 3B, the IC fixing region is recognized based on the recognition marks 8. For example, a region apart from the recognition mark 8 at a predetermined distance in a predetermined direction (right direction when viewed in section in FIG. 3B) is recognized as the IC fixing region. Then the IC element 11 is positioned in the IC fixing region, and the IC element 11 that is positioned is attached on the plurality of posts 5 that are in the IC fixing region. Such method can position the IC element 11 in the IC fixing region accurately and attach the IC element 11 to the substrate 10 with little displacement. In this die attaching step, the IC element 11 and the posts 5 are bonded with each other with an adhesive 12. The adhesive 12 that is used is, for example, a thermoset paste or a thermoset sheet adhesive.

Figure 3C:
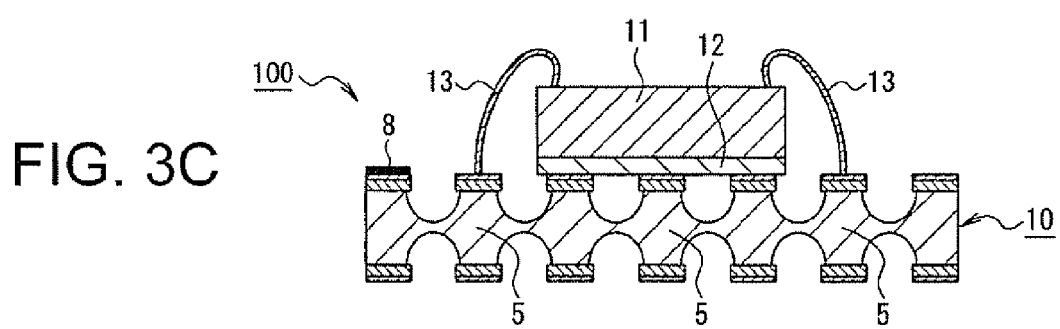

As shown in FIG. 3C, a top surface of the post 5 that is in a region except for the IC fixing region (that is, a region out of a region immediately beneath the IC element) is coupled to a pad terminal provided to an active face of the IC element 11 with, for example, a gold wire 13. Here, the post 5 that is to be the external terminal may be recognized based on the recognition mark 8 so as to couple an end of the gold wire 13 to the post 5 that is recognized. Such method can correctly recognize the post 5 that is to be the external terminal from the plurality of posts 5 so as to accurately attach the gold wire 13 to the post 5 that is recognized. In a case where the recognition mark 8 has conductivity in a same manner as the posts 5 or the plating layer 3*a*, the gold wire 13 may be coupled to the post 5 that is provided with the recognition mark 8 so as to use the post 5 as the external terminal.

Figure 3D:
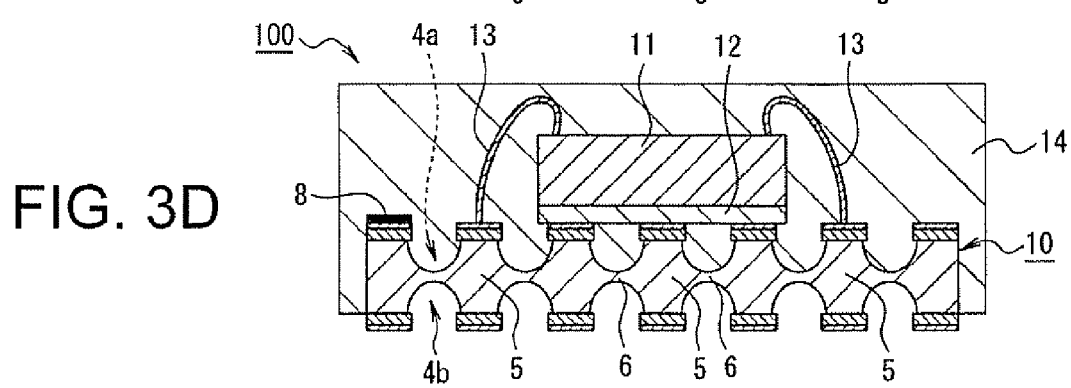

As shown in FIG. 3D, a whole upside of the substrate 10 provided with the IC element 11, the gold wire 13, and the posts 5 is sealed with a mold resin 14. The mold resin 14 is, for example, a thermoset epoxy resin. In this resin sealing step, the upper surface side of the substrate 10 provided with the IC element 11 is covered by a molding die having a cavity. Then the inside of the cavity is decompressed so as to supply the cavity that is decompressed with the mold resin 14. Such decompression resin supply can fill the cavity properly with the mold resin 14 so as to fill the concave part 4*a* with the mold resin 14 without leaving any gap as shown in FIG. 3D.

Figure 3E:
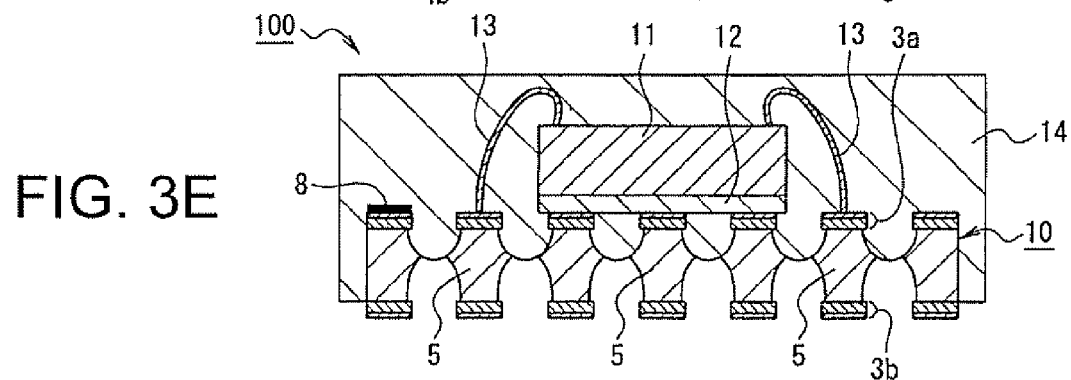

Subsequently, the connecting part 6 connecting the posts 5 is etched from the back surface side to be removed. The connecting part 6 is etched with, for example, a ferric chloride solution or an alkaline solution as is the case with forming the concave parts 4*a* and 4*b*. Accordingly, as shown in FIG. 3E, the posts 5 adjacent each other can be electrically separated and each of the posts 5 connected with the gold wire 13 can be used as an electrically independent external terminal. Since an upper surface side part of each of the posts 5 is fixed by the mold resin 14, the position of each of the posts 5 can be retained even after the connecting part 6 is removed.

In a case where the photo-resist which is not shown is left on the back surface as the protection film for the plating layer 3*b*, the photo-resist is removed after the connecting part is etched.

In a case where the plating layer 3*b* is made of Ag, the Ag plating may be removed so as to conduct another plating treatment. That is, the Ag plating may be removed and then different kind of plating may be applied as the plating layer 3*b*. As the different kind of plating, Ni, Pd, and Au plating, or Ni and Au plating, and solder plating, for example, may be used. Such reapplying the plating layer 3*b* is suitably conducted after the photo-resist is removed in a case where the photo-resist is formed on the back surface, and that is suitably conducted after the connecting part is removed in a case where the photo-resist is not formed on the back surface.

Next, the mold resin 14 is diced into pieces. In this dicing step, the mold resin 14 is divided along a dicing line into individual resin packages and a margin, which is not to be a product, of the resin is cut to be removed at the same time. The mold resin 14 is cut while using an exposed part of the back surface of the posts 5 as a mark, for example. In the dicing step, the terminal part (that is, the post 5) may be cut with a blade 15 having a terminal size ore more as shown in FIG. 4A, or cut an intermediate point between the terminals (that is, an intermediate point between one post 5 and the other post 5 that are adjacent each other) with a blade 15 having the half-etching width size or less as shown in FIG. 4B. Alternatively, the post 5 on which the recognition mark 8 is formed may be cut as shown in FIG. 4A. Thus, the semiconductor device 100 is completed.

Here, in a case where the post 5 on which the recognition mark 8 is formed is cut (that is, a case where the dicing line and the recognition mark 8 overlap each other), the recognition mark 8 is not left in the semiconductor device 100. In a case where the recognition mark 8 is located on the inward side of the dicing line, the recognition mark 8 is left inside the semiconductor device 100, while in a case where the recognition mark 8 is located on the outward side of the dicing line, the recognition mark 8 is not left inside the semiconductor device 100 after the dicing. There are cases where the recognition mark 8 is left inside the semiconductor device 100 and where the recognition mark 8 is not left inside depending on a positional relationship between the dicing line and the recognition mark 8.

As above, according to the first embodiment, the posts 5 can be used as die pads for mounting the IC element 11 or as external terminals of the IC element 11, and the plurality of posts 5 can be separately used as the die pads or the external terminals depending on a shape or a size of the IC fixing region that is set adequately. Thus, the semiconductor device 100 can be assembled without a specific die pad, a specific lead frame, and a specific substrate 10 (an interposer, for example) corresponding to each type of the IC element. A specification of the substrate 10 that is used for mounting an element and used as an external terminal can be shared in many types of IC elements 11 without restricting an layout (arranging position) of a pad terminal. Accordingly, the manufacturing cost of the semiconductor device can be reduced.

In addition, metals are not concentrated on one place unlike related art die pad. The posts 5 that serve as die pads or external terminals are arranged to be distributed in a resin package, so that aggregating positions of moisture can be scattered and the concentration of water vapor pressure can be reduced. Therefore, the resin package can be prevented from exploding in a reliability test (in which a heat treatment is conducted with respect to a resin package that is made of the mold resin 14 in a state that the resin package is placed in a high-humidity atmosphere so as to test whether any troubles occur in the resin package) accompanying with moisture absorption and heat application, being able to enhance the reliability of the semiconductor device 100.

Further, the recognition marks 8 are formed on the substrate 10 in the desired number depending on the type (model) of the semiconductor device, the mounting method of the same, the required positioning accuracy, and the like. In the die attaching step, the IC fixing region is recognized based on the recognition marks 8. By such method, the IC fixing region can be correctly recognized. Therefore, the IC element 11 can be accurately positioned in the IC fixing region and the IC element 11 can be attached on the posts 5 that are in the IC fixing region with little displacement.

Figure 7:
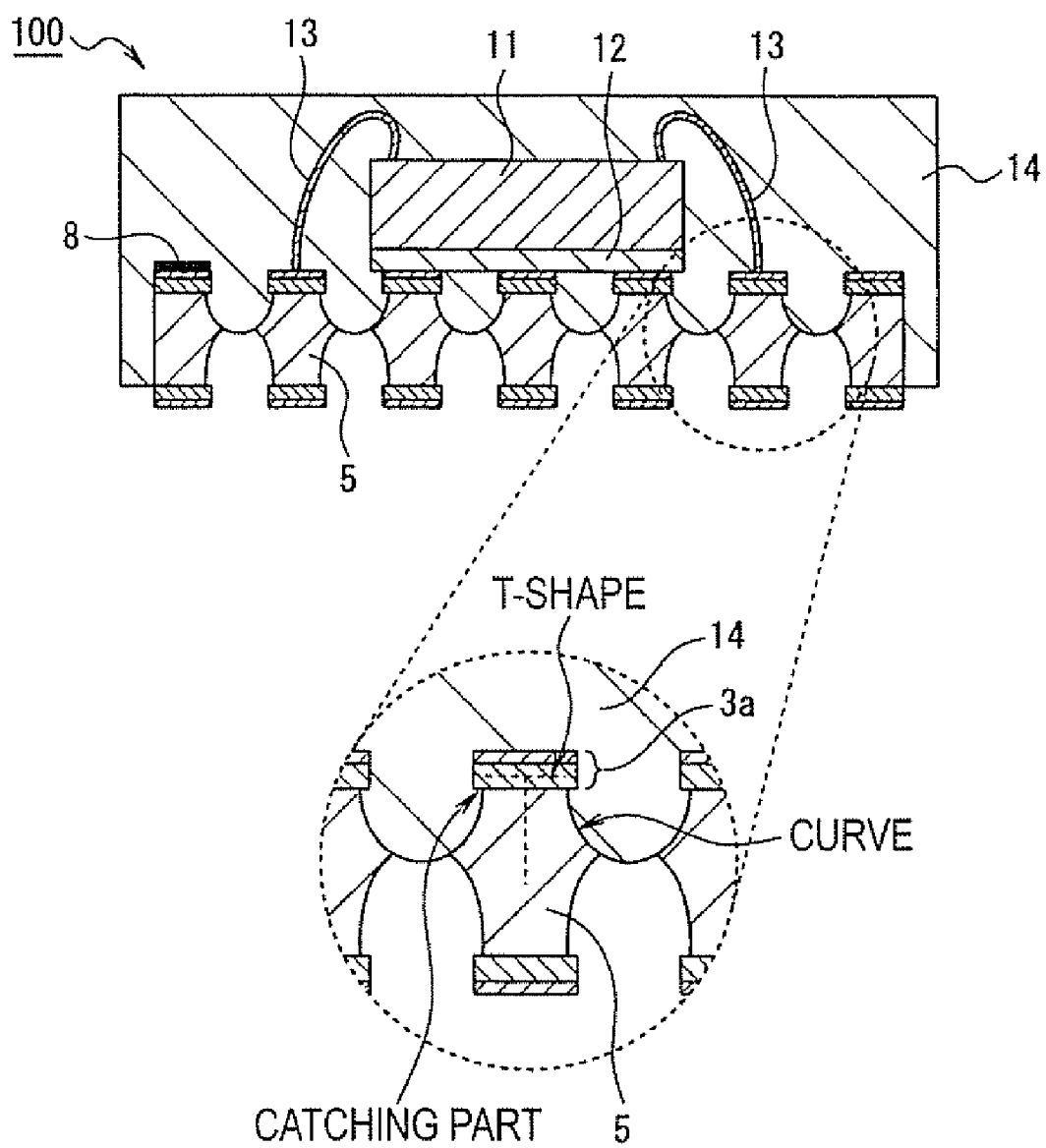
FIG. 7 is a schematic view illustrating a sectional shape of a semiconductor device 100.

Further, as shown in FIG. 7, the lateral face of each of the posts 5 is curved when viewed in section and thus the concave parts 4a and 4b that are between the posts 5 adjacent each other have a bowl shape when viewed in section. Compared to a case where the lateral face of the posts 5 is not curved (that is, the lateral face of the posts 5 is orthogonal to the upper surface and the back surface), the contact area between the mold resin 14 and the lateral face of the posts 5 can be increased so as to enhance the bonding strength between the mold resin 14 and the posts 5.

Further, the plating layer 3a is formed on the surface of each of the posts 5 to protrude from the surface toward the outside. As shown in FIG. 7, the shape composed of the plating layer 3a and the posts 5 is a T-shape when viewed in section. Accordingly, the protruding part of the plating layer 3a is hung on the mold resin 14, being able to obtain an anchor effect by the plating layer 3a.

According to the first embodiment, the following double drop-preventing measures a) and b) are taken, so that the posts 5 can be pressed to the mold resin 14, being able to prevent the posts 5 from dropping from the mold resin 14:

a) curving shape of the lateral face of the posts 5 b) anchor effect of the T-shape composed of the plating layer 3a and the post 5

The copper plate 1 in the first embodiment corresponds to a "metal plate" in the invention, the upper surface of the copper plate 1 of the first embodiment corresponds to a "first face" of the invention, and the back surface of the copper plate 1 of the first embodiment corresponds to a "second face" of the invention. Further, the posts 5 in the first embodiment correspond to a "metal column" in the invention, the posts 5 to which the IC element is attached correspond to a "first metal column" in the invention, and the posts 5 that are coupled with the golden wire 13 through the plating layer 3a correspond to a "second metal column" in the invention. Furthermore, the golden wire 13 in the first embodiment corresponds to a "first conductive member" of the invention, and the mold resin 14 corresponds to a "resin" of the invention. The substrate 10 including the recognition mark 8 of the first embodiment corresponds to a "substrate" in the invention.

Second Embodiment

Figure 8A:
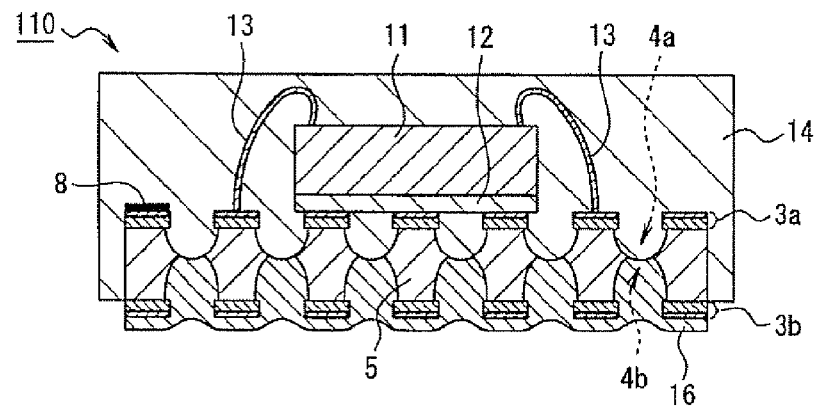
FIGS. 8A through 8C are schematic views showing a method for manufacturing a semiconductor device 110 according to a second embodiment.
Figure 8B:
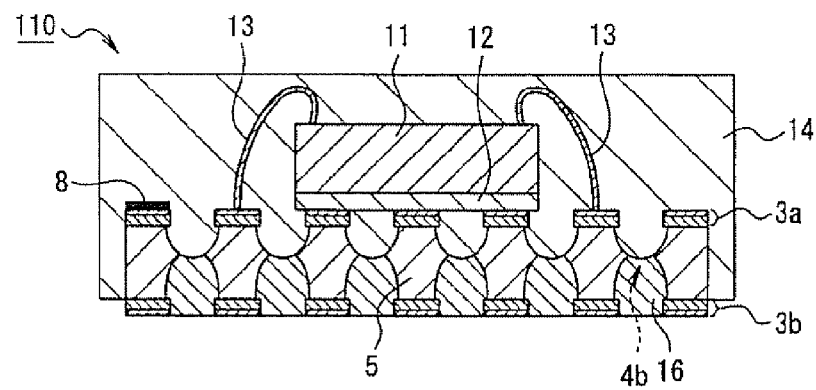
Figure 8C:
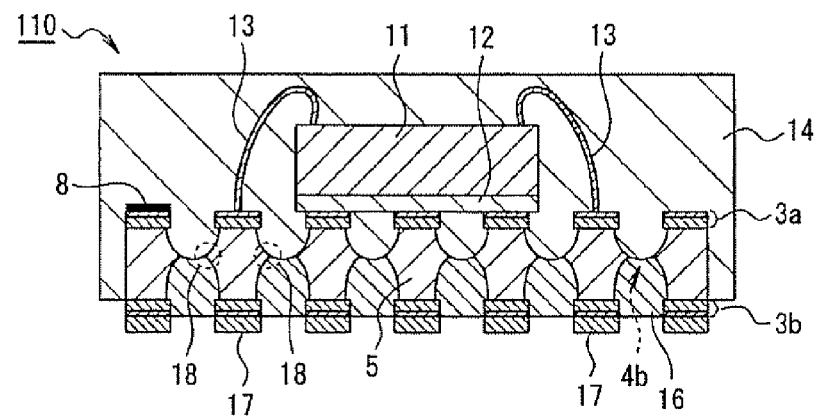

FIGS. 8A through 8C are sectional views showing a method for manufacturing a semiconductor device 110 according to a second embodiment of the invention. Such case will be described below that after the back surface penetration shown in FIG. 3E (that is, after the connecting part 6 is removed), the concave part 4b formed on the back surface side of the substrate 10 is filled with a resist, and Ni, Pd, and Au plating or Ni and Au plating is used as the plating layer 3b on the back surface, or a solder plating is additionally formed on the plating layer 3b. In FIGS. 8A through 8C, portions having the same structure as those described in the first embodiment have the same reference numerals, and detailed descriptions thereof will be omitted.

Referring to FIG. 8A, the process up to the back surface penetration step is same as that in the first embodiment. This second embodiment applies a solder resist 16 on the back surface side of the substrate 10 after the back surface penetration so as to fill the concave part 4b. Then the solder resist 16 is exposed to light and developed so as to remove the solder resist 16 partially. Accordingly, the plating layer 3b is exposed and the solder resist 16 is left in the concave part 4b as shown in FIG. 8B.

If the solder resist 16 is positive type, the solder resist 16 is exposed to light while using a photo-mask (not shown) blocking the light only in a region where the concave part 4b is formed. If the solder resist 16 is negative type, the solder resist 16 is exposed to light while using a photo-mask (not shown) blocking the light only in a region where the posts 5 are formed. Accordingly, the solder resist 16 can be left in the concave part 4b.

As shown in FIG. 8C, on the surface of the plating layer 3b that is exposed, a terminal part 17 such as a solder plating is formed. Then the mold resin 14 is diced into pieces. In this dicing step, the posts 5 may be cut with the blade 15 having a terminal size or more as shown in FIG. 4A, or an intermediate point between the posts 5 may be cut with the blade 15 having a half-etching size or less as shown in FIG. 4B. There are cases where the recognition mark 8 is left inside the semiconductor device 110 and where the recognition mark 8 is not left inside depending on a positional relationship between the dicing line and the recognition mark 8. Thus, the semiconductor device 110 is completed.

According to the second embodiment, since the concave part 4b is filled with the solder resist 16, the connecting strength between the posts 5 adjacent each other is stronger than that in the first embodiment. A disc-like projecting part 18 is formed at the intermediate part of the post 5 in the thickness direction, and the projecting part 18 is fixed to the mold resin 14 by the solder resist 16. The projecting part 18 is a boundary between the wet-etching that progresses from the upper surface and the wet-etching that progresses from the back surface. The projecting part 18 is the widest part in the post 5 when viewed in section, for example.

According to the second embodiment, the following triple drop-preventing measures a) to c) are taken, so that the posts 5 can be pressed to the mold resin 14, being able to prevent the posts 5 from dropping from the mold resin 14:

a) curving shape of the lateral face of the posts 5 b) anchor effect of the T-shape composed of the plating layer 3*a* and the post 5 c) drop-holding by the solder resist 16 (including the fixing of the projecting part 18).

Corresponding relationship in the second embodiment with respect to the invention is same as that in the first embodiment.

Third Embodiment

Figure 9A:
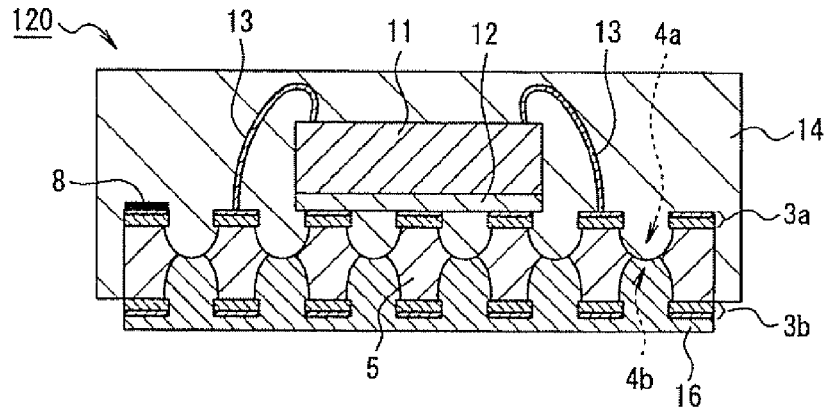
FIGS. 9A through 9C are schematic views showing a method for manufacturing a semiconductor device 120 according to a third embodiment.
Figure 9B:
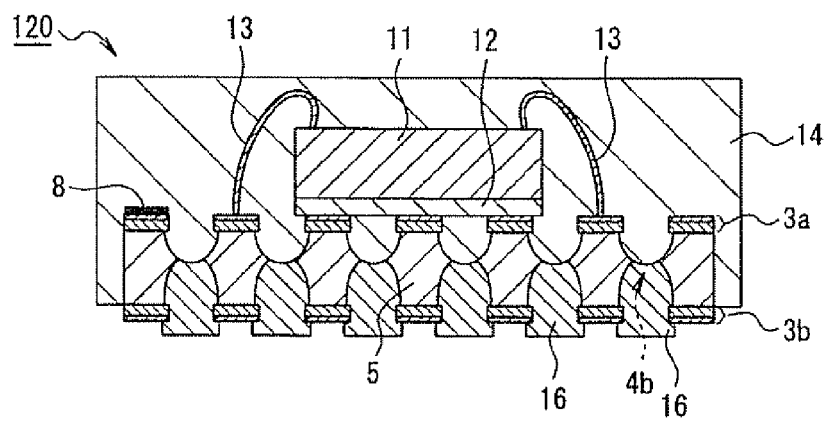
Figure 9C:
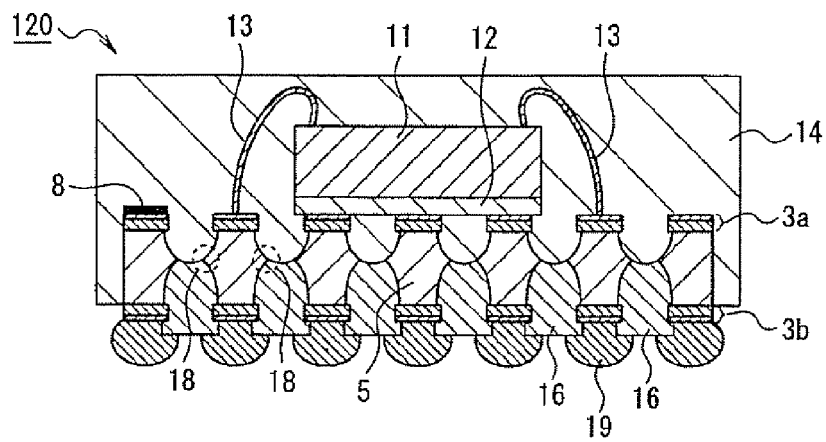

FIGS. 9A through 9C are sectional views showing a method for manufacturing a semiconductor device 120 according to a third embodiment of the invention. Such case will be described below that after the back surface penetration in FIG. 3E (that is, after the connecting part 6 is removed), the concave part 4*b* formed on the back surface side of the substrate 10 is filled with the solder resist 16 and a solder ball 19 is mounted on the plating layer 3*b*. In FIGS. 9A through 9C, portions having the same structure as those described in the first and second embodiments have the same reference numerals, and detailed descriptions thereof will be omitted.

Referring to FIG. 9A, the process up to the back surface penetration step is same as that in the first embodiment. This third embodiment applies the solder resist 16 on the back surface of the substrate 10 after the back surface penetration so as to fill the concave part 4*b*. In the third embodiment, the solder resist 16 is applied thicker than in the second embodiment. Then the solder resist 16 is exposed to light and developed so as to remove the solder resist 16 partially. Accordingly, the plating layer 3*b* is exposed and the solder resist 16 is left in the concave part 4*b* as shown in FIG. 9B. Here, as shown in FIG. 9B, an opening (which exposes the plating layer 3*b*) of the solder resist 16 is formed smaller than that in the second embodiment so as to allow the solder resist 16 to overhang the posts 5. The solder resist 16 is made of resin, for example. Especially, the solder resist 16 is preferably made of a resin having a larger coefficient of thermal expansion than the mold resin 14. In addition, the solder resist 16 is preferably made of a resin having a smaller elastic modulus than the mold resin 14.

Then, as shown in FIG. 9C, the solder ball 19 is mounted on the plating layer 3*b* exposed from the solder resist 16. Here, since the exposed face of the plating layer 3*b* is made small (that is, narrowed down) by the solder resist 16, the solder ball 19 can be formed in a mounded manner (that is, formed to be in a mushroom shape when viewed in section). The solder ball 19 can provide a stable area and a stable height (coplanarity) for mounting terminals so as to provide an advantageous second mounting property.

Then the mold resin 14 is diced into pieces. This dicing step is same as that described with reference to FIGS. 4A and 4B. That is, the posts 5 may be cut with the blade 15 having a terminal size or more as shown in FIG. 4A, or an intermediate point between the posts 5 may be cut with the blade 15 having a half-etching size or less as shown in FIG. 4B. Further, the post 5 on which the recognition mark 8 is formed may be cut as shown in FIG. 4A. There are cases where the recognition mark 8 is left inside the semiconductor device 120 and where the recognition mark 8 is not left inside depending on a positional relationship between the dicing line and the recognition mark 8. Thus, the semiconductor device 120 is completed.

Figure 10:
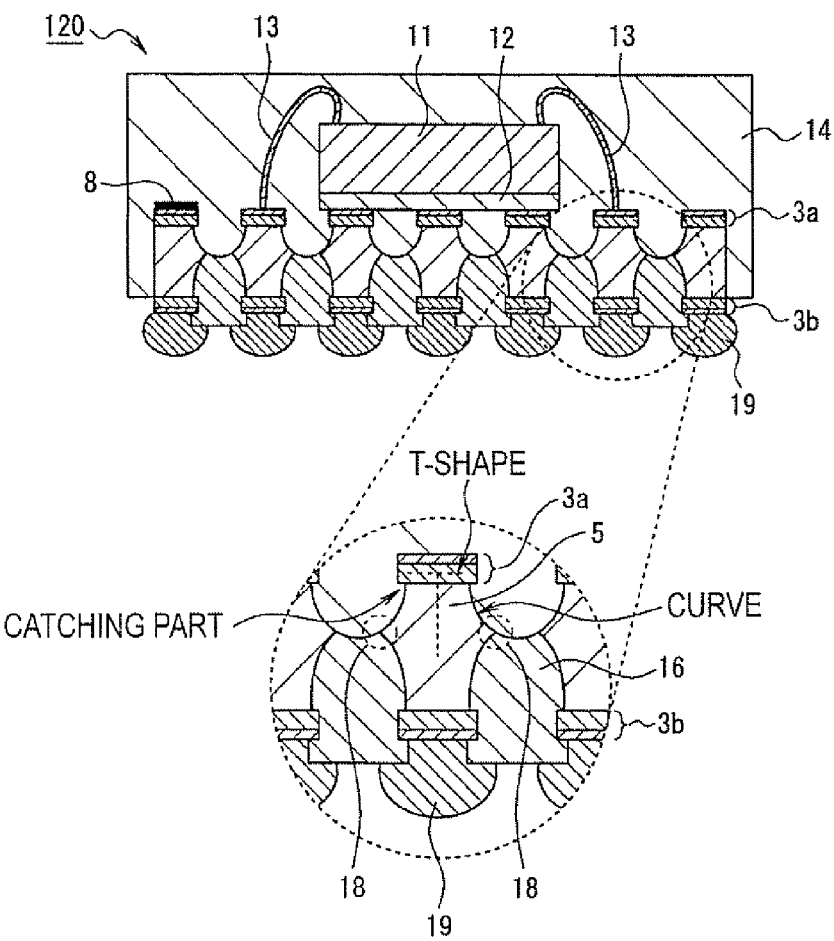
FIG. 10 is a schematic view illustrating a sectional shape of the semiconductor device 120.

According to the third embodiment, since the concave part 4*b* is filled with the solder resist 16 as is the case with the second embodiment, the connecting strength between the posts 5 adjacent each other is larger than that in the first embodiment. As shown in FIG. 10, a disk-like projecting part 18 formed by wet-etching from the upper surface and wet-etching from the back surface is provided at an intermediate part of each of the posts 5 in the thickness direction, and the projecting part 18 is fixed to the mold resin 14 by the solder resist 16.

Further, the solder resist 16 embedded in the concave part 4*b* overhangs the posts 5 and thus the periphery of the plating layer 3*b* is held by this overhanging part. A part, overhanging the posts 5, of the solder resist 16 is held by the solder ball 19. In such structure, the posts 5 provided with the plating layer 3*b* can be held by the solder resist 16 and the solder resist 16 can be held by the solder ball 19.

According to the third embodiment, the following quadplex drop-preventing measures a) to d) are taken, so that the posts 5 can be pressed to the mold resin 14, being able to prevent the posts 5 from dropping from the mold resin 14:

a) curving shape of the lateral face of the posts 5 b) anchor effect of the T-shape composed of the plating layer 3*a* and the post 5 c) holding by the solder resist 16 (including the fixing of the projecting part 18 and the holding from the lower side due to the overhanging structure)

d) holding by the solder ball 19 having a mushroom shape.

Corresponding relationship in the third embodiment with respect to the invention is same as that in the first embodiment.

Fourth Embodiment

Figure 11:
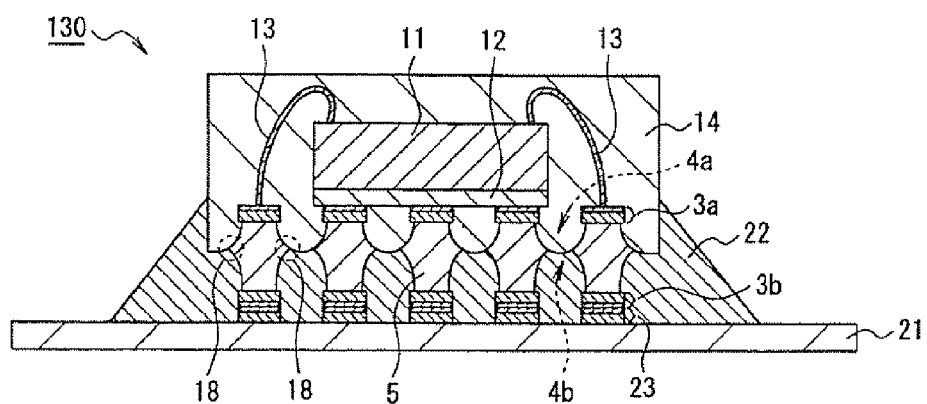
FIG. 11 is a schematic view illustrating a structure of a semiconductor device 130 according to a fourth embodiment.

FIG. 11 is a sectional view illustrating a structure of a semiconductor device 130 according to a fourth embodiment of the invention. In FIG. 11, portions having the same structure as those described in the first to third embodiments have the same reference numerals, and detailed descriptions thereof will be omitted.

The semiconductor device 130 shown in FIG. 11 is formed such that the semiconductor device 100 (refer to FIG. 7) which is diced in the fast embodiment is attached to a motherboard 21 and an underfill 22 is injected between the mold resin 14 and the motherboard 21. In this semiconductor device 130, the plating layer 3*b* provided to the back surface of the post 5 is bonded with a wiring layer 23 provided to the upper surface of the motherboard 21. Further, between the mold resin 14 and the motherboard 21, the exposed part of the post 5 from the mold resin 14, the plating layer 3*b*, and the wiring layer 23 are sealed with the underfill 22. Thus, the connecting reliability between the IC element 11 and the motherboard 21 can be enhanced by injecting the underfill 22 after the second mounting. The underfill 22 is made of resin, for example. Especially, the underfill 22 is preferably made of a resin having a larger coefficient of thermal expansion than the mold resin 14. Further, the underfill 22 is preferably made of a resin having a smaller elastic modulus than the mold resin 14.

Corresponding relationship in the fourth embodiment with respect to the invention is same as that in the first embodiment.

Fifth Embodiment

The first embodiment describes the case where the connecting part 6 is etched to be removed after the IC element 11 is attached to the substrate 10. However, the connecting part 6 may be etched before the IC element 11 is attached. This fifth embodiment describes such method.

FIGS. 12A through 13D are sectional views showing a method for manufacturing a semiconductor device 140 according to the fifth embodiment of the invention. In FIGS. 12A through 13D, portions having the same structure as those described in the first to fourth embodiments have the same reference numerals, and detailed descriptions thereof will be omitted.

Figure 12A:
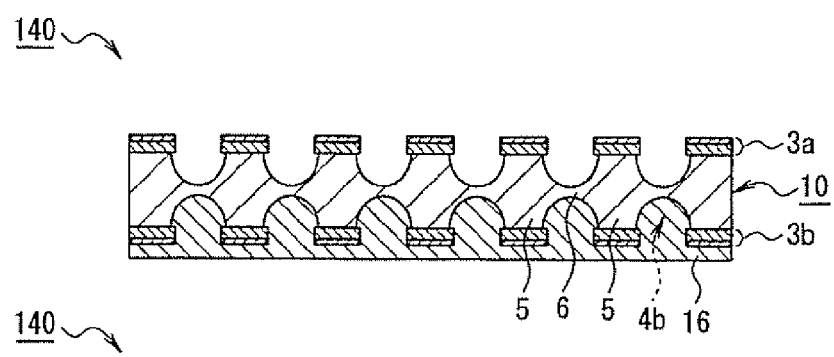
FIGS. 12A through 12C are schematic views showing a method for manufacturing a semiconductor device 140 according to a fifth embodiment.

The substrate 10 shown in FIG. 12A is, for example, a substrate manufactured by the method described in FIGS. 1A through 1F or FIGS. 2A through 2G. The solder resist 16 is applied on the back surface of the substrate 10 so as to fill the concave part 4b. Here, the solder resist 16 is applied thick, as is the case with the third embodiment.

Figure 12B:
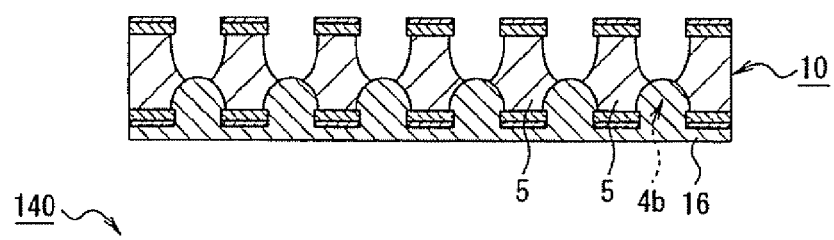

Subsequently, the connecting part 6 connecting the posts 5 adjacent each other is etched from the upper surface side to be removed. The connecting part 6 is etched with a ferric chloride solution or an alkaline solution, for example. Accordingly, the posts 5 adjacent each other can be electrically separated as shown in FIG. 12B. In the fifth embodiment, the concave part 4b is filled with the solder resist 16 when the connecting part 6 is etched. Therefore, even after the connecting part 6 is removed, the connecting state between the posts 5 adjacent each other is maintained by the solder resist 16.

Figure 12C:
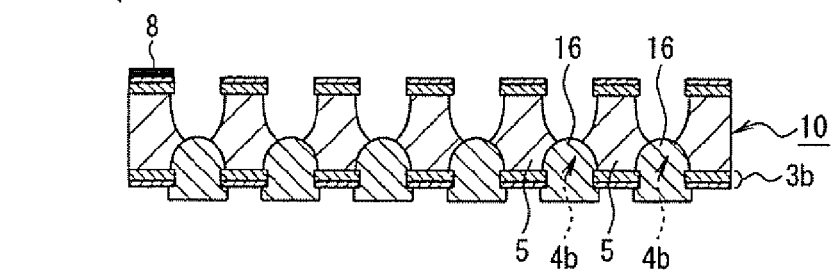

Then the solder resist 16 is exposed to light and developed so as to be removed partially. Thus the plating layer 3b is exposed and the solder resist 16 is left in the concave part 4b as shown in FIG. 12C. Here, the solder resist 16 is allowed to overhang the posts 5, as is the case with the third embodiment.

Next, a surface (upper surface) of the post 5 that is at the desired position is colored by ink-jetting or laser marking, for example, so as to form a recognition mark 8. In a case where the recognition mark 8 is formed by ink-jetting, a heat-resistance different-color ink or a different-color plating, for example, can be employed as the coloring material. The recognition mark 8 may be formed before the solder resist 16 is partially removed, but it is preferably removed after the step removing the solder resist 16 or immediately before a die attaching step described later. Accordingly the recognition mark 8 that is formed is prevented from being damaged or removed in the step removing the solder resist 16 or in the previous step conducted after the step forming the recognition mark 8.

Figure 13A:
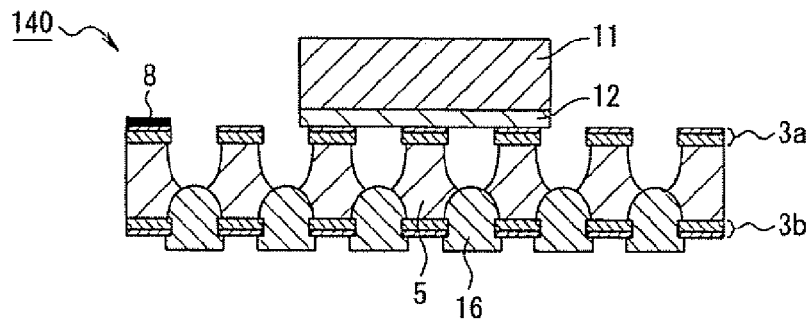
FIGS. 13A through 13D are schematic views showing a method for manufacturing a semiconductor device 140 according to the fifth embodiment.

Next, as shown in FIG. 13A, the IC element 11 is attached on the plurality of posts 5 that are in the IC fixing region with the adhesive 12 interposed. In this die attaching step, the IC fixing region for the IC element 11 is recognized based on the recognition mark 8 and the IC element 11 is positioned in the IC fixing region that is recognized. Then the IC element that is positioned in the IC fixing region is attached on the plurality of posts 5 that are in the IC fixing region. Such method can position the IC element 11 in the IC fixing region accurately and attach the IC element 11 to the substrate 10 with little displacement.

Figure 13B:
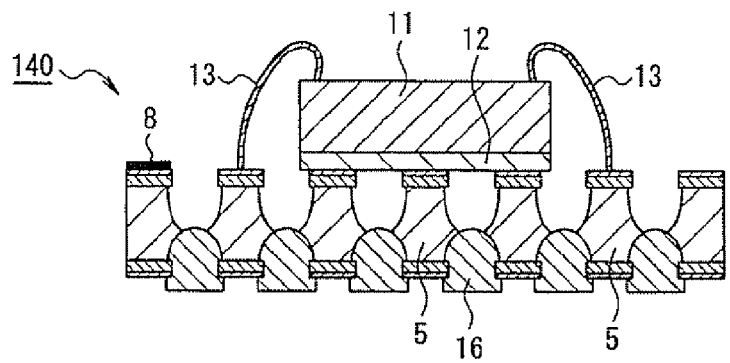

As shown in FIG. 13B, the upper surface of the post 5 that is in a region except for the IC fixing region (that is, a region out of a region immediately beneath the IC element 11) is coupled to a pad terminal provided to an active face of the IC element 11 with, for example, the gold wire 13. Here, the post 5 that is to be the external terminal may be recognized based on the recognition mark 8 so as to couple the post 5 that is recognized with an end of the gold wire 13. Such method can correctly recognize the post 5 that is to be the external terminal from the plurality of posts 5 so as to accurately attach the gold wire 13 to the post 5 that is recognized.

Figure 13C:
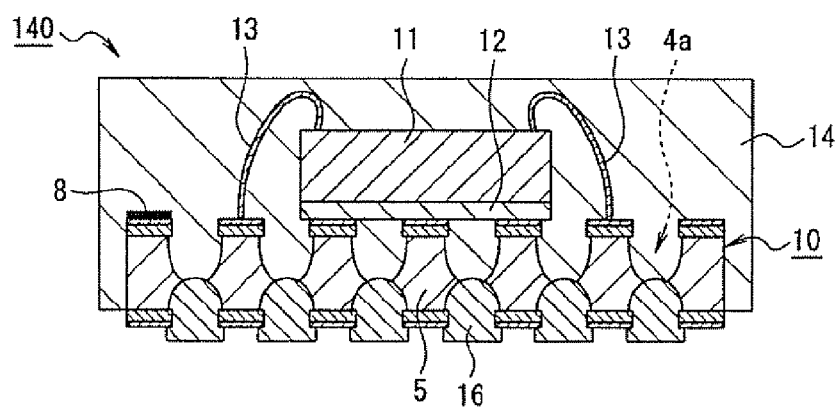

As shown in FIG. 13C, a whole upside of the substrate 10 provided with the IC element 11, the gold wire 13, and the posts 5 is sealed with the mold resin 14. The mold resin 14 is, for example, a thermoset epoxy resin. In this resin sealing step, the upper surface side of the substrate 10 provided with the IC element 11 is covered by a molding die having a cavity. Then the inside of the cavity is decompressed so as to supply the cavity that is decompressed with the mold resin 14, in the same manner as the first embodiment. Such resin supply under diminished pressure can fill the concave part 4a with the mold resin 14 without leaving any gap as shown in FIG. 13C.

Figure 13D:
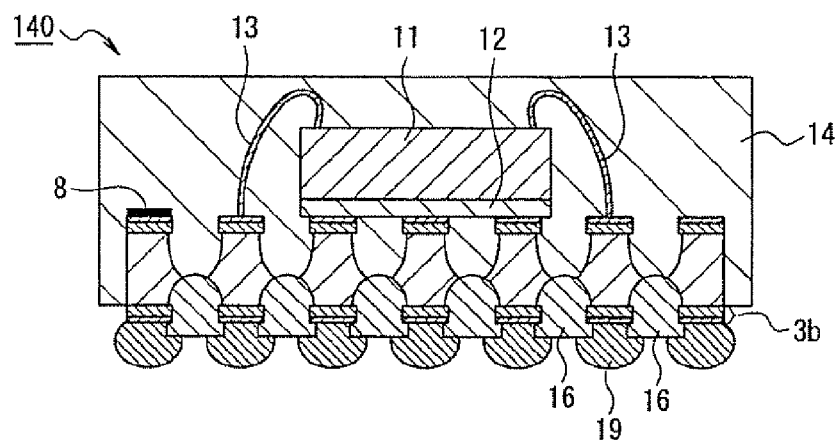

Then, as shown in FIG. 13D, the solder ball 19 is mounted on the plating layer 3b exposed from the solder resist 16. Since the exposed face of the plating layer 3b is made small (that is, narrowed down) by the solder resist 16, the solder ball 19 can be formed to be in a mushroom shape when viewed in section, as is the case with the third embodiment. Then the mold resin 14 is diced into pieces. This dicing step is same as the step shown in FIGS. 4A and 4B, and the post 5 provided with the recognition mark 8 may be cut. There are cases where the recognition mark 8 is left inside the semiconductor device 140 and where the recognition mark 8 is not left inside depending on a positional relationship between the dicing line and the recognition mark 8. Thus, the semiconductor device 140 is completed.

According to the fifth embodiment, the IC fixing region is recognized based on the recognition mark 8 and the IC element 11 is positioned in the IC fixing region that is recognized. Therefore, the IC element 11 can be accurately positioned in the IC fixing region and can be attached on the posts 5 that are in the IC fixing region with little displacement. According to the fifth embodiment, the following quadplex drop-preventing measures a) to d) are taken, so that the posts 5 can be pressed to the mold resin 14, being able to prevent the posts 5 from dropping from the mold resin 14:

a) curving shape of the lateral face of the posts 5 b) anchor effect of the T-shape composed of the plating layer 3a and the post 5 c) drop-holding by the solder resist 16 (including the fixing of the projecting part 18 and the overhanging structure)

d) holding by the solder ball 19 having a mushroom shape for preventing the dropping.

According to the fifth embodiment, even after the connecting part 6 composed of the copper plate is removed, the connecting state between the posts 5 adjacent each other can be maintained by the solder resist 16. Therefore, the substrate 10 in the state shown in FIG. 12C, for example, can be allowed to go into circulation, so that the semiconductor device 140 can be assembled in the assembling process (facilities) having no machine for conducting copper plate etching, solder resist applying, and an exposing and developing treatment.

The connecting part 6 and the solder resist 16 in the fifth embodiment correspond to a "connecting part" in the invention. Other corresponding relationship with respect to the invention is same as that in the first embodiment.

Sixth Embodiment

The first embodiment describes the case where the copper plate 1 is half-etched from the upper surface and the back surface thereof so as to manufacture the substrate 10, as shown in FIGS. 1A through 1F and FIGS. 2A through 2G. However, the manufacturing method of the invention is not limited to the above. For example, only the upper surface of the copper plate 1 may be half-etched so as to manufacture a substrate. This sixth embodiment will describe such structure. The sixth embodiment will describe two types of manufacturing methods that are shown in FIGS. 14A through 14F and in FIGS. 15A through 15G as examples of a method for manufacturing a substrate. FIGS. 14A through 14F show a manufacturing method applying a semi-additive method, and FIGS. 15A through 15G show a manufacturing method applying a subtractive method. After these two types of manufacturing methods are described, processes of attaching the IC element and resin-sealing will be described with reference to FIGS. 16A through 16D.

FIGS. 14A through 14F are sectional views showing a method (a semi-additive method) for manufacturing a substrate 20 according to the sixth embodiment of the invention. In FIGS. 14A through 14F, portions having the same structure as those described in the first to fifth embodiments have the same reference numerals, and detailed descriptions thereof will be omitted.

Figure 14A:
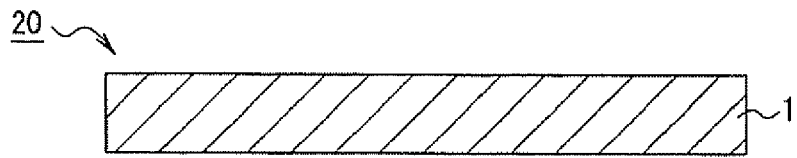
FIGS. 14A through 14F are schematic views showing a method for manufacturing a substrate 20 according to a sixth embodiment.
Figure 14B:
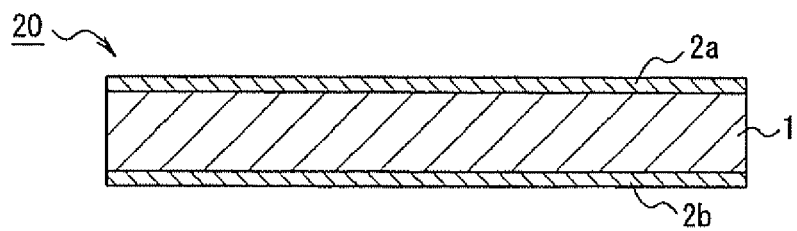
Figure 14C:
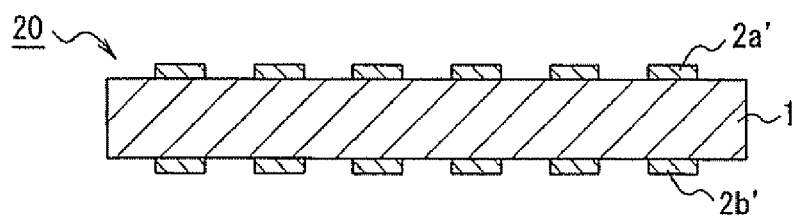

First, the copper plate 1 is prepared as shown in FIG. 14A. Then, as shown in FIG. 14B, the photo-resist 2a and the photo-resist 2b are respectively applied on the upper surface and the back surface of the copper plate 1. As shown in FIG. 14C, an exposure and development treatment is performed with respect to the photo-resists 2a and 2b so as to form the resist-pattern 2a' and the resist-pattern 2b' exposing a region to be provided with the posts 5 and covering a region other than the region for the posts. The resist-pattern 2a' and the resist-pattern 2b' are formed respectively on the upper surface and the back surface of the copper plate 1.

Figure 14D:
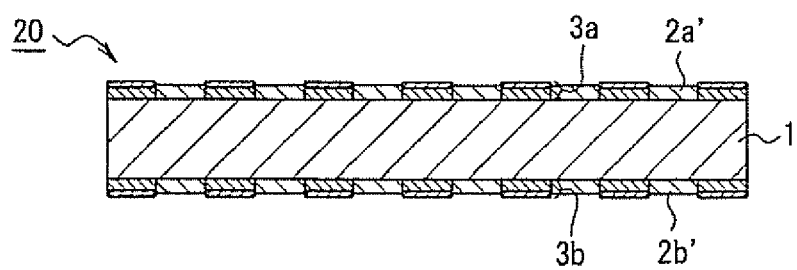
Figure 14E:
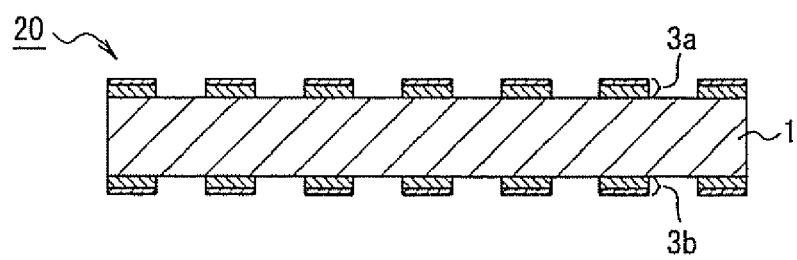
Figure 14F:
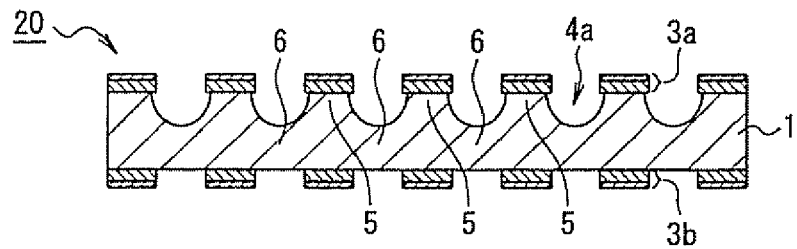

As shown in FIG. 14D, the plating layer 3a and the plating layer 3b are formed on the copper plate 1 in the region exposed from the resist patterns 2a' and 2b' (that is, a region where the post 5 is to be formed) by electroless plating. After the plating layers 3a and 3b are formed, the resist patterns 2a' and 2b' are respectively removed from the upper surface and the back surface of the copper plate 1 as shown in FIG. 14E. Then the copper plate 1 is half-etched from the upper surface thereof so as to form the concave part 4a as shown in FIG. 14F. In the step shown in FIG. 14F, the copper plate 1 is etched only from the upper surface and it is not etched from the back surface. Such one face etching can be conducted by spraying type wet-etching. For example, a ferric chloride solution or an alkaline solution is selected as an etchant so as to be sprayed to the upper surface of the copper plate 1, forming the concave part 4a.

The concave part 4a may have a depth that is half of the thickness of the copper plate 1 and may be deeper or shallower than that. Due to the same reason as the first embodiment, the substrate 20 may be cleaned after the half-etching, and an antioxidant may be applied to the upper surface (including the inner face of the concave part) and the back surface of the copper plate 1 after the cleaning treatment.

Further, referring to FIG. 14E, a photo-resist (not shown) for plating protection may be formed on each of the upper surface and the back surface of the copper plate 1 before the copper plate 1 is etched. In the etching step of the copper plate 1, the copper plate 1 is etched from the upper surface thereof while using the plating layer 3a covered by the photo-resist as a mask. Therefore, the plating layers 3a and 3b can be protected from the etchant.

The photo-resist for plating protection may be retained also after the concave part 4a is formed. Accordingly, the plating layers 3a and 3b can be kept to be protected in the following assembling process. The photo-resist for plating protection may be retained both on the plating layer 3a and the plating layer 3b, or may be retained only on the plating layer 3b. Such photo-resist for plating protection may be formed not before the etching of the copper plate 1 but after the etching of the same. In such structure as well, the plating layers 3a and 3b can be kept to be protected in the following assembling process.

The other method for manufacturing a substrate will be described with reference to FIGS. 15A through 15G.

FIGS. 15A through 15G are sectional views showing a method (a subtractive method) for manufacturing a substrate 20 according to the sixth embodiment of the invention. In FIGS. 15A through 15G, portions having the same structure as those described in the first to fifth embodiments have the same reference numerals, and detailed descriptions thereof will be omitted.

Figure 15A:
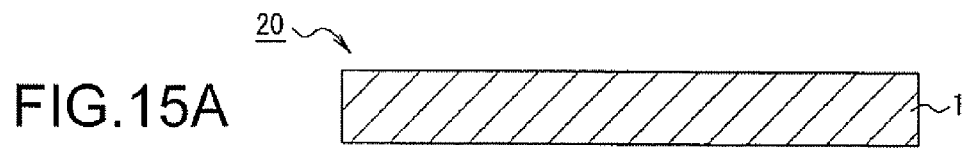
FIGS. 15A through 15G are schematic views showing a method for manufacturing a substrate 20 according to the sixth embodiment.
Figure 15B:
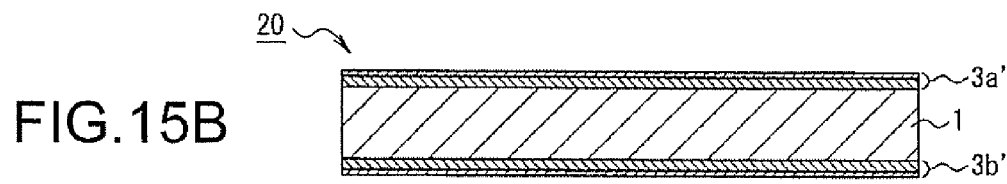
Figure 15C:
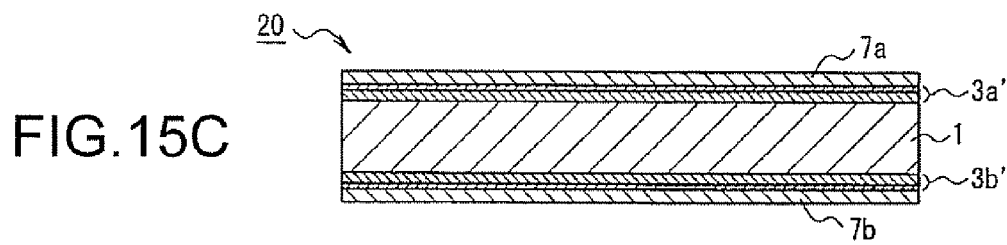
Figure 15D:
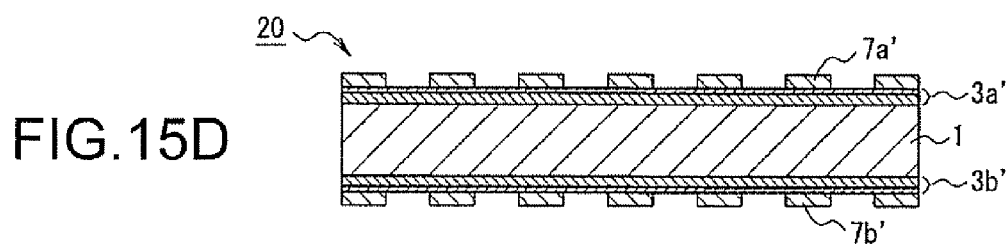
Figure 15E:
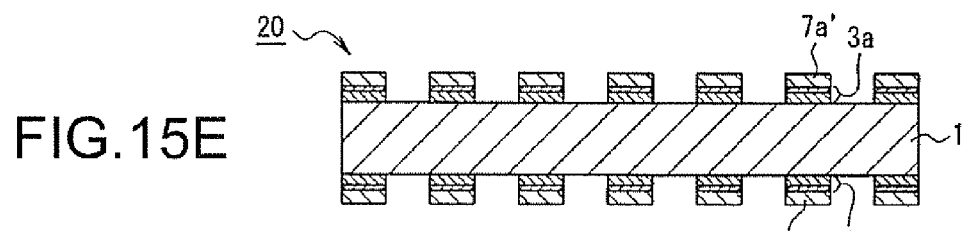

First, the copper plate 1 is prepared as shown in FIG. 15A. Then, as shown in FIG. 15B, the plating layers 3a' and 3b' are respectively formed on the upper surface and the back surface of the copper plate 1 by electroless plating, for example. As shown in FIG. 15C, the photo-resist 7a and the photo-resist 7b are respectively applied on the upper surface and the back surface of the copper plate 1. Next, as shown in FIG. 15D, an exposure and development treatment is performed with respect to the photo-resists 7a and 7b so as to form the resist-pattern 7a' and the resist-pattern 7b' covering a region to be provided with posts and exposing a region other than the region for the posts respectively on the upper surface and the back surface of the copper plate 1. Then, as shown in FIG. 15E, the plating layers 3a' and 3b' are etched to be removed while using the resist-patterns 7a' and 7b' as masks. Accordingly, as shown in FIG. 15E, the plating layers 3a and 3b that are patterned are formed respectively on the upper surface and the back surface of the copper plate 1.

Figure 15F:
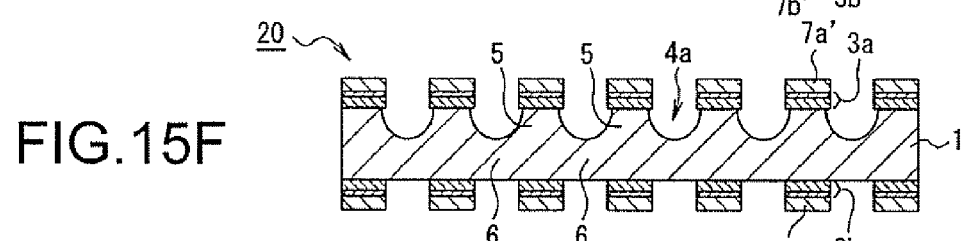

As shown in FIG. 15F, the copper plate 1 is half-etched from the upper surface thereof while using the resist-pattern 7a' and the plating layer 3a covered by the resist-pattern 7a' as a mask. Thus, the concave part 4a is formed on the upper surface of the copper plate 1. In the step shown in FIG. 15F, the copper plate 1 is etched only from the upper surface and it is not etched from the back surface. Such etching only from the upper surface can be conducted by spraying type wet-etching, for example. A ferric chloride solution or an alkaline solution, for example, is selected as an etchant so as to be sprayed to the upper surface of the copper plate 1, forming the concave part 4a.

The concave part formed on the upper surface of the copper plate 1 may have a depth half of the thickness of the copper plate 1 or may be deeper or shallower than that. Due to the same reason as the first embodiment, the substrate 20 may be cleaned after the half-etching, and an antioxidant may be applied to the upper surface (including the inner face of the concave part) and the back surface of the copper plate 1 after the cleaning treatment.

Figure 15G:
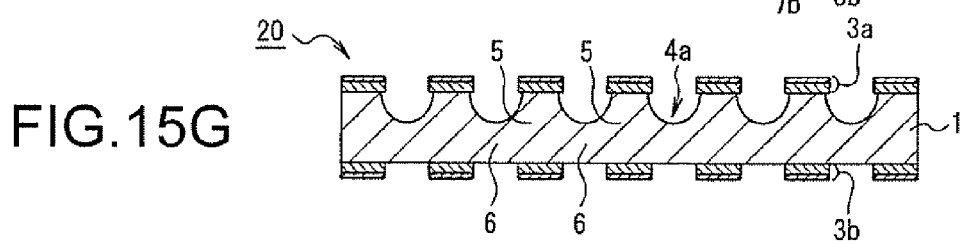

Then, as shown in FIG. 15G, the resist-patterns 7a' and 7b' are removed from the substrate 20. Here, the resist removing step of FIG. 15G is not obligatory but an example in the embodiment. In the embodiment, the resist patterns 7a' and 7b' may be left on the both faces of the substrate 20. Alternatively, only the resist pattern 7a' on the upper surface of the substrate 20 may be removed and the resist pattern 7b' on the back surface may be left, in FIG. 15G. Accordingly, the resist pattern 7b' can be used as a protection film of the plating layer 3b in the following assembling process.

In the manufacturing method shown in FIGS. 15A through 15G, steps shown in FIGS. 15C to 15E may be conducted not by a chemical process such as wet-etching but by a physical process. As is the case with the first embodiment, the plating layers may be partially removed by a sandblasting treatment or a treatment employing a cutting instrument. FIGS. 16A through 16D are sectional views showing a method for manufacturing a semiconductor device 150 (from recognition mark processing to a resin sealing step) according to the sixth embodiment of the invention. In FIGS. 16A through 16D, portions having the same structure as those described in the first to fifth embodiments have the same reference numerals, and detailed descriptions thereof will be omitted.

Figure 16A:
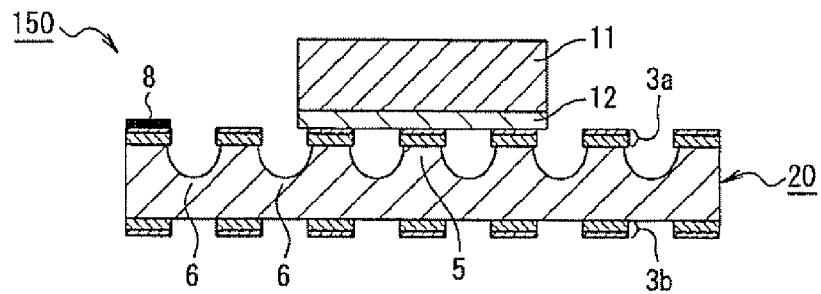
FIGS. 16A through 16D are schematic views showing a method for manufacturing a semiconductor device 150 according to the sixth embodiment.

In FIG. 16A, the substrate 20 manufactured by the method shown in FIGS. 14A through 14F or FIGS. 15A through 15G is prepared, and the recognition mark 8 is formed on the upper surface of the substrate 20. A top surface of the post 5 that is at the desired position is colored by ink-jetting or laser marking, for example, so as to form a recognition mark 8 in the same manner as the first embodiment. Then the IC fixing region is recognized based on the recognition mark 8 so as to position the IC element 11 in the IC fixing region that is recognized. The IC element 11 is attached on the plurality of the posts 5 that are in the IC fixing region with the adhesive 12 interposed.

Figure 16B:
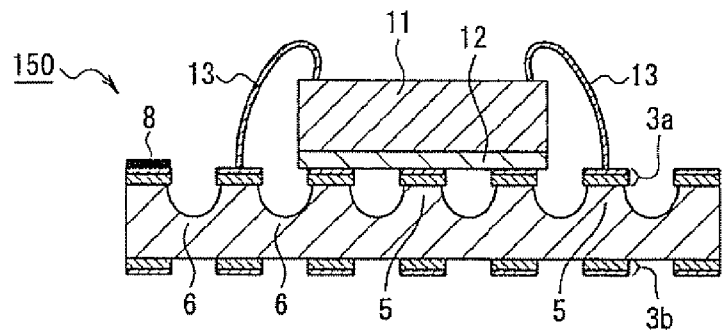

As shown in FIG. 16B, the top surface of the posts 5 that are in a region except for the IC fixing region (that is, a region out of a region immediately beneath the IC element 11) is coupled to a pad terminal provided to an active face of the IC element 11 with, for example, the gold wire 13. Here, the post 5 to be the external terminal may be recognized based on the recognition mark 8 so as to couple the post 5 that is recognized with an end of the gold wire 13. Such method can correctly recognize the post 5 that is to be the external terminal from the plurality of posts 5 so as to accurately attach the gold wire 13 to the post 5 that is recognized.

Figure 16C:
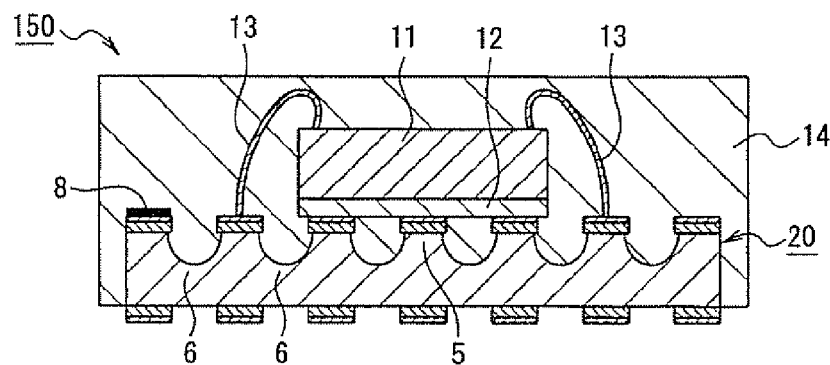

As shown in FIG. 16C, a whole upside of the substrate 20 provided with the IC element 11, the gold wire 13, and the posts 5 is sealed with the mold resin 14. The mold resin 14 is, for example, a thermoset epoxy resin. In this resin sealing step, the upper surface side of the substrate 20 provided with the IC element 11 is covered by a molding die having a cavity. Then the inside of the cavity is decompressed so as to supply the cavity that is decompressed with the mold resin 14. Such resin supply under diminished pressure can fill the cavity properly with the mold resin 14 so as to fill the concave part 4a with the mold resin 14 without leaving any gap as shown in FIG. 16C.

Figure 16D:
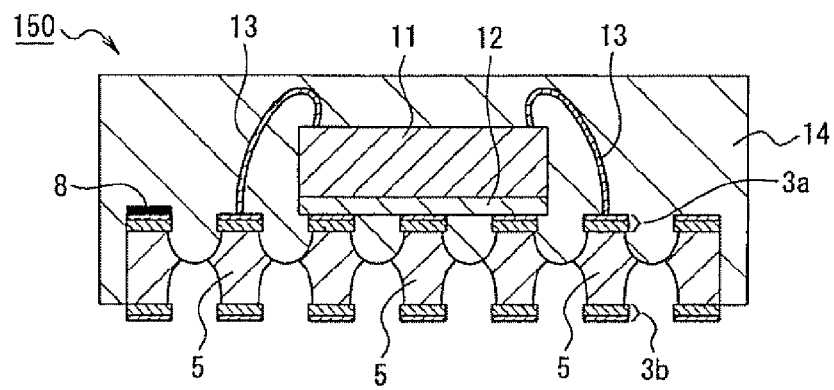

Then the substrate 20 is etched from the back surface thereof while using the plating layer 3b as a mask so as to remove the connecting part 6, electrically separating the posts 5 adjacent each other, as shown in FIG. 16D. The substrate 20 is etched with a ferric chloride solution or an alkaline solution, for example. Accordingly, the posts 5 coupled with the gold wire 13 can be used as external terminals that are electrically independent from each other.

In a case where the photo-resist which is not shown is left on the back surface side as the protection film for the plating layer 3b, the photo-resist is removed after the connecting part is etched.

In a case where the plating layer 3b is made of Ag, the Ag plating may be removed so as to conduct another plating treatment. That is, the Ag plating may be removed and then different kind of plating may be applied as the plating layer 3b. As the different kind of plating, Ni, Pd, and Au plating, or Ni and Au plating, and solder plating, for example, may be used. Such reapplying the plating layer 3b is suitably conducted after the photo-resist is removed in a case where the photo-resist is formed on the back surface, and that is suitably conducted after the connecting part is removed in a case where the photo-resist is not formed on the back surface.

Then the mold resin 14 is diced into pieces. This dicing step is same as the step shown in FIGS. 4A and 4B, and the post 5 provided with the recognition mark 8 may be cut. There are cases where the recognition mark 8 is left inside the semiconductor device 150 and where the recognition mark 8 is not left inside depending on a positional relationship between the dicing line and the recognition mark 8. Thus, the semiconductor device 150 is completed.

As above, according to the sixth embodiment, the posts 5 can be used as die pads for mounting the IC element 11 or as external terminals of the IC element 11. The plurality of posts 5 can be separately used as the die pads or the external terminals depending on a shape or a size of the IC fixing region that is set adequately. Therefore, as is the case with the first embodiment, a specification of the substrate 20 that is used for mounting an element and used as an external terminal can be made common, being able to reduce the manufacturing cost of the semiconductor device.

Further, according to the sixth embodiment, the IC fixing region is recognized based on the recognition mark 8 and the IC element 11 is positioned in the IC fixing region that is recognized in the same manner as the first embodiment. Therefore, the IC element 11 can be accurately positioned in the IC fixing region and can be attached on the posts 5 that are in the IC fixing region with little displacement.

Furthermore, according to the sixth embodiment, since the following double drop-preventing measures a) and b) are taken, the posts 5 can be pressed to the mold resin 14 so as to be able to prevent the posts 5 from dropping from the mold resin 14:

a) curving shape of the lateral face of the posts 5 b) anchor effect of the T-shape composed of the plating layer 3a and the post 5.

The substrate 20 including the recognition mark 8 of the sixth embodiment corresponds to a "substrate" in the invention. Other corresponding relationship with respect to the invention is same as that in the first embodiment.

Seventh Embodiment

The first to sixth embodiments describe the case where the IC element 11 is mounted on the substrate 10 or the substrate 20 including the plurality of posts 5. However, an element mounted on the substrate 10 or the substrate 20 is not limited to the IC element 11, but may be a passive component such as a resistive element and a capacitative element.

Figure 17A:
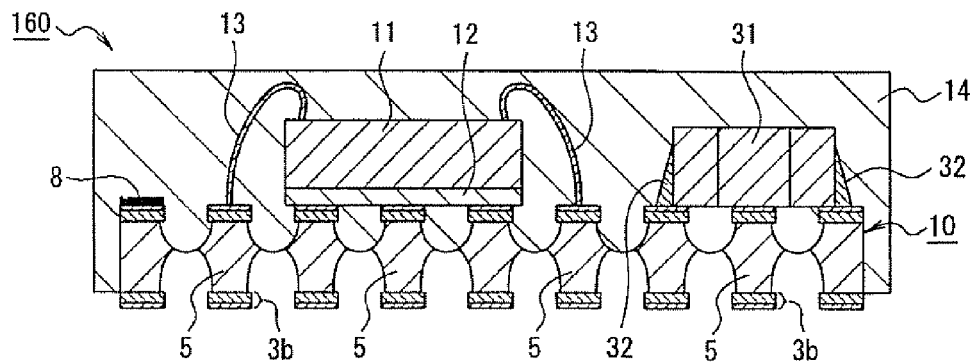
FIGS. 17A through 17C are schematic views illustrating a structure of a semiconductor device 160 and the like according to a seventh embodiment.
Figure 17B:
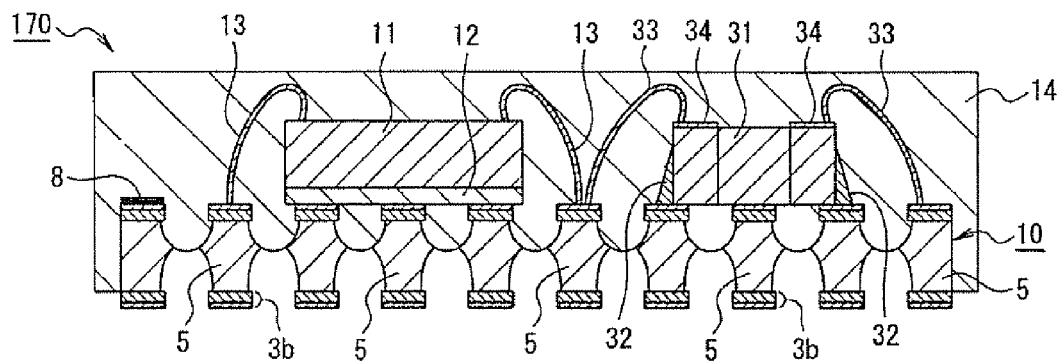
Figure 17C:
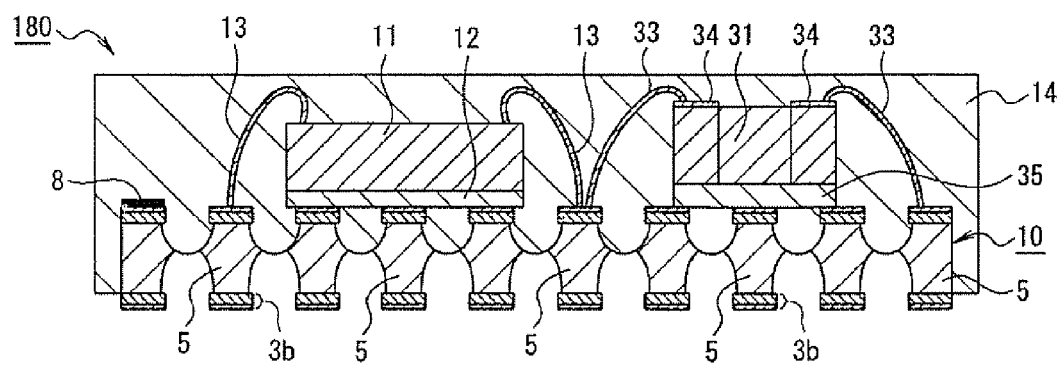

FIGS. 17A through 17C are sectional views illustrating structures of semiconductor devices 160, 170, and 180 according to a seventh embodiment of the invention. In FIGS. 17A through 17C, portions having the same structure as those described in the first to sixth embodiments have the same reference numerals, and detailed descriptions thereof will be omitted.

The semiconductor device 160 shown in FIG. 17A is structured such that a passive component 31 is fixed on the upper surface of the post 5 with a solder 32 and the passive component 31 is electrically connected with the IC element 11 (that is, wire connection) at a motherboard (not shown). In FIG. 17A, portion at the back surface side of the post 5 of the semiconductor device 160 is exposed from the mold resin 14 and the lateral face of the post 5 is curved when viewed in section. A layer of the solder 32 is formed such that a cream solder is applied on the upper surface of the post 5 before the passive component 31 is mounted and a reflow treatment is conducted with respect to the cream solder when the component 31 is mounted.

The semiconductor device 170 shown in FIG. 17B is structured such that a passive component 31 is fixed on the post 5 with a solder 32 and the passive component 31 is electrically connected with the IC element 11 with a gold wire 33 and the like. In the semiconductor device 170 as well, portion at the back surface side of the post 5 is exposed from the mold resin 14 and the lateral face of the post 5 is curved when viewed in section. An upper surface of a terminal part 34 of the passive component 31 is plated with Au or Ag, and the terminal part 34 is connected with the upper surface of the post 5 with the gold wire 33. An end of a gold wire 13 connected with the IC element 11 and an end of the gold wire 33 connected with the passive component 31 are connected to the upper surface of one post 5. Thus the IC element 11 and the passive component 31 are electrically coupled through the gold wire 13, the post 5, and the gold wire 33.

The semiconductor device 180 shown in FIG. 17C is structured such that a passive component 31 is fixed on the post 5 with an insulation resin 35 and the passive component 31 is electrically connected with the IC element 11 with a gold wire 33 and the like. The only difference in the semiconductor device 180 from the semiconductor device 170 shown in FIG. 17B is that a bonding member for bonding the passive component 31 and the post 5 is not the solder but the insulation resin 35. All other structures are same.

Thus, the semiconductor devices 160, 170, and 180 according to the seventh embodiment can use the plurality of posts 5 as die pads for mounting the IC element 11 or the passive component 31, or as external terminals of the IC element 11 or the passive component 31. The devices can separately use the plurality of posts 5 as the die pads or the external terminals depending on the shape and the size of the IC fixing region that is adequately set and the shape and the size of a region for fixing the passive component 31. Therefore, as is the case with the first embodiment, a specification of the substrate 10 can be made common, being able to reduce the manufacturing cost of the semiconductor devices.

Alternatively, in the seventh embodiment, a region to be provided with the passive component 31 (hereinafter, referred to as a predetermined region) may be recognized based on the recognition mark 8 so as to position the passive component 31 in the predetermined region in the die attaching step. Such method can accurately position the passive component 31 in the predetermined region and attach it on the plurality of posts 5 that are in the predetermined region with little displacement. Further, the post 5 to be the external terminal may be recognized based on the recognition mark 8 so as to couple the post 5 that is recognized with an end of the gold wire 13 and an end of the gold wire 33, in the wire bonding step. Such method can correctly recognize the post 5 that is to be the external terminal from the plurality of posts 5 so as to accurately attach the gold wire 13 and the gold wire 33 to the post 5 that is recognized.

Furthermore, according to the seventh embodiment, since the following double drop-preventing measures a) and b) are taken, the posts 5 can be pressed to the mold resin 14 so as to be able to prevent the posts 5 from dropping from the mold resin 14:

a) curving shape of the lateral face of the posts 5
b) anchor effect of the T-shape composed of the plating layer 3a and the post 5.

The post 5 to which the passive component 31 is attached in the seventh embodiment corresponds to a "third metal column" in the invention and the post to which the passive component 31 is electrically connected in the embodiment corresponds to a "fourth metal column" in the invention. Further, the solder 32 or the gold wire 33 of the embodiment corresponds to a "second conductive member" in the invention. Other corresponding relationship with respect to the invention is same as that in the first embodiment.

Eighth Embodiment

The first to seventh embodiments describe the case where the plurality of posts 5 and the IC element 11 are electrically connected with the gold wire 13 (that is, the wire bonding method). However, the invention is not limited to the wire bonding method. The face down method, for example, is also available. An eighth embodiment will specifically describe such structure.

FIGS. 18A through 18E are sectional views showing a method for manufacturing a semiconductor device 190 according to the eighth embodiment of the invention. In FIGS. 18A through 18E, portions having the same structure as those described in the first to seventh embodiments have the same reference numerals, and detailed descriptions thereof will be omitted.

Figure 18A:
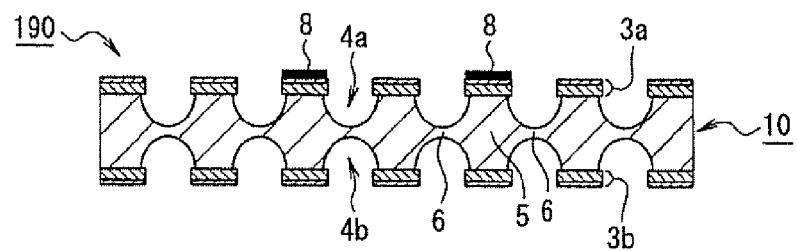
FIGS. 18A through 18E are schematic views showing a method for manufacturing a semiconductor device 190 according to an eighth embodiment.

In FIG. 18A, the substrate 10 manufactured by the method shown in FIGS. 1A through 1F or FIGS. 2A through 2G is prepared, and the recognition mark 8 is formed on the upper surface of the substrate 10. A top surface of the post 5 that is at the desired position is colored by ink-jetting or laser marking, for example, so as to form a recognition mark 8 in the same manner as the first embodiment. Compared to the wire bonding method, higher accuracy in positioning an IC element 41 on the substrate 10 is required in the face down method. Therefore, it is suitable that two or more recognition marks 8 are formed with respect to one IC fixing region, for example.

Figure 18B:
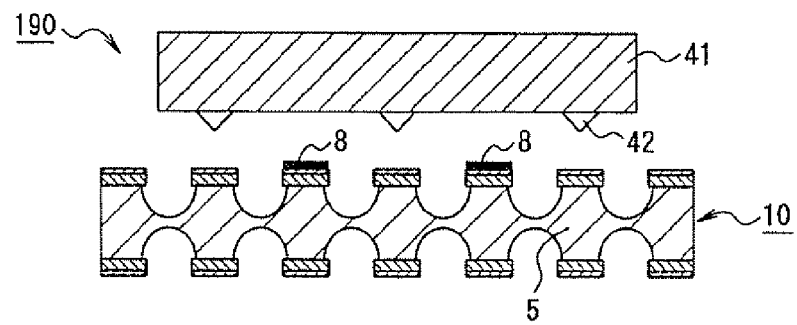
Figure 18C:
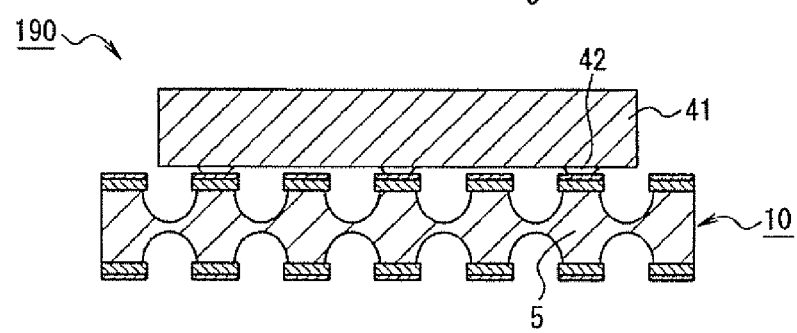

As shown in FIG. 18B, the IC fixing region is recognized based on the recognition marks 8 in a state that an active face of the IC element 41 faces the substrate 10, and the IC element 41 is positioned in the IC fixing region that is recognized. Then, as shown in FIG. 18C, the IC element 41 is pressed to the substrate 10 in the state that the IC element 41 is positioned in the IC fixing region so as to bond a plurality of electrodes 42 that are formed on the active face of the IC element 41 to the top faces of the plurality of posts 5 corresponding to the electrodes 42. Here, the electrodes 42 are stud bumps made of gold, for example, and the arranging interval (pitch) thereof is designed to be an integral multiple of the pitch of the posts 5. Accordingly, the IC element 41 is attached to the substrate 10 and the electrodes 42 of the IC element 41 are electrically coupled with the posts 5. The electrodes 42 may be bumps made of gold produced by electrolytic plating or solder bums.

Figure 18D:
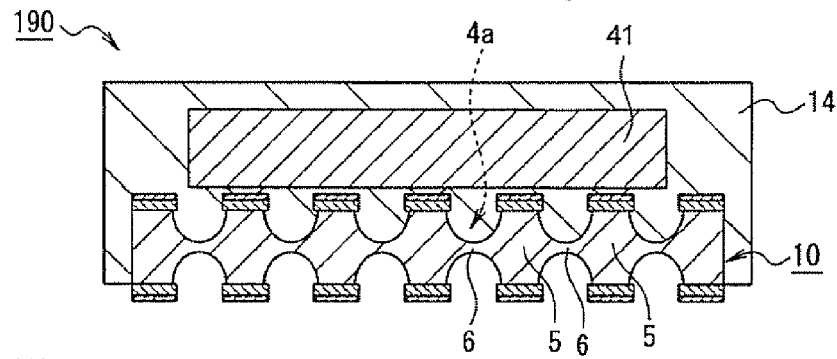

As shown in FIG. 18D, a whole upside of the substrate 10 provided with the IC element 41 is sealed with the mold resin 14. The mold resin 14 is, for example, a thermoset epoxy resin. In this resin sealing step, the upper surface side of the substrate 10 provided with the IC element 41 is covered by a molding die having a cavity. Then the inside of the cavity is decompressed so as to supply the cavity that is decompressed with the mold resin 14. Thus the cavity can be properly filled with the mold resin 14 so as to be able to fill the concave part 4a with the mold resin 14 without any gap.

Figure 18E:
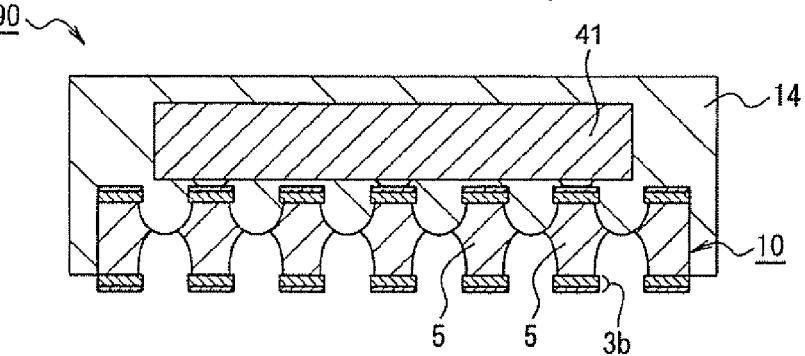

Subsequently, the connecting part 6 connecting the posts 5 is etched from the back surface side to be removed. Accordingly, as shown in FIG. 18E, the posts 5 adjacent each other can be electrically separated, being able to use each of the posts 5 as an electrically independent external terminal. Then the mold resin 14 is diced into pieces. This dicing step is same as the step shown in FIGS. 4A and 4B, and the post 5 provided with the recognition mark 8 may be cut. Accordingly, the semiconductor device 190 is completed.

According to the eighth embodiment, the plurality of posts 5 can be separately used as the die pads and as the external terminals depending on the shape and the size of the IC fixing region that is adequately set, in the same manner as the wire bonding method. Therefore, the specification of the substrate 10 used for element mounting and for external terminals can be made common, being able to decrease the manufacturing cost for the semiconductor device, in the same manner as the first embodiment.

Further, according to the eighth embodiment, the IC fixing region is recognized based on the recognition mark 8 and the IC element 41 is positioned in the IC fixing region that is recognized in the same manner as the first embodiment. Therefore, the IC element 41 can be accurately positioned in the IC fixing region and can be attached on the posts 5 that are in the IC fixing region with little displacement.

Furthermore, according to the eighth embodiment, since the following double drop-preventing measures a) and b) are taken, the posts 5 can be pressed to the mold resin 14 so as to be able to prevent the posts 5 from dropping from the mold resin 14;

a) curving shape of the lateral face of the posts 5 b) anchor effect of the T-shape composed of the plating layer 3a and the post 5.

The electrodes 42 of the eighth embodiment correspond to a "first conductive member" in the invention. Other corresponding relationship with respect to the invention is same as that in the first embodiment.

Here, the first to eighth embodiments describe the case where the concave parts 4a and 4b that are formed on the substrate 10 have the bowl shape when viewed in section (hereinafter, referred to as a sectional shape) as an example. However, the sectional shapes of the concave parts 4a and 4b are not limited to the above. For example, the concave parts 4a and 4b have such sectional shapes that an ellipse is laid down, as shown in FIGS. 19A through 19E. In this case, the lateral face of the posts 5 facing the concave parts 4a and 4b has a constricted shape.

Figure 19A:
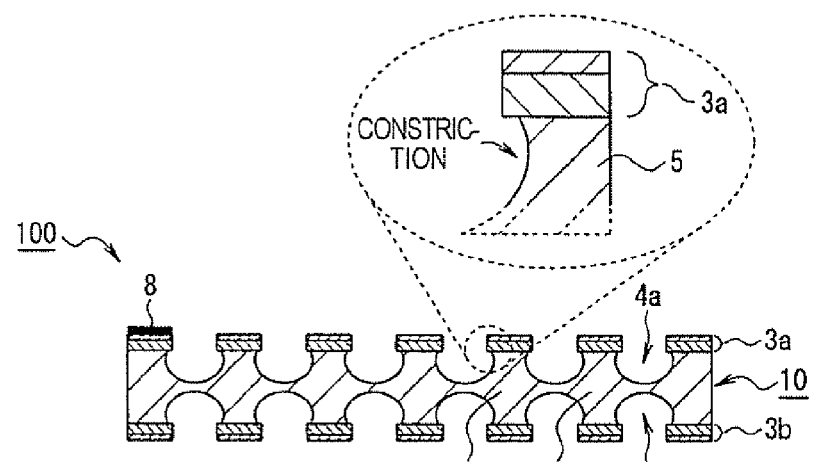
FIGS. 19A through 19E are schematic views illustrating another lateral shape of a post 5.
Figure 19B:
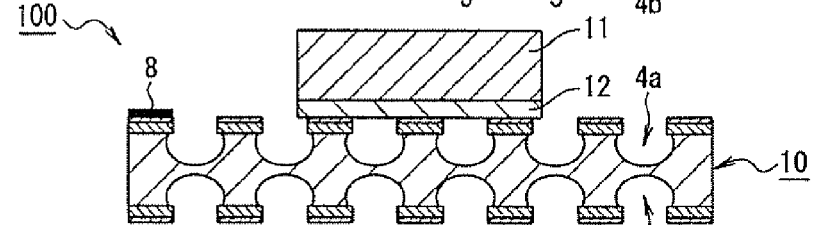
Figure 19C:
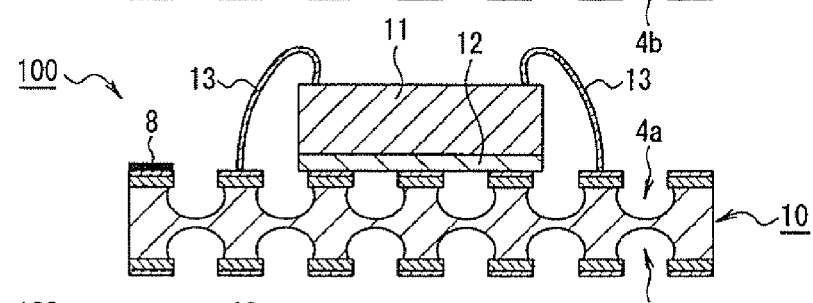
Figure 19D:
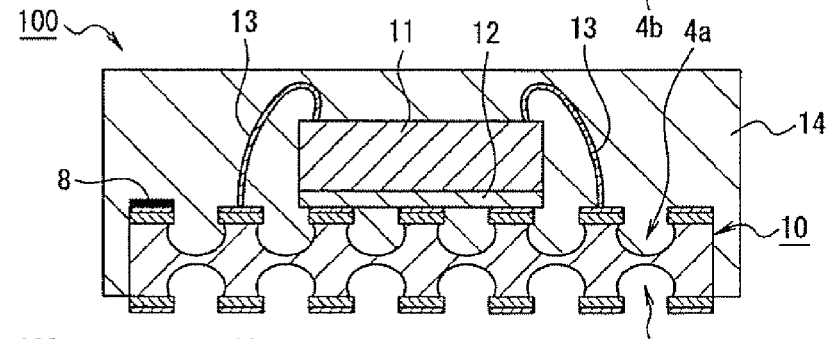
Figure 19E:
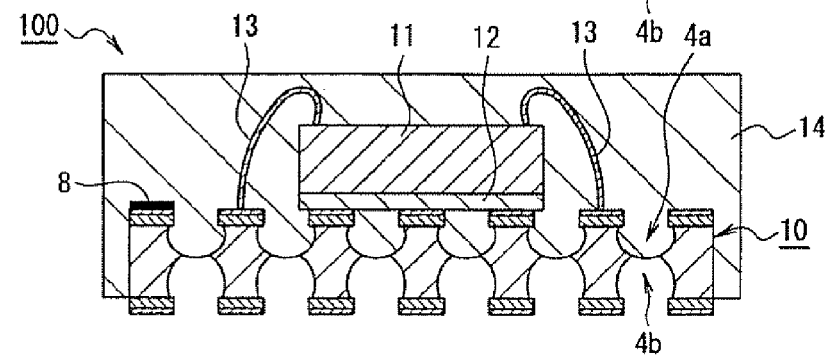

In such structure, referring to FIG. 19D, constrictions grip the mold resin 14 when parts at the upper surface side of the IC element 11 and the substrate 10 are sealed with resin. Therefore, an anchor effect due to the constrictions can be obtained so as to firmly prevent the posts 5 from dropping from the mold resin 14 in the process after the step shown in FIG. 19D.

The constrictions shown in FIGS. 19A through 19E can be formed by spraying type wet-etching, for example. In the spraying type wet-etching, the spraying angle of the etchant is set to be orthogonal with respect to the upper surface of the copper plate so as to progress the etching toward the depth direction, while the spraying angle is set to be slanted so as to progress the etching in the lateral direction (that is, side-etching). Further, the etching can be speeded up by increasing the spraying pressure of the etchant. Therefore, if the copper plate is etched by spraying method and the spraying angle and the spraying pressure of the etchant with respect to the copper plate are adequately changed during the etching, for example, the lateral face of the posts 5 can be formed constricted when viewed in section.

Ninth Embodiment

Figure 20A:
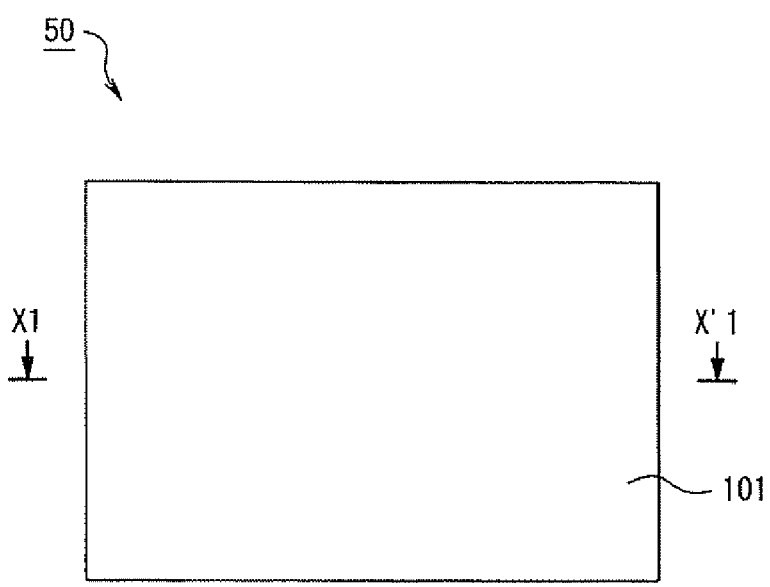
FIGS. 20A and 20B are schematic views showing a method for manufacturing a substrate 50 according to a ninth embodiment.
Figure 23A:
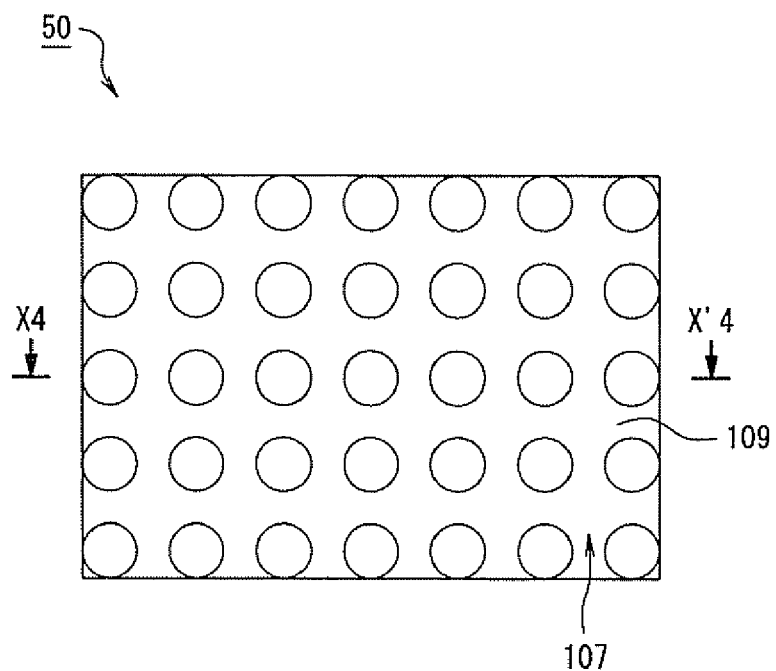
FIGS. 23A and 23B are schematic views showing a method for manufacturing a substrate 50 according to the ninth embodiment.
Figure 23B:
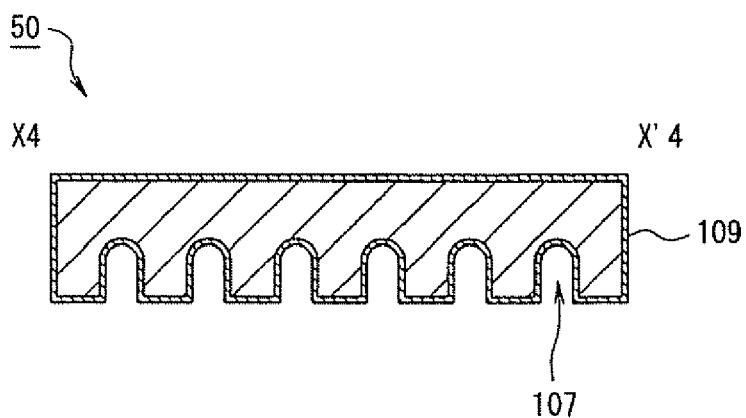
Figure 24A:
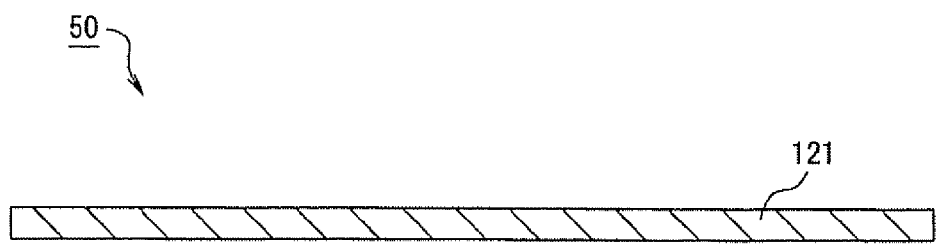
FIGS. 24A through 24C are schematic views showing a method for manufacturing a substrate 50 according to the ninth embodiment.
Figure 24B:
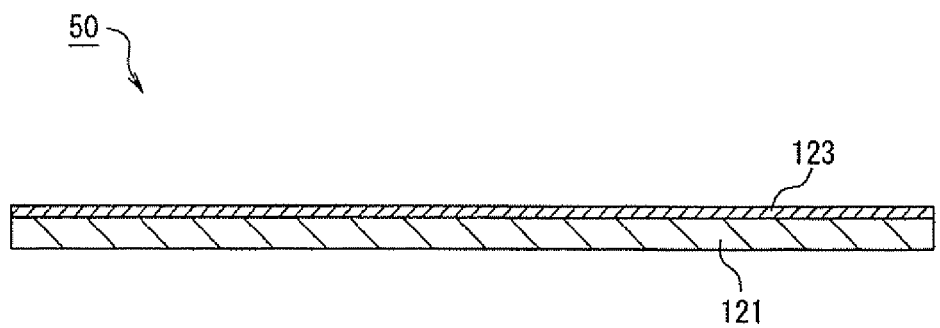
Figure 24C:
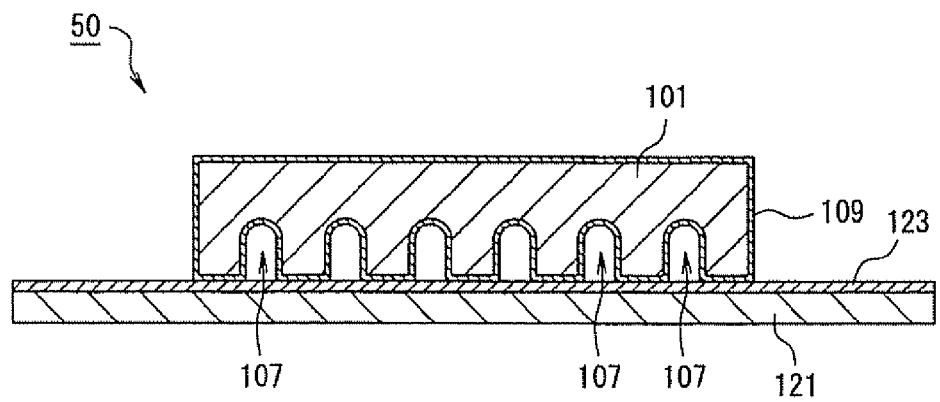
Figure 25A:
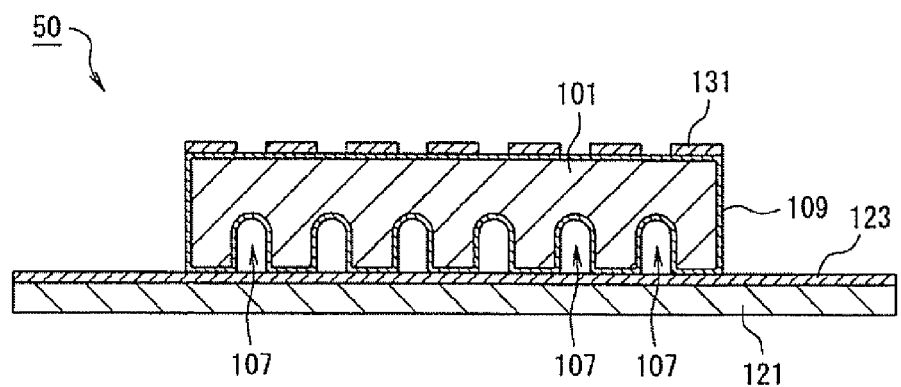
FIGS. 25A through 25C are schematic views showing a method for manufacturing a substrate 50 according to the ninth embodiment.
Figure 25B:
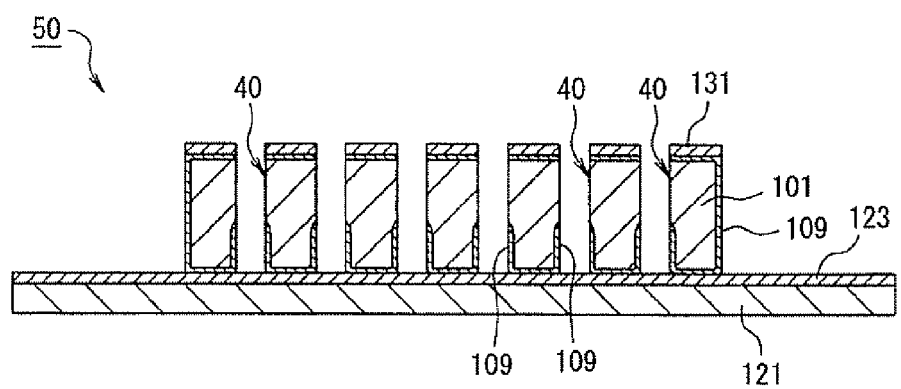
Figure 25C:
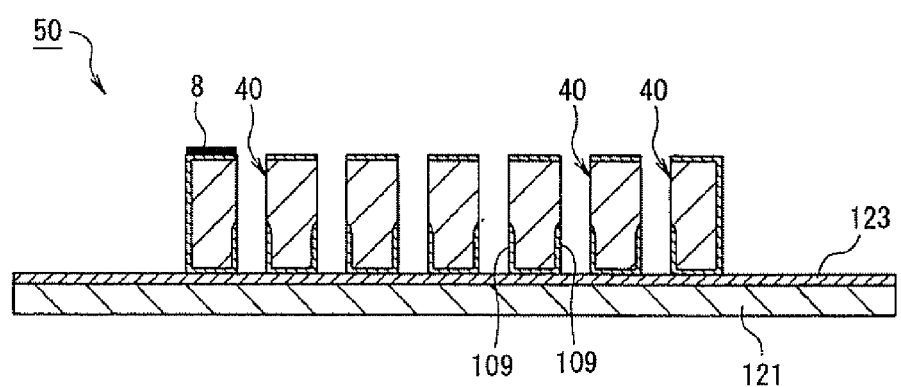

FIGS. 20A through 25C are diagrams showing a method for manufacturing a substrate 50 according to a ninth embodiment of the invention. Specifically, FIGS. 20A, 21A and 23A are bottom views, FIGS. 20B, 21B, and 23B are end elevational views showing sections respectively taken along line X1-X'1 of FIG. 20A, line X2-X'2 of FIG. 21A, and line X4-X'4 of FIG. 23A. FIGS. 25A through 25C are end elevational views showing manufacturing steps following a step shown in FIG. 24C.

Figure 20B:
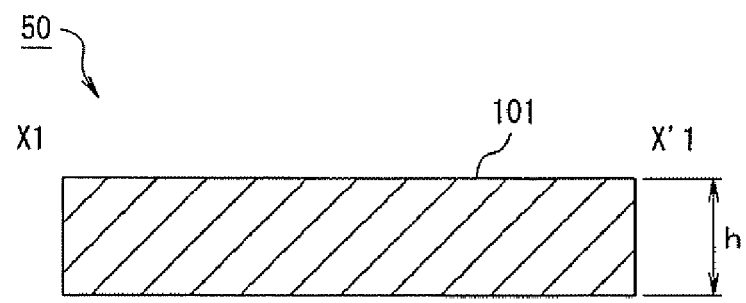
Figure 21A:
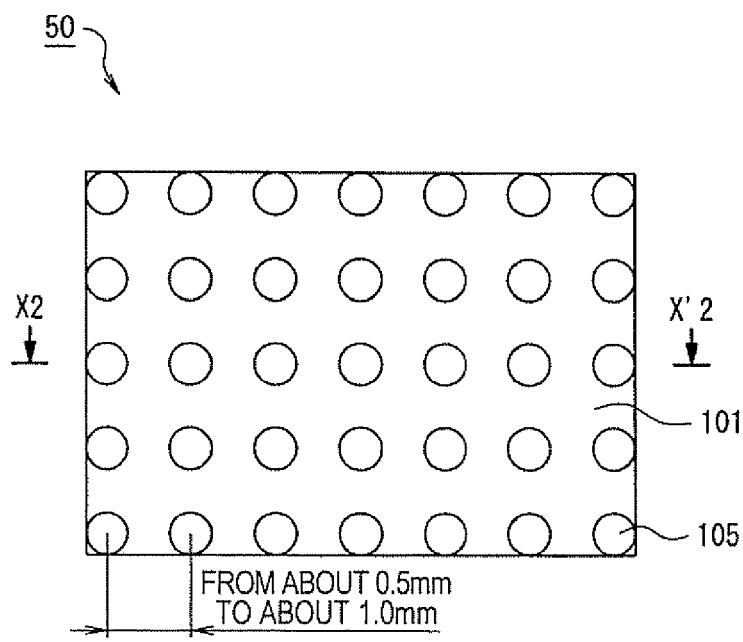
FIGS. 21A and 21B are schematic views showing a method for manufacturing a substrate 50 according to the ninth embodiment.
Figure 21B:
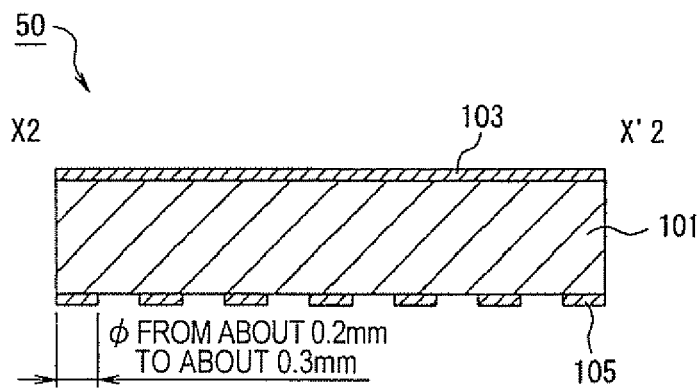

First, a copper plate 101 is prepared as shown in FIGS. 20A and 20B. Any horizontal dimension and vertical dimension of the copper plate 101 in a planar view are available if they are larger than an outer shape of a package, to be formed from the copper plate 101, of a semiconductor device. The thickness h of the copper plate 101 is from about 0.10 mm to about 0.30 mm, for example. As shown in FIGS. 21A and 21B, a whole top surface of the copper plate 101 is covered by a resist 103 and at the same time, a resist pattern 105 is formed on the under surface of the copper plate 101 so as to expose a part of the surface of the copper plate 101. As shown in FIGS. 21A and 21B, the resist pattern 105 has a precise circular shape. A distance between centers of the circles (that is, a pitch) is about 0.5 mm to about 1.0 mm, and the diameter ø is from about 0.2 mm to about 0.3 mm.

Figure 22:
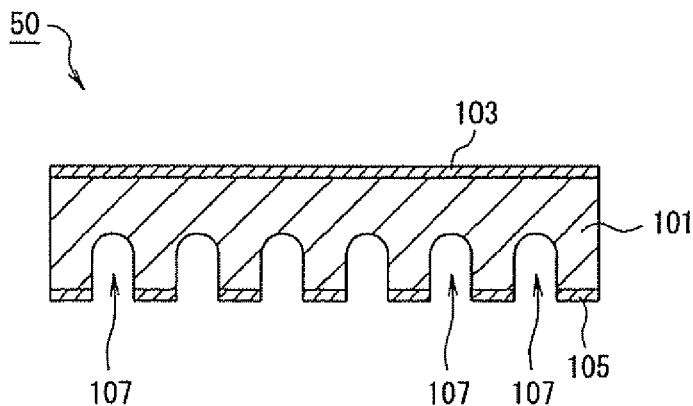
FIG. 22 is a schematic view showing a method for manufacturing a substrate 50 according to the ninth embodiment.

Next, as shown in FIG. 22, the under surface of the copper plate 101 is half-etched (that is, the under surface is etched up to the halfway in the thickness direction of the copper plate 101) while using the resist pattern 105 as a mask so as to form a concave part 107 at the under surface side of the copper plate 101. The copper plate 101 is etched by, for example, a ferric chloride solution. Then a metal thin film 109 made of silver (Ag) or palladium (Pd), for example, is plated on each of the top and under surfaces of the copper plate 101, as shown in FIGS. 23A and 23B. The metal thin film 109 may be plated before the copper plate 101 is etched.

Around the time of or at the same time as such plating treatment, a support substrate 121 shown in FIG. 24A is prepared and an adhesive 123 is applied on the top surface of the support substrate 121 as shown in FIG. 24B. The support substrate 121 is a glass substrate, for example. The adhesive 123 is a solder resist, an ultraviolet cure adhesive (that is, an UV adhesive), or a thermoset adhesive, for example. As shown in FIG. 24C, the under surface, on which the plating treatment is conducted, of the copper plate 101 is pressed to the top surface of the support substrate 121 to which the adhesive 123 is applied, whereby they are bonded.

Then, as shown in FIG. 25A, a resist pattern 131 that opens a region corresponding to a region where a concave part 107 is formed and covers a region corresponding to a region other than the region for a concave part 107 is formed on the top surface of the copper plate 101. As shown in FIG. 25B, the copper plate 101 is etched to be penetrated while using the resist pattern 131 as a mask, forming a plurality of cylindrical electrodes (that is, posts) 40. After the plurality of posts 40 are formed from the copper plate 101, the resist pattern 131 is removed from the top surface of the posts 40 as shown in FIG. 25C. Accordingly, the substrate 50 is completed.

Figure 26:
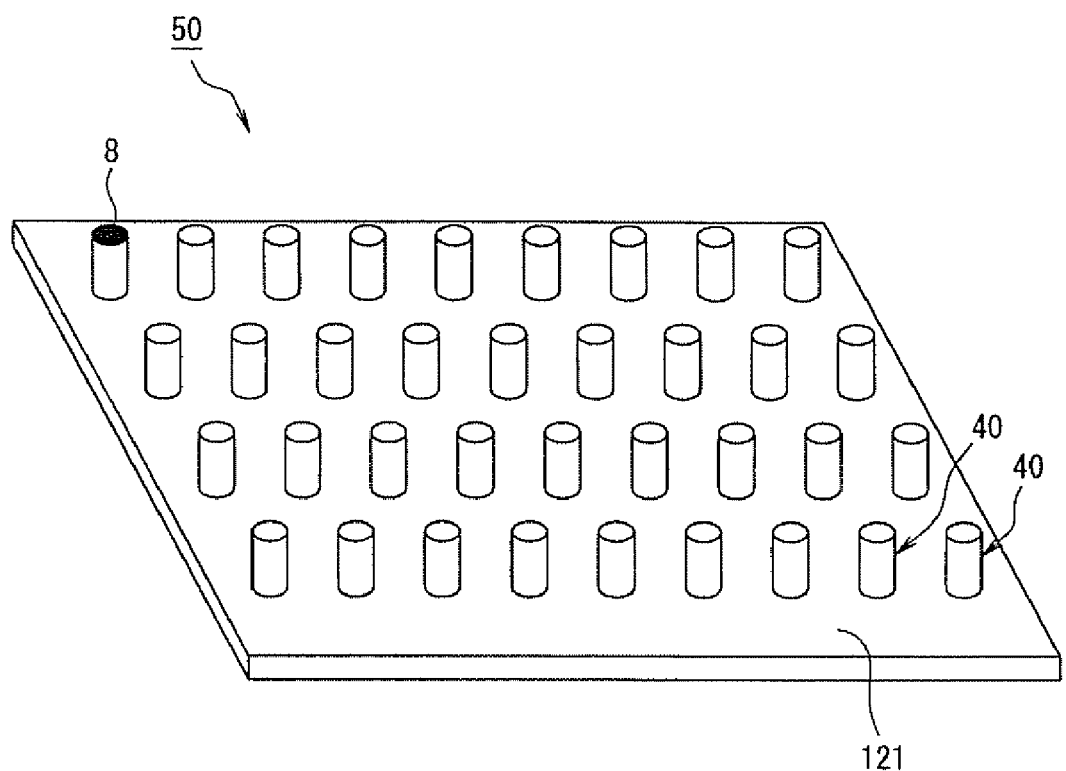
FIG. 26 is a schematic view illustrating a structure of the substrate 50.

Then, a surface (top surface) of the post 40 that is at the desired position is colored by ink-jetting or laser marking, for example, so as to form a recognition mark 8. In a case where the recognition mark 8 is formed by ink-jetting, a heat-resistance different-color ink or a different-color plating, for example, can be employed as the coloring material. As shown in FIG. 26, the plurality of posts 40 made of the copper plate 101 are formed on the support substrate 121, and the posts 40 have the same shape and the same dimension as each other and are arranged at an equal interval in longitudinal and lateral directions. On upper surfaces of some of the posts 40, recognition marks 8 are formed so as to be able to be distinguished from other posts 40.

Figure 27A:
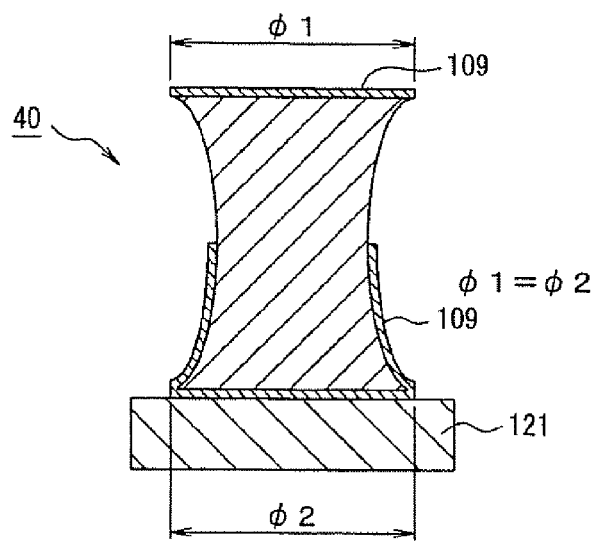
FIGS. 27A through 27C are schematic views illustrating sectional shapes of a post 40.
Figure 27B:
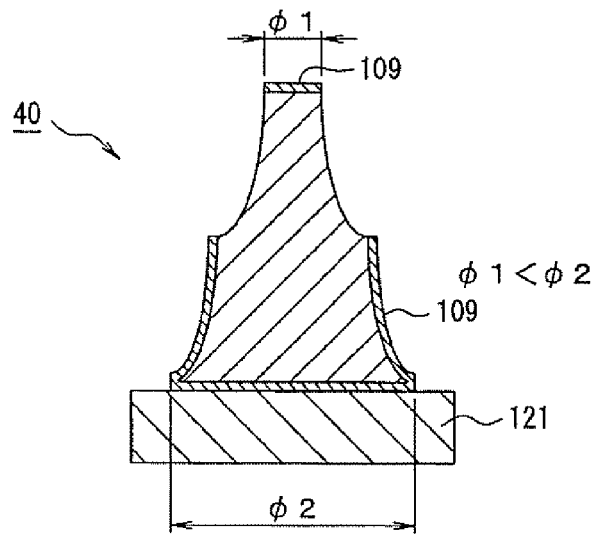
Figure 27C:
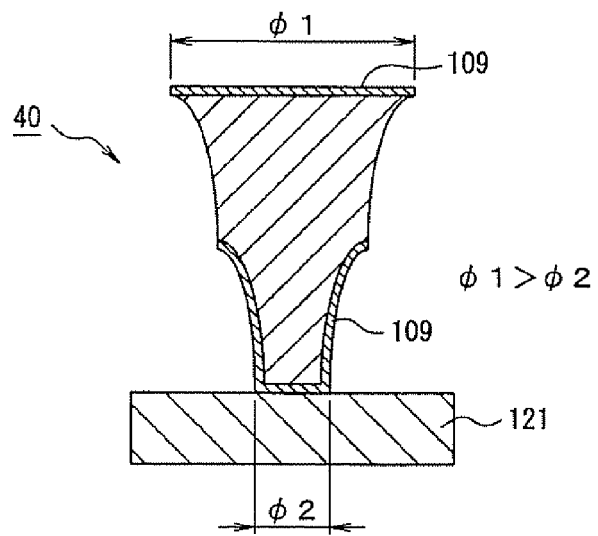

FIGS. 27A through 27C are diagrams illustrating a sectional shape of the post 40. As shown in FIGS. 27A through 27C, a diameter ø1 of the top surface of the post 40 manufactured by the above manufacturing method may be same as a diameter ø2 of the under surface, and the diameter ø1 may be smaller or larger than the diameter ø2. Each case has an advantage.

As shown in FIG. 27A, in order to form a post 40 of which the diameter at is same as the diameter ø2, the copper plate 101 is etched from the top surface and the under surface while using the resist patterns 105 and 131 (refer to FIGS. 21A and 21B and FIGS. 25A through 25C) of which the mask regions (that is, covering regions) have the same shape and the same size as each other. In this case, the resist patterns 105 and 131 can be formed as same kind of photo-masks, so that the manufacturing cost of the substrate 50 can be decreased compared to a case using different kinds of photo-masks. As shown in FIG. 27B, if the post 40 is formed such that the diameter ø1 is smaller than the diameter ø2, a bonding area between the support substrate 121 and the post 40 is large and thus the posture of the post 40 becomes stable. Therefore, a possibility that the post 40 topples down in an IC element attaching step (that is, a die attaching step) described later or in the resin sealing step can be kept low. Further, as shown in FIG. 27C, if the post 40 is formed such that the diameter ø1 is larger than the diameter ø2, a gap between the posts can be kept wide at the closer side to the support substrate 121, whereby the filling of the gap with the resin becomes relatively easy.

In order to form the post 40 of which the diameter ø1 is smaller than the diameter ø2 as shown in FIG. 27B, the mask region of the resist pattern 105 formed on the under surface of the copper plate 1 and that of the resist pattern 131 formed on the top surface of the copper plate 1 are allowed to have a precise circular shape, and the mask area of the resist pattern 105 is made to be larger than that of the resist pattern 131. That is, an opening area of the resist pattern 105 is made smaller than that of the resist pattern 131. Thus the top surface of the copper plate 101 is etched in a wider range than the under surface, so that the diameter ø1 becomes smaller than the diameter ø2.

In order to form the post 40 of which the diameter ø1 is larger than the diameter ø2 as shown in FIG. 27C, the mask region of the resist pattern 105 formed on the under surface of the copper plate 1 and that of the resist pattern 131 formed on the top surface of the copper plate 1 are allowed to have a precise circular shape, and the mask area of the resist pattern 105 is made to be smaller than that of the resist pattern 131. Thus the under surface of the copper plate 101 is etched in a wider range than the top surface, so that the diameter ø1 becomes larger than the diameter ø2.

In the step that the resist patterns 105 and 131 are formed on the copper plate 101 by photo-lithography, the photo masks are suitably positioned based on the outer shape of the copper plate 101, for example. By such method, the resist patterns 105 and 131 can be accurately positioned with respect to the copper plate 101 and thus the amount of relative displacement between the resist patterns 105 and 131 can be efficiently reduced.

Next, a method for manufacturing a semiconductor device 200 will be described. In the method, an IC element that is in a bare state is attached to the substrate 50.

FIGS. 28A through 32C are schematic views showing a method for manufacturing a semiconductor device 200 according to the ninth embodiment of the invention. Specifically, figures suffixed with letter A in FIGS. 28A through 32C are plan views showing a case where a chip size of an IC element 151 is, for example, 2 mm square. Figures suffixed with letter B in FIGS. 28A through 32C are plan views showing a case where a chip size of the IC element 151 is, for example, 1 mm square. Further, FIGS. 28C, 29C, 30C, 31C and 32C are end elevational views respectively taken along lines Y9-Y'9, Y10-Y'10, Y11-Y'11, Y12-Y'12, and Y13-Y'13 of FIGS. 28B, 29B, 30B, 31B and 32B.

Figure 28A:
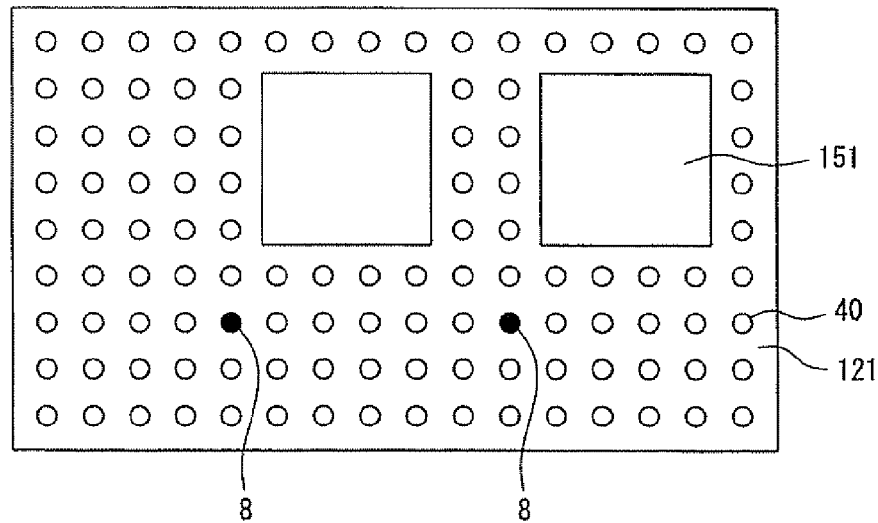
FIGS. 28A through 28C are schematic views showing a method for manufacturing a semiconductor device 200 according to the ninth embodiment.
Figures 28B, 28C:
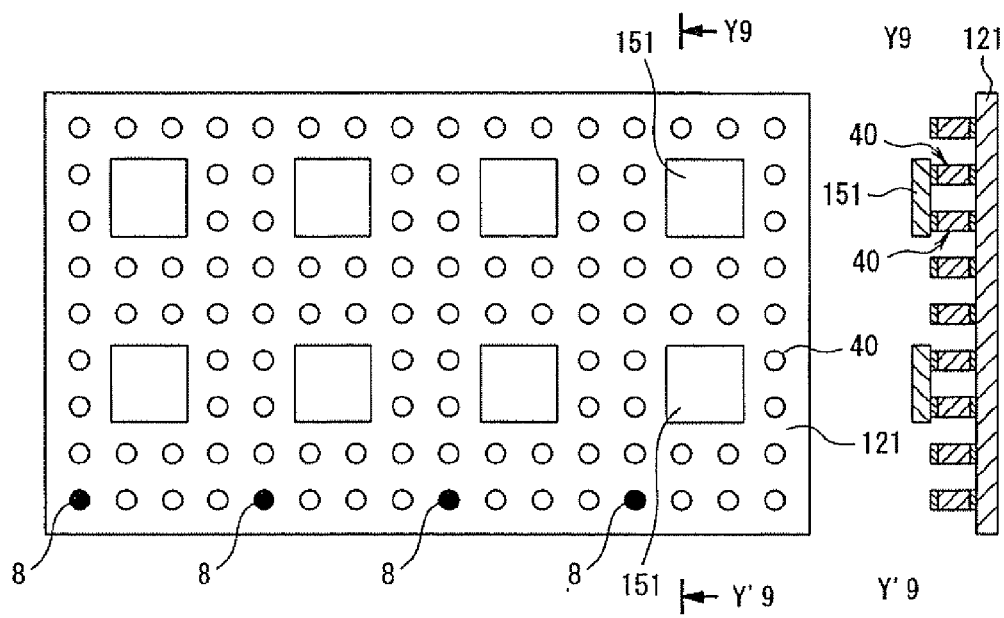
Figure 29A:
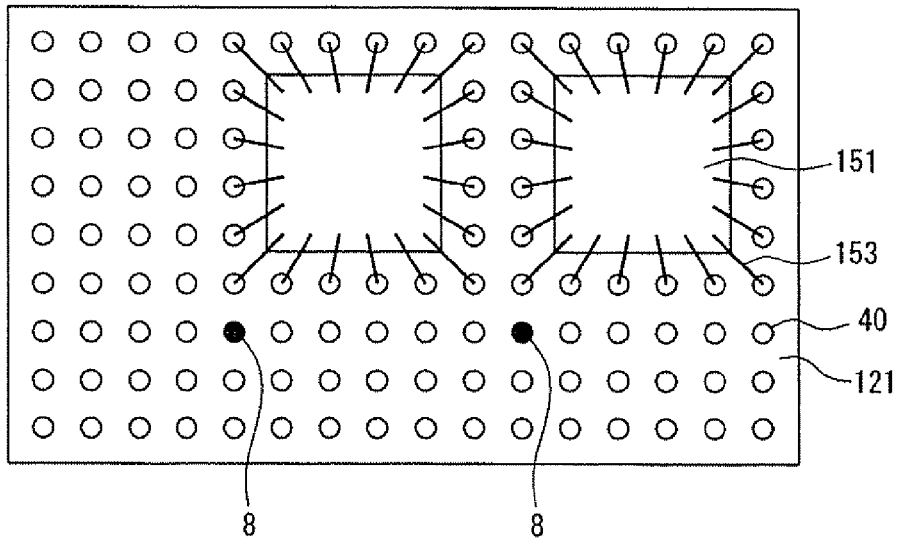
FIGS. 29A through 29C are schematic views showing a method for manufacturing a semiconductor device 200 according to the ninth embodiment.
Figures 29B, 29C:
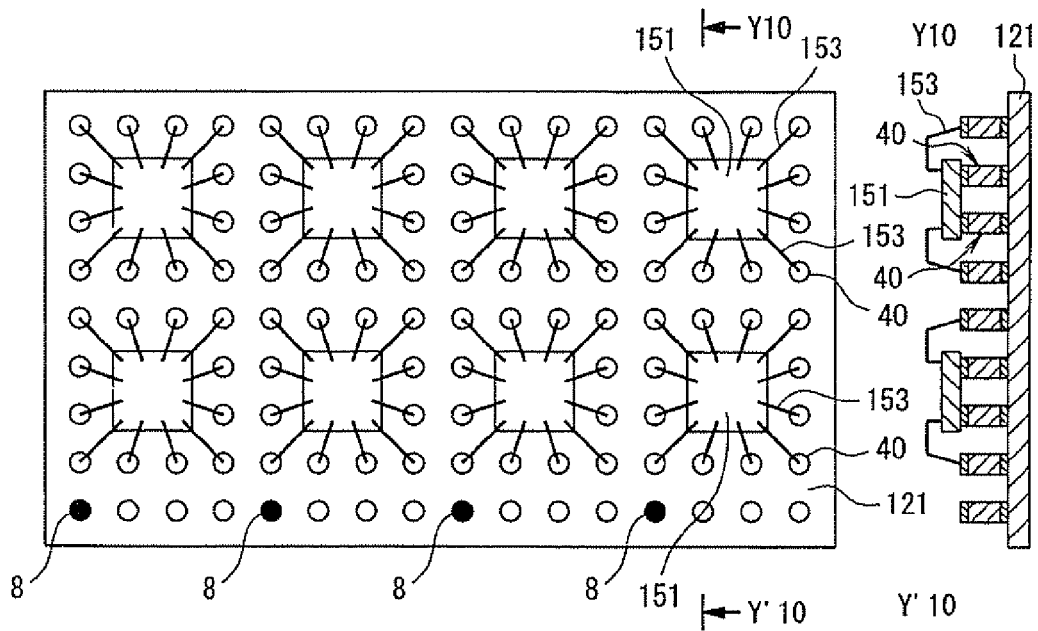

Referring to FIGS. 28A through 28C, an adhesive (not shown) is first applied to the top surface of the post 40 (or the back surface of the IC element 151) provided in the IC fixing region. The adhesive used here is a thermoset paste or a thermoset sheet, for example. Then the IC fixing region is recognized based on the recognition mark 8 so as to position the IC element 151 in the IC fixing region that is recognized. The back surface of the IC element 151 that is positioned is brought into contact with the top surfaces of the plurality of posts 40 in the IC fixing region so as to be fixed (die attaching step). As shown in FIGS. 29A through 29C, the top surfaces of the posts 40 that are in a region except for the IC fixing region (that is, a region out of a region immediately beneath the IC element 151) are coupled to a pad terminal provided to the upper surface of the IC element 151 with, for example, a gold wire 153. Here, the post 40 to be the external terminal may be recognized based on the recognition mark 8 so as to couple the post 40 that is recognized with an end of the gold wire 153.

Figure 30A:
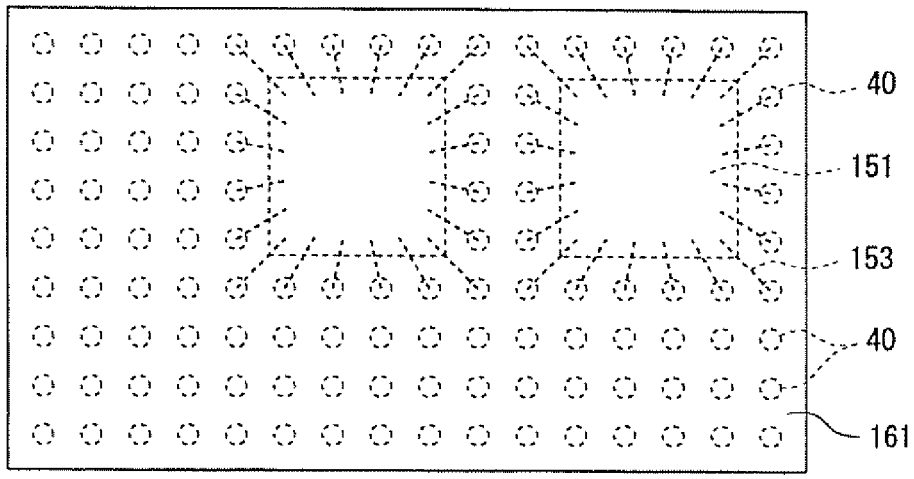
FIGS. 30A through 30C are schematic views showing a method for manufacturing a semiconductor device 200 according to the ninth embodiment.
Figures 30B, 30C:
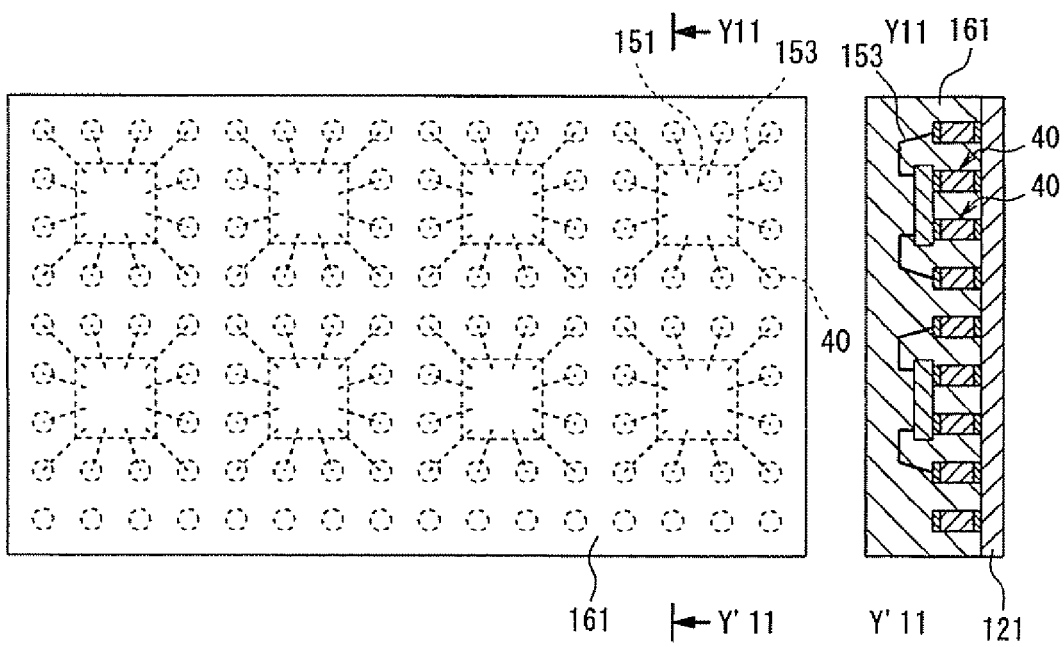

Then, as shown in FIGS. 30A through 30C, a whole upside of the support substrate 121 provided with the IC element 151, the gold wire 153, and the posts 40 is sealed with a mold resin 161 (resin sealing step). The mold resin 161 is, for example, a thermoset epoxy resin. As described above, the support substrate 121 is, for example, a glass substrate and its coefficient of thermal expansion is relatively small. Therefore, even in a case where a heat of about 200 degrees Celsius is applied in the resin sealing step, the substrate 121 expands little in the longitudinal and lateral directions in a planar view. Accordingly, the distance between the posts 40 adjacent each other can be kept nearly constant during the resin sealing step as well.

Figure 34A:
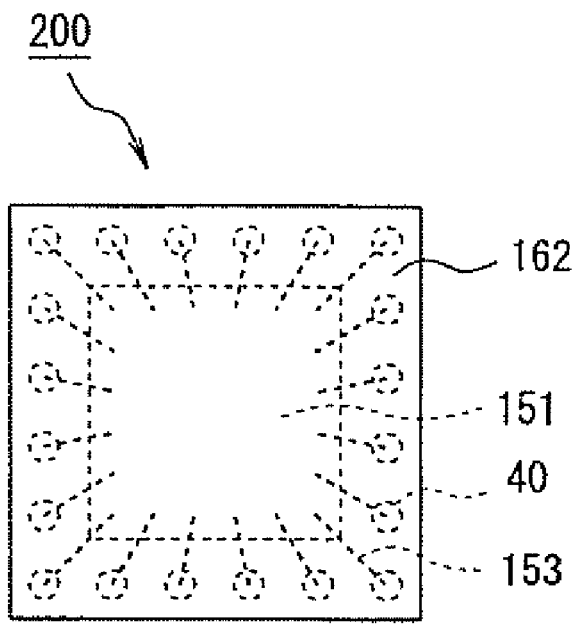
FIGS. 34A through 34C are schematic views illustrating a structure of a semiconductor device 200 according to the ninth embodiment.
Figures 34B, 34C:
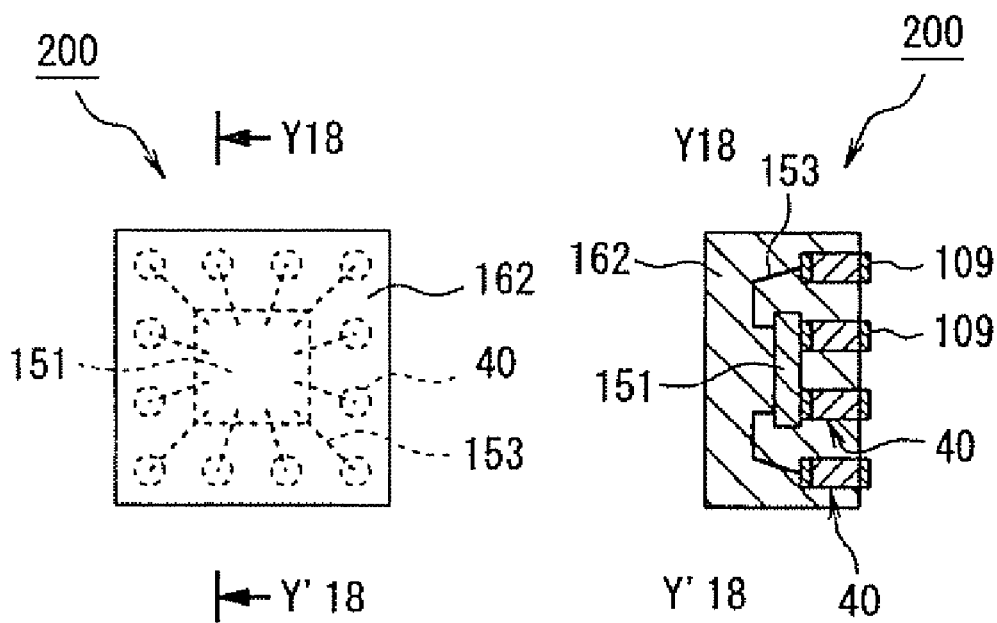

Then, as shown in FIGS. 31A through 31C, the mold resin 161 including the IC element 151 is peeled off from the support substrate 121. In a case where the ultraviolet cure adhesive is employed as the adhesive 123, the mold resin 161 may be peeled off from the support substrate 121 after the bonding strength is decreased by ultraviolet (UV) irradiation. Alternatively, the mold resin 161 including the IC element 151 may be peeled off from the support substrate 121 just by applying a force mechanically. The adhesive after the peeling off may be left on the resin side or on the support substrate side. FIG. 34A shows a case where the adhesive 123 is left on the mold resin 161, and FIG. 34B shows a case where the adhesive 123 is removed together with the support substrate. The present invention may be applied in either cases of FIGS. 34A and 34B. After the mold resin 161 is peeled off from the support substrate, the metal thin film 109 is exposed from the face from which the resin is peeled off.

Figure 32A:
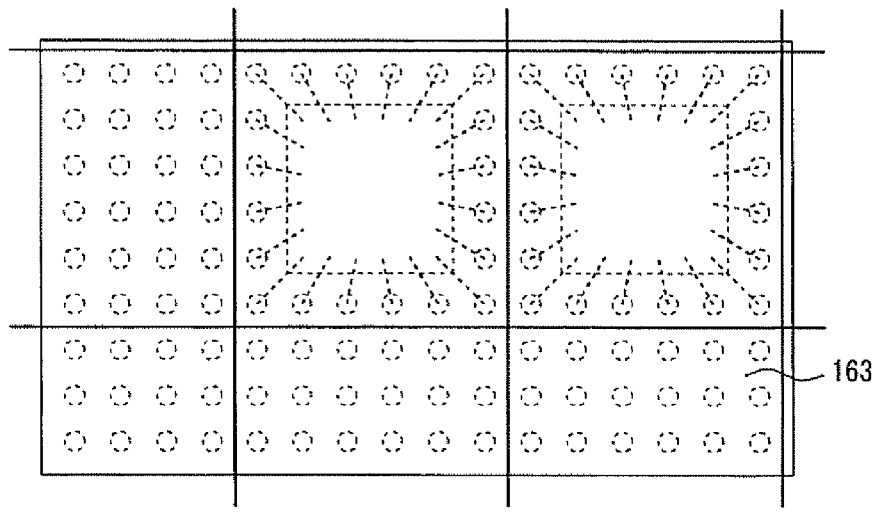
FIGS. 32A through 32C are schematic views showing a method for manufacturing a semiconductor device 200 according to the ninth embodiment.
Figures 32B, 32C:
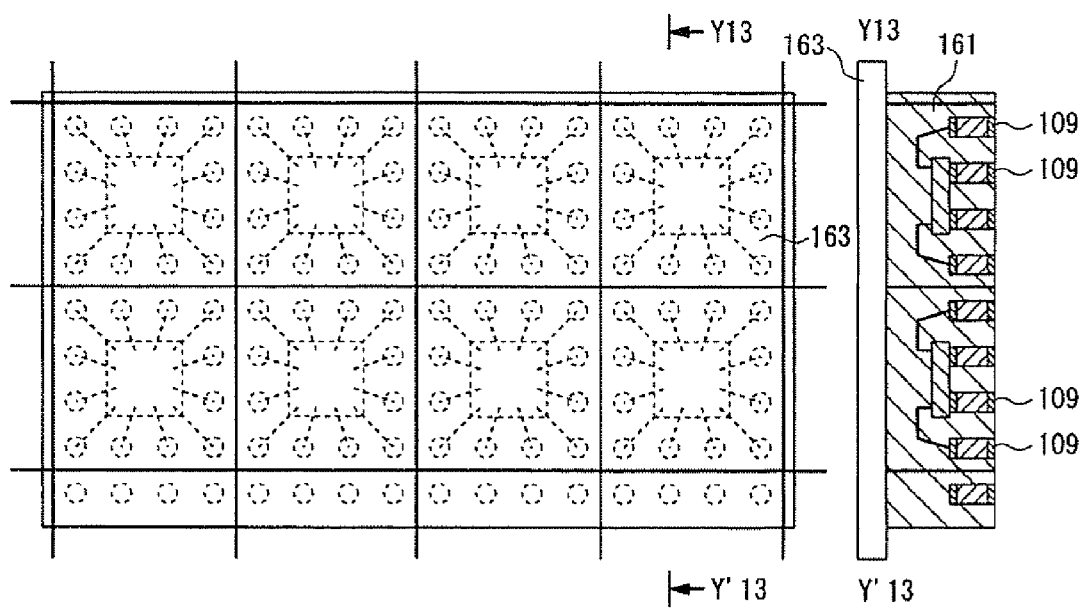

Next, referring to FIGS. 31A thorough 31C, a product mark (not shown) or the like is inscribed on the top surface of the mold resin 161 (that is, a face to which the terminal is not exposed) with ink or laser, for example. Then, as shown in FIGS. 32A through 32C, an ultraviolet cure tape (UV tape) 163, for example, is attached on the whole top surface of the mold resin 161. Then the mold resin 161 is cut with a blade correspondingly to the outer shape of the product. In this dicing step, the mold resin 161 is divided into individual resin packages 162, and a margin, which is not to be a product, of the resin is cut to be removed at the same time. The resin is cut based on the post 40 exposed from the under surface of the mold resin 161 (that is, a face to which the terminal is exposed), for example.

Figure 33A:
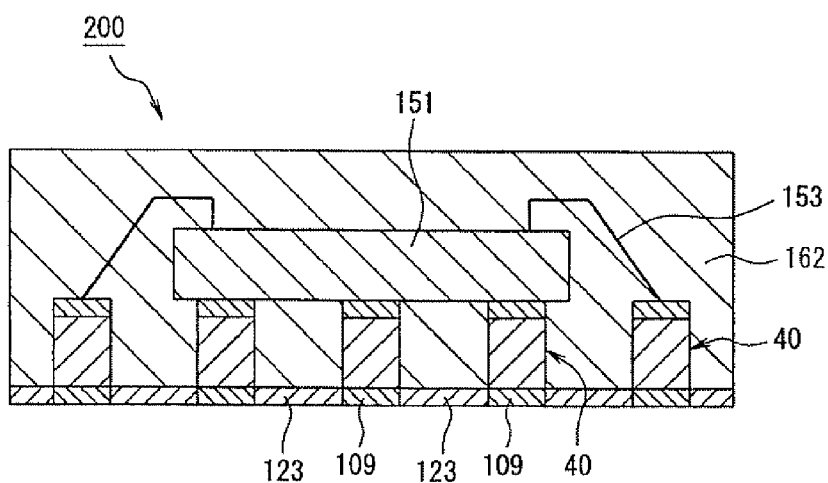
FIGS. 33A and 33B are schematic views illustrating a structure of a semiconductor device 200 according to the ninth embodiment.
Figure 33B:
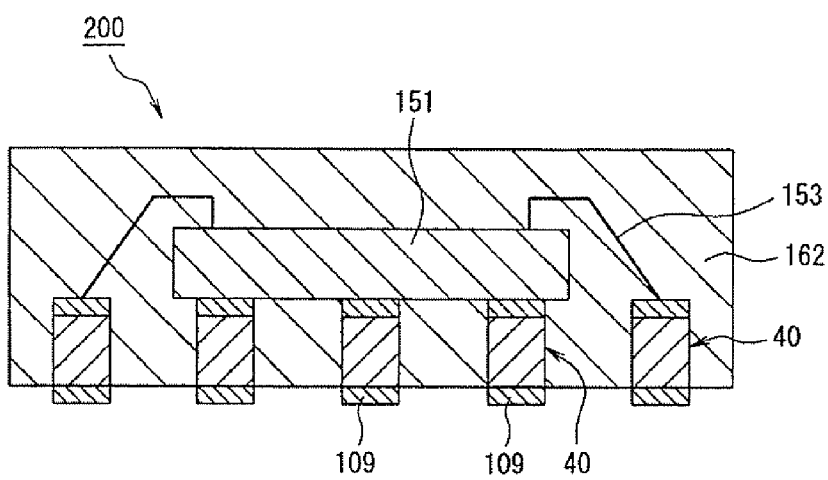

Accordingly, the semiconductor device 200 composed of the IC element 151, the posts 40, the gold wires 153, and the resin package 162 sealing these is completed as shown in FIGS. 33A and 33B. The posts 40 (that is, the external terminals) exposed from the resin package 162 may be left as they are or solder balls or the like may be mounted as BGA. Here, Table 1 shows an example of the applicable chip size, the number of (external) terminal under the chip, the maximum number of external terminals, and the outer shape of the package of the semiconductor device 200 according to the ninth embodiment.

TABLE 1

| PITCH (mm) | APPLICABLE CHIP-SIZE (mmSQ) | NUMBER OF TERMINALS UNDER CHIP | MAXIMUM NUMBER OF EXTERNAL TERMINALS | OUTER SHAPE OF PACKAGE (mm) |
| --- | --- | --- | --- | --- |
| 0.5 | 1 | 4 | 16 | 2.5 |
| 0.5 | 2 | 16 | 36 | 3.5 |
| 0.5 | 3 | 36 | 64 | 4.5 |
| 0.5 | 4 | 64 | 100 | 5.5 |
| 0.5 | 5 | 100 | 144 | 6.5 |
| 0.5 | 6 | 144 | 196 | 7.5 |
| 0.5 | 7 | 196 | 256 | 8.5 |

Figure 35A:
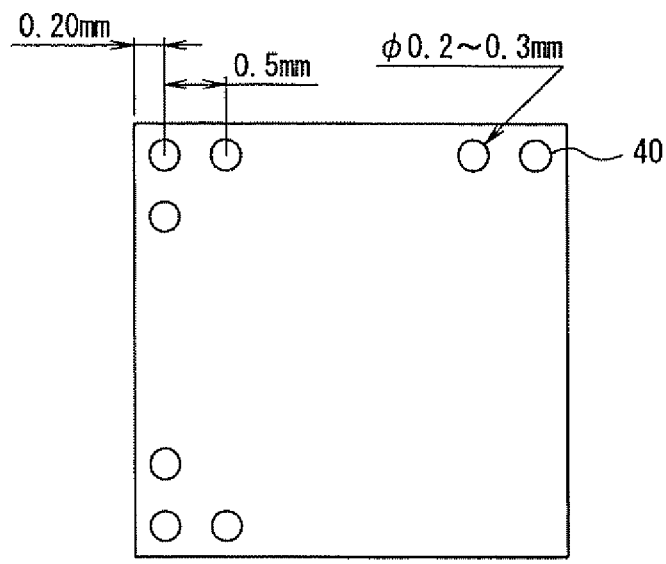
FIGS. 35A and 35B are schematic views illustrating a lattice-like arrangement of the post 40.

Referring to Table 1, "pitch" means a distance between the posts adjacent each other, that is, a distance from the center of one post to the center of the adjacent post. As shown in Table 1 and FIG. 35A, the pitch is, for example, about 0.5 mm. In addition, "applicable chip size" means a chip size of the IC element (having a square shape in a planar view, for example) sealed in the resin package.

Further, "the maximum number of external terminals" means the maximum number of the posts 40 that are sealed by the resin package, and "the outer shape of the package" means a longitudinal or lateral length of the resin package (having a square shape, for example, in a planar view) in a planar view. As shown in Table 1 and FIG. 35B, the posts 40 are arranged methodically in the longitudinal and lateral directions in a planar view, that is, each of the posts 40 is arranged on each intersection point in the precise lattice (hereinafter, this state is expressed as "arranged in lattice-like") in a planar view. In this case, the larger a region for fixing the IC element (that is, the IC fixing region) and a region sealed by resin (that is, the sealing region) are, the more the number of the posts 40 included in the regions increases.

As described above, according to the ninth embodiment, the posts 40 can be used as die pads for mounting the IC element 151 or as external terminals of the IC element 151, and the posts 40 can be separately used as the die pads or the external terminals depending on a shape or a size of the IC fixing region that is set adequately. That is, the posts 40 serve as die pads or external terminals. Thus, the semiconductor device can be assembled without a specific die pad, a specific lead frame, and a specific substrate (an interposer, for example), which are required in related art, corresponding to a type of the IC element 151. A specification of the substrate 50 that is used for mounting an element and used as an external terminal can be shared in many types of IC elements 151 without restricting an layout of a pad terminal. Accordingly, the manufacturing cost of the semiconductor device can be reduced.

Further, as shown in FIGS. 25A through 25C, the metal thin film 109 can be formed at the peripheral face of the under surface side of the posts 40. Therefore, when the under surfaces of the posts 40 are soldered to the motherboard, for example, the solder can be applied widely from the under surfaces of the posts to their peripheral faces, so that the posts 40 can be bonded to the motherboard at high bonding strength.

Figure 36A:
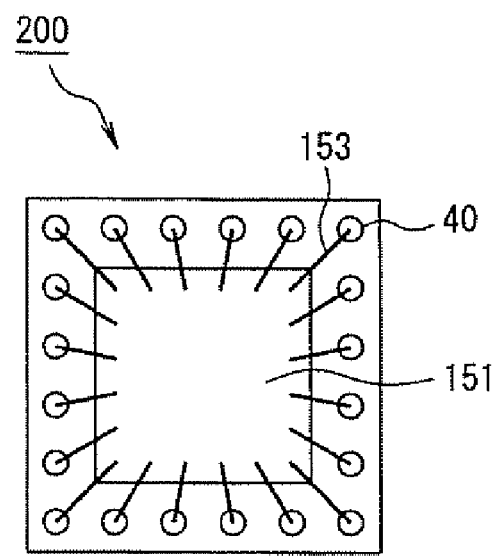
FIGS. 36A through 36C are schematic views illustrating a structure of the semiconductor device 200.
Figure 36B:
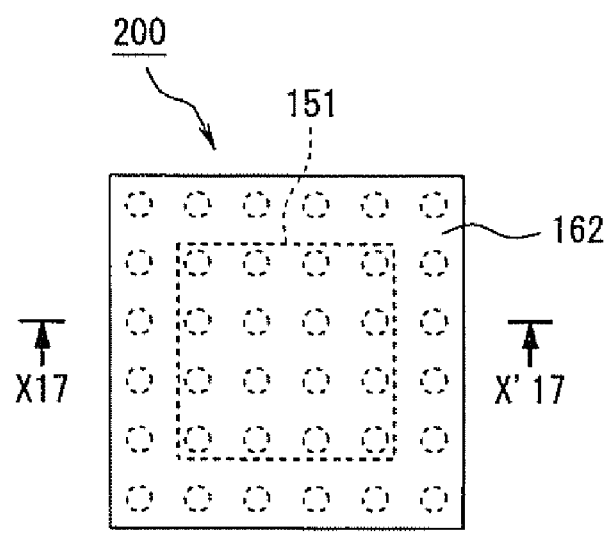
Figure 36C:
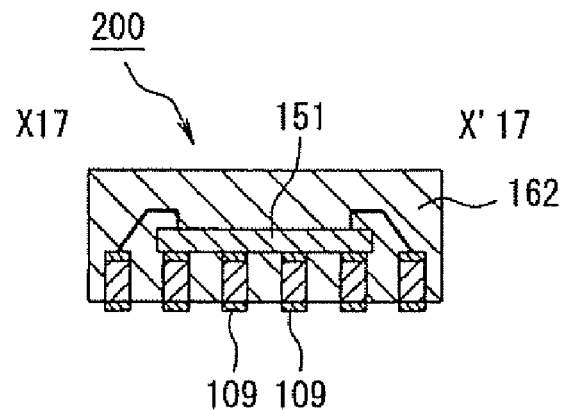

Further, as shown in FIGS. 36A through 36C, metals are not gathered at one place unlike related art die pads. The posts 40 that serve as die pads or external terminals are arranged to be distributed in a resin package 162, so that the aggregating positions of moisture can be scattered and the concentration of water vapor pressure can be reduced. Therefore, the resin package 162 can be prevented from exploding in reliability test accompanying with moisture absorption and heat application, being able to enhance the reliability of the semiconductor device. Here, FIGS. 36A through 36C show a case where the chip size of the IC element 151 is, for example, 2 mm square, and FIG. 36A omits to show the resin package 162 so as to avoid making the figure complex.

Further, according to the ninth embodiment, the IC fixing region is recognized based on the recognition mark 8 and the IC element 151 is positioned in the IC fixing region that is recognized in the same manner as the first embodiment. Therefore, the IC element 151 can be accurately positioned in the IC fixing region and can be attached on the posts 40 that are in the IC fixing region with little displacement.

The copper plate 101 in the ninth embodiment corresponds to a "metal plate" in the invention, the upper surface of the copper plate 101 of the ninth embodiment corresponds to a "first face" of the invention, and the back surface of the copper plate 101 corresponds to a "second face" of the invention. Further, the posts 40 in the embodiment correspond to a "metal column" in the invention, the posts 40 to which the IC element 151 is attached correspond to a "first metal column" in the invention, and the posts 40 that are coupled to the golden wire 153 through the metal thin film 109 correspond to a "second metal column" in the invention. Furthermore, the golden wire 153 in the embodiment corresponds to a "first conductive member" of the invention, and the mold resin 161 corresponds to a "resin" of the invention. The substrate 50 including the recognition mark 8 of the embodiment corresponds to a "substrate" in the invention.

Figure 35B:
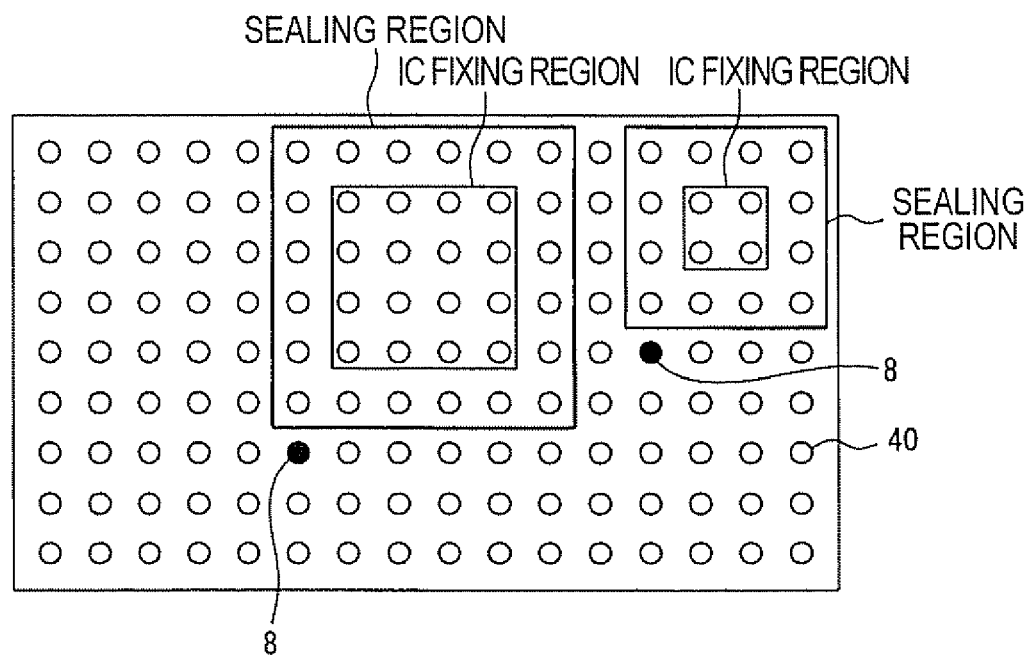
Figure 37:
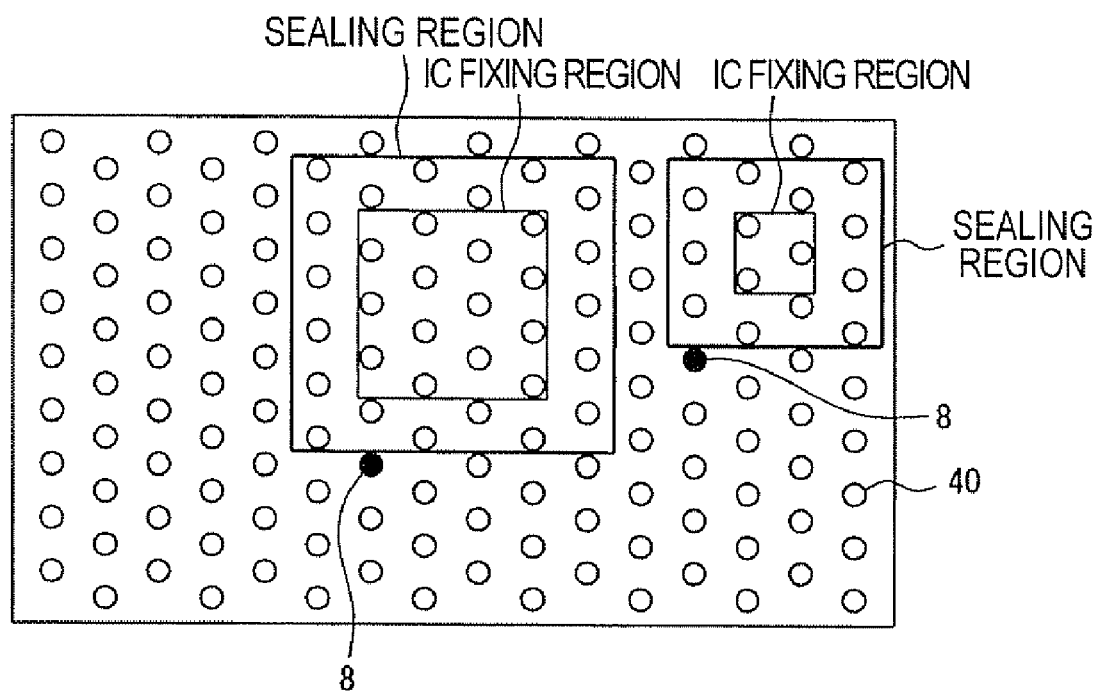
FIG. 37 is a schematic view illustrating a staggering arrangement of the post 40.

The ninth embodiment describes the case where the posts 40 are arranged methodically in the longitudinal and lateral directions in a planar view, that is, each of the posts 40 is arranged on each intersection point in the precise lattice in a planar view as shown in FIG. 35B. However, the arrangement of the posts 40 is not limited to this. For example, as shown in FIG. 37, the posts 40 on an odd number column and the posts 40 on an even number column may be arranged to shift at half pitch to each other, and the posts 40 on an odd number row and the posts 40 on an even number row may be arranged to shift at half pitch to each other, that is, the posts 40 may be arranged in a staggering state in a planar view. In such structure as well, the posts 40 serve as die pads and external terminals, so that a specific die pad that have been required in related art is not required. Further, since the recognition mark 8 is formed, the IC fixing region can be correctly recognized as is the case with the posts arranged lattice-like.

Figure 38A:
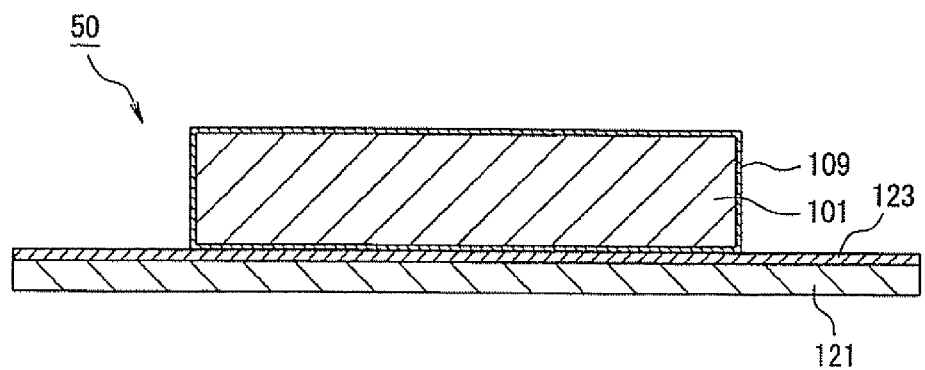
FIGS. 38A through 38C are schematic views showing another method for manufacturing a semiconductor device 200.

The ninth embodiment describes the case where the etching of the copper plate 101 for forming the lateral faces of the posts 40 is conducted separately twice from the top surface and the under surface of the copper plate 101. However, the etching can be conducted not twice but once. Specifically, as shown in FIG. 38A, the metal thin film 109 made of Ag, for example, is plated on the whole surface of the copper plate 101 having a flat under surface on which no concave part is provided. Then the under surface of the copper plate 101 to which the plating treatment is conducted is pressed to the upper surface, to which the adhesive 123 is applied, of the support substrate 121 so as to be bonded. Then, as shown in FIG. 25B, the copper plate 101 is etched to be penetrated while using a resist pattern which is not shown as a mask, forming the plurality of posts 40. After the plurality of posts 40 are formed, the resist pattern is removed from the copper plate 101. Then, as shown in FIG. 25C, the IC element 151 is attached on the posts 40 that are in the IC fixing region, based on the recognition mark 8. Subsequently, the pad terminal of the IC element 151 is coupled through the gold wire 153 to the posts 40 that are in a region other than the IC fixing region.

Figure 38B:
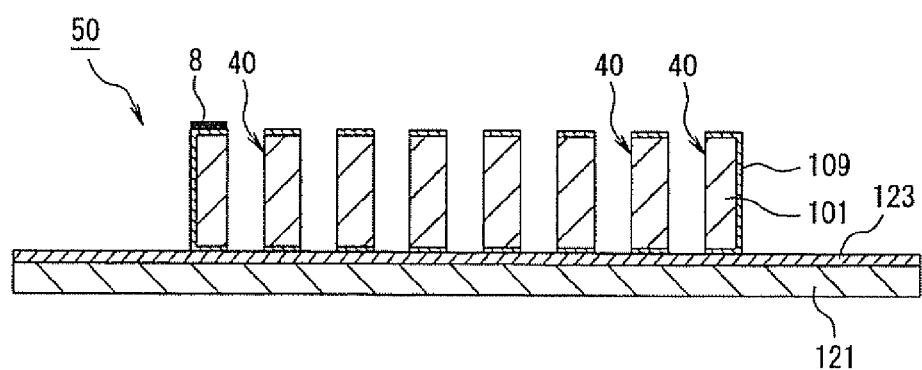
Figure 38C:
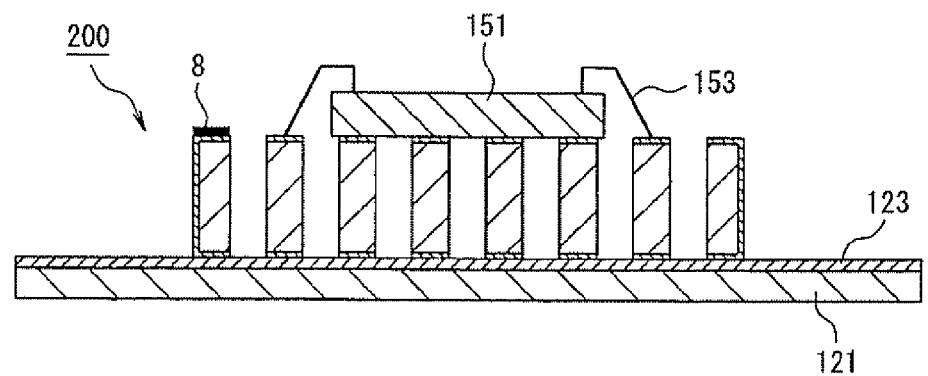

In such method, the number of the etching steps can be reduced from twice to once, so that the time required for manufacturing the substrate 50 can be shortened, being able to reduce the manufacturing cost. Here, in the method shown in FIGS. 38A through 38C, since the metal thin film 109 made of Ag, for example, is not formed on the lateral faces of the posts 40, applying area of the metal thin film 109 is smaller than the case where the etchings is conducted twice. Therefore, when the under surfaces of the posts 40 are soldered to the motherboard, for example, the bonding strength between the posts 40 and the motherboard may be degraded.

Tenth Embodiment

The ninth embodiment describes the case where one chip of the IC element 151 is disposed in the resin package 162 (that is, a single chip package) as shown in FIGS. 36A through 36C, the invention is not limited to it.

Figure 39A:
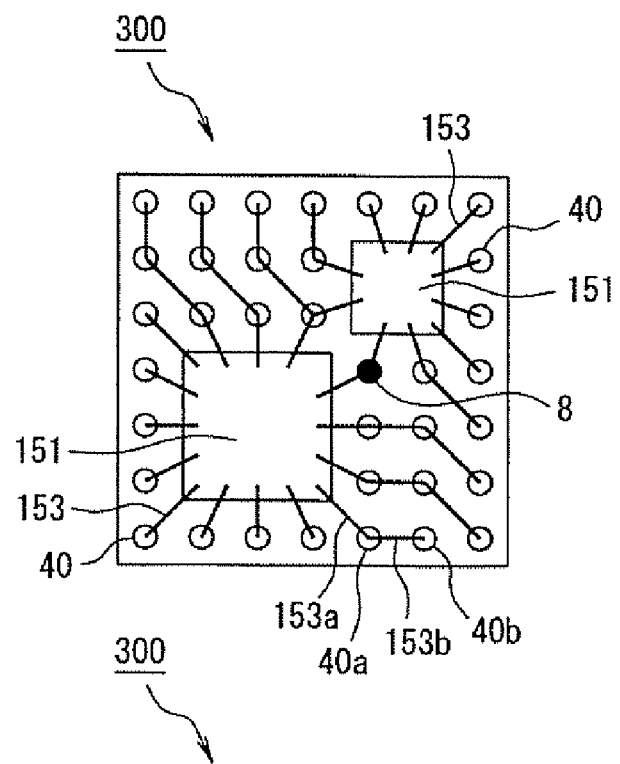
FIGS. 39A through 39C are schematic views illustrating a structure of a semiconductor device 300 according to a tenth embodiment.
Figure 39B:
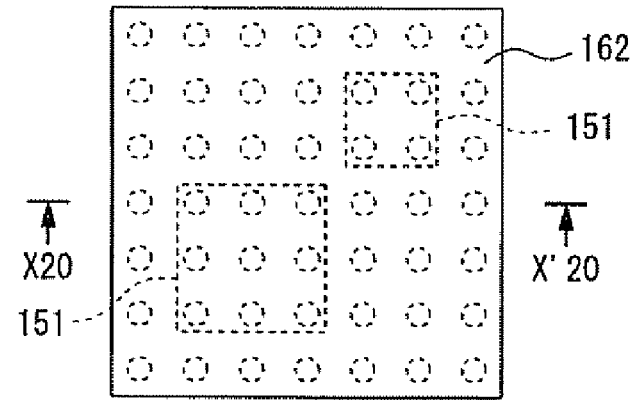
Figure 39C:
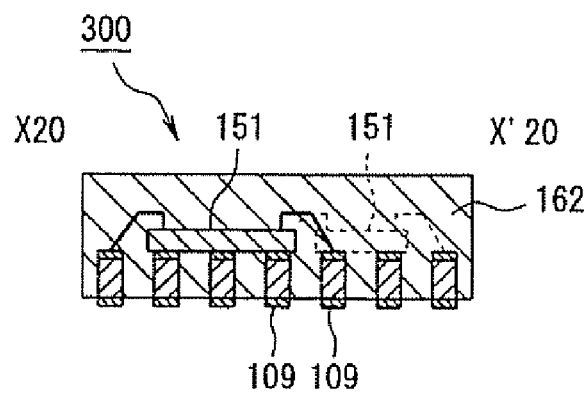
Figure 40A:
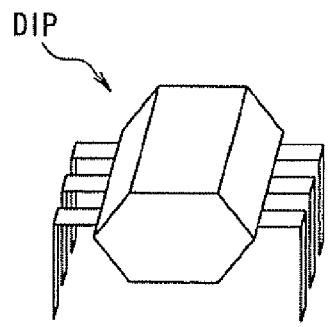
FIGS. 40A through 40D are diagrams showing a related art example.
Figure 40B:
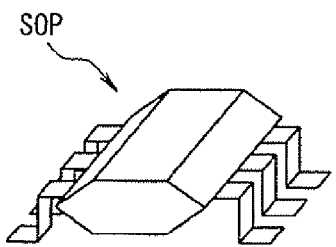
Figure 40C:
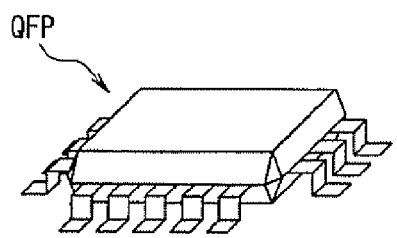
Figure 40D:
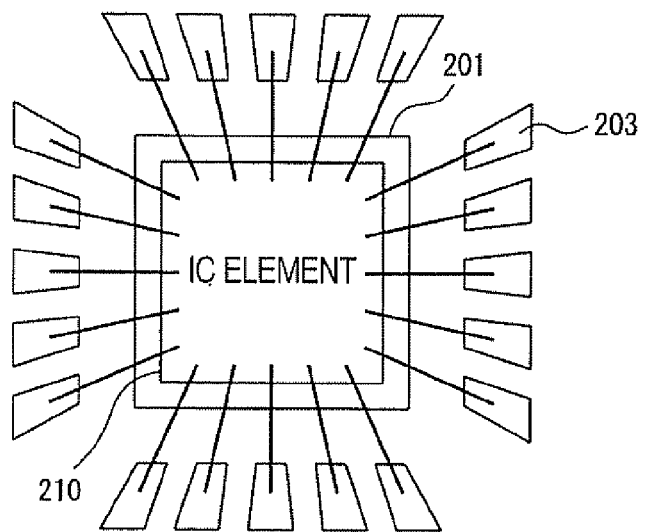
Figure 41A:
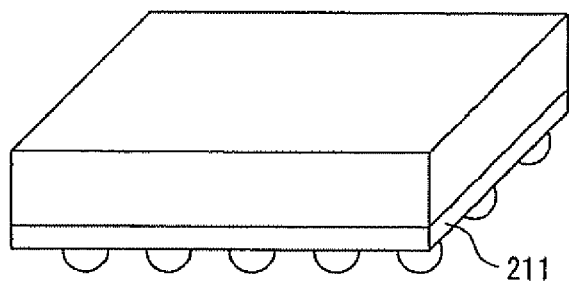
FIGS. 41A and 41B are diagrams showing a related art example.
Figure 41B:
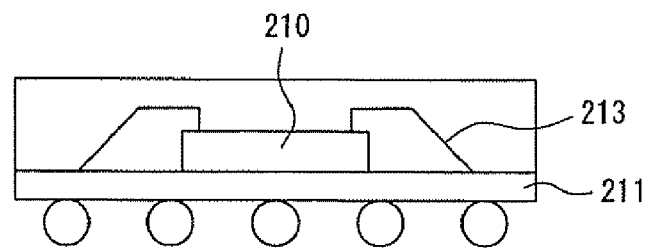
Figure 42A:
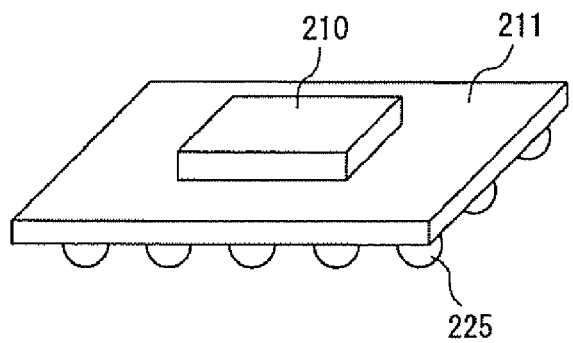
FIGS. 42A and 42B are diagrams showing a related art example.
Figure 42B:
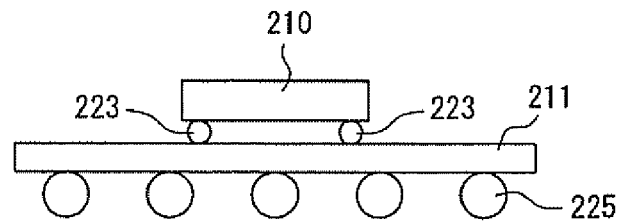
Figure 43A:
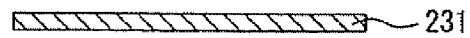
FIGS. 43A through 43I are diagrams showing a related art example.
Figure 43B:
Figure 43C:
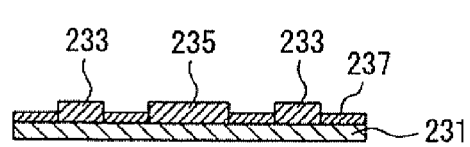
Figure 43D:
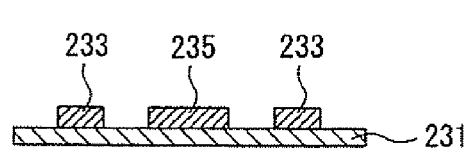
Figure 43E:
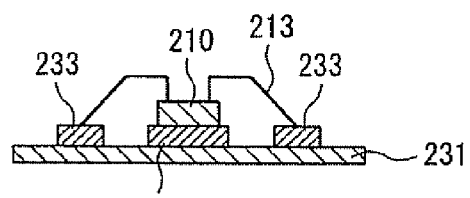
Figure 43F:
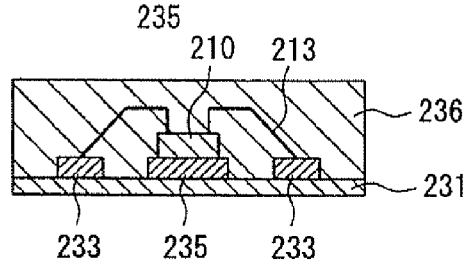
Figure 43G:
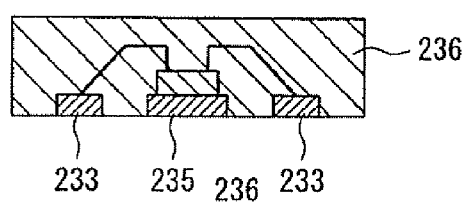
Figure 43H:
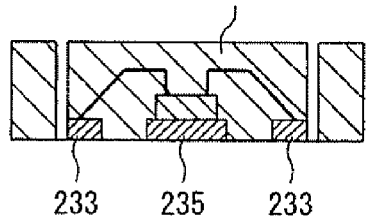
Figure 43I:
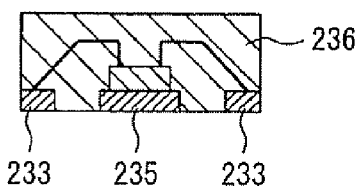

FIGS. 39A through 39C are schematic views showing a structure of a semiconductor device 300 according to a tenth embodiment of the invention. FIGS. 39A and 39B are plan views illustrating a structure of the semiconductor device 300 and FIG. 39C is an end elevational view taken along the line X20-X'20 of FIG. 39B. FIG. 39A omits to show the mold resin 161 so as to avoid making the drawing complex. In FIGS. 39A through 39C, portions having the same structure as those described in the ninth embodiment with reference to FIGS. 20A through 38C have the same reference numerals, and detailed descriptions thereof will be omitted.

As shown in FIGS. 39A through 39C, two or more of IC elements 151 may be disposed in the resin package 162. The IC elements 151 may be the same kind or may be different kinds having different outer shapes or different number of pad terminals from each other. Thus, the MCM in which the plurality of IC elements 151 in the bare chip state are sealed by one resin package 162 can be manufactured by the same method described above.

Namely, as shown in FIG. 39A, a first IC fixing region and a second IC fixing region are respectively recognized based on the recognition marks 8 at first. Next, a first IC element 151 is attached on the posts 40 that are in the first IC fixing region and a second IC element 151 is attached on the posts 40 that are in the second IC fixing region (die attaching step). Then the posts 40 that are arranged in a region other than the IC fixing regions and the pad terminals of the IC elements 151 are coupled by the gold wires 153. Here, the post 40 to be the external terminal may be recognized based on the recognition mark 8 so as to couple the post 40 that is recognized with an end of the gold wire 153.

Next, as shown in FIGS. 39B and 39C, the IC elements 151, the gold wires 153, and the posts 40 are sealed with, for example, a thermoset epoxy resin (resin sealing step). After that, the resin sealing the IC elements 151 is peeled off from the support substrate (not shown), and the mold resin 161 is diced such that two IC elements 151 are included in one package together, so as to be divided into individual resin packages 162.

According to the tenth embodiment, the posts 40 serve as the die pads and the external terminals as is the case with the ninth embodiment. Therefore, the MCM can be assembled without a specific die pad, a specific lead frame, and a specific substrate (an interposer, for example) depending on a type of the IC element 151, being able to reduce the manufacturing cost. Further, the semiconductor device 300 is structured such that the posts 40 serving as the die pads or the external terminals are arranged to be distributed in the resin package 162. Therefore, the aggregating positions of moisture can be scattered in the resin package 162 and the concentration of water vapor pressure can be reduced. Accordingly, the resin package 162 can be prevented from exploding in a reliability test accompanying with moisture absorption and heat application, being able to enhance the reliability of the semiconductor device.

Further, since two IC fixing regions are recognized based on the recognition marks 8 and the IC elements 151 are positioned in the two IC fixing regions respectively, the two IC elements 151 can be accurately positioned in the IC fixing regions respectively so as to be able to attach the two IC elements 151 with little displacement.

Here, as shown in FIG. 39A, the posts 40 in the region other than the IC fixing regions may be used as relay terminals of the gold wires 153. That is, a post 40a coupled to the pad terminal of the IC element 151 through a gold wire 153a may be coupled to another post 40b through a gold wire 153b. In such method, the pad terminal of the IC element 151 can be extracted up to a predetermined position even if the arranging position of the posts 40 is not changed, so that the external terminals of the semiconductor device 300 can be substantively changed. Thus, the versatility of the substrate 50 shown in FIG. 26 can be increased.

As shown in FIG. 39A, the pad terminal of one IC element 151 may be electrically coupled with that of the other IC element 151 through the gold wires 153 and the posts 40. In a case where the recognition mark 8 has conductivity in the same manner as the posts 40 or the plating layer, the gold wires 153 may be connected with the post 40, on which the recognition mark 8 is formed, so as to use the post 40 as the external terminal or the relay terminal. Accordingly, the amount of freedom on designing the semiconductor device can be further enhanced.

Corresponding relationship in the tenth embodiment with respect to the invention is same as that in the ninth embodiment.

What is claimed is:

1. A substrate for fixing an integrated circuit element, comprising:

a plurality of metal columns that are aligned in a longitudinal direction and a lateral direction in a planar view, each of the plurality of metal columns having a first face and a second face facing opposite direction to the first face; and a connecting part that connects the plurality of metal columns one another at a part of each of the plurality of metal columns between the first face and the second face, wherein a recognition mark is formed on the first face of one of the plurality of metal columns.

2. A substrate for fixing an integrated circuit element, comprising:

a plurality of metal columns that are aligned in a longitudinal direction and a lateral direction in a planar view, each of the plurality of metal columns having a first face and a second face facing opposite direction to the first face; and a support substrate that supports the second face of the plurality of metal columns, wherein the support substrate and the plurality of metal columns are bonded with an adhesive interposed therebetween, and wherein a recognition mark is formed on the first face of one of the plurality of metal columns.

3. The substrate according to claim 1, wherein the plurality of metal columns are formed to have the same shape and the same dimension as each other.

4. A method for manufacturing a substrate for fixing an integrated circuit element, comprising:

partially etching a metal plate that has a first face and a second face facing opposite direction to the first face at least from the first face so as to form a plurality of metal columns such that the plurality of metal columns are aligned in a longitudinal direction and a lateral direction in a planar view and each of the plurality of metal columns has a first surface and a second surface facing opposite direction to the first surface; and forming a recognition mark on the first surface of one of the plurality of metal columns, wherein the etching of the metal plate is conducted so as to connect the plurality of metal columns one another at a part of each of the plurality of metal columns between the first surface and the second surface.

5. A method for manufacturing a substrate for fixing an integrated circuit element, comprising:

bonding a second face of a metal plate, the metal plate having a first face and the second face facing opposite direction to the first face, to a support substrate;

partially etching the metal plate from the first face so as to form a plurality of metal columns such that the plurality of metal columns are aligned in a longitudinal direction and a lateral direction in a planar view and each of the plurality of metal columns has a first surface and a second surface facing opposite direction to the first surface, after the bonding of the second face of the metal plate; and forming a recognition mark on the first surface of one of the plurality of metal columns.

6. The method for manufacturing a substrate according to claim 4, wherein the first surface of one of the plurality of the metal columns is colored so as to form the recognition mark by any one of ink-jetting and laser marking, in the forming of the recognition mark.

7. A semiconductor device; comprising:

a plurality of metal columns that are aligned in a longitudinal direction and a lateral direction in a planar view, each of the plurality of metal columns having a first face and a second face facing opposite direction to the first face, the plurality of metal columns include a first metal column and a second metal column;

an integrated circuit element that is fixed to the first face of the first metal column;

a first conductive member that connects the first face of the second metal column and a pad terminal of the integrated circuit element; and a resin that seals a part of the plurality of metal columns, the integrated circuit element, and the first conductive member, wherein the second face of the plurality of metal columns is exposed from the resin, and wherein a recognition mark is formed on the first face of one of the plurality of metal columns.

8. The semiconductor device according to claim 7, further comprising:

a passive component that is fixed to a first face of a third metal column, the third metal column being included in the plurality of metal columns; and a second conductive member that connects a terminal part of the passive component and a first face of a fourth metal column, the fourth metal column being included in the plurality of metal columns, and wherein the passive component and the second conductive member are sealed with the resin.

9. A method for manufacturing a semiconductor device, comprising:

preparing a substrate that includes:

a plurality of metal columns that are aligned a longitudinal direction and a lateral direction in a planar view, each of the plurality of metal columns having a first face and a second face facing opposite direction to the first face, the plurality of metal columns including a first metal column and a second metal column and a connecting part that connects the plurality of metal columns one another at a part of each of the plurality of metal columns between the first face and the second face, and a recognition mark that is formed on the first face of one of the plurality of metal columns;

recognizing the first metal column by using the recognition mark;

fixing an integrated circuit element on a first face of the first metal column that is recognized;

connecting a pad terminal of the integrated circuit element and the first face of the second metal column by a first conductive member after the fixing of the integrated circuit element;

sealing the integrated circuit element, the first conductive member, and a part at a first face side of the plurality of metal columns by a resin; and etching the connecting part from the second face so as to remove the connecting part after the sealing of the integrated circuit element.

10. A method for manufacturing a semiconductor device, comprising:

preparing a substrate that includes:

a plurality of metal columns that are aligned in a longitudinal direction and a lateral direction in a planar view, each of the plurality of metal columns having a first face and a second face facing opposite direction to the first face, the plurality of metal columns including a first metal column and a second metal column, a support substrate that supports the second face of the plurality of metal columns, an adhesive that is inter posed between the support substrate and the plurality of metal columns, and a recognition mark is formed on the first face of any of the plurality of metal columns;

recognizing the first metal column by using the recognition mark;

fixing an integrated circuit element on a first face of the first metal column that is recognized;

connecting a pad terminal of the integrated circuit element and the first face of the second metal column by a first conductive member after the fixing of the integrated circuit element;

supplying a resin on the support substrate so as to seal the integrated circuit element, a part of the plurality of metal columns, and the first conductive member; and peeling the support substrate off from the resin and the second face of the plurality of metal columns sealed by the resin.

11. The method for manufacturing a semiconductor device according to claim 9, further comprising:

recognizing the second metal column by using the recognition mark, wherein the first face of the second metal column that is recognized by using the recognition mark and the pad terminal of the integrated circuit element are connected by the first conductive member that is wire-like in the connecting of the pad terminal of the integrated circuit element and the first face of the second metal column.

* * * * *